United States Patent
Kori et al.

(10) Patent No.: US 12,535,737 B2
(45) Date of Patent: Jan. 27, 2026

(54) MATERIAL FOR FORMING ADHESIVE FILM, PATTERNING PROCESS, AND METHOD FOR FORMING ADHESIVE FILM

(71) Applicant: SHIN-ETSU CHEMICAL CO., LTD., Tokyo (JP)

(72) Inventors: Daisuke Kori, Joetsu (JP); Yusuke Kai, Joetsu (JP); Takayoshi Nakahara, Joetsu (JP); Mamoru Watabe, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 649 days.

(21) Appl. No.: 17/944,501

(22) Filed: Sep. 14, 2022

(65) Prior Publication Data

US 2023/0140810 A1    May 4, 2023

(30) Foreign Application Priority Data

Sep. 22, 2021  (JP) .................. 2021-153704

(51) Int. Cl.
*G03F 7/09* (2006.01)
*C08F 220/28* (2006.01)
(Continued)

(52) U.S. Cl.
CPC .......... *G03F 7/094* (2013.01); *C08F 220/281* (2020.02); *C08F 220/325* (2020.02);
(Continued)

(58) Field of Classification Search
CPC ........ G03F 7/094; G03F 7/0045; G03F 7/038; G03F 7/0752; G03F 7/11; C08F 220/281;
(Continued)

(56) References Cited

U.S. PATENT DOCUMENTS 9,805,943 B2  10/2017  Kikuchi et al.
2004/0197709 A1  10/2004  Arase et al.
(Continued)

FOREIGN PATENT DOCUMENTS

EP   2963079 A1   1/2016
JP   2002-334869 A   11/2002
(Continued)

OTHER PUBLICATIONS

Millican et al, Synthesis and characterisation of a mussel inspired hydrogel film coating for biosensors, European Polymer Journal, 153, 2021, 110503 (Year: 2021).*

(Continued)

*Primary Examiner* — Alicia Bland
(74) *Attorney, Agent, or Firm* — Oliff PLC

(57) ABSTRACT

A material for forming an adhesive film formed between a silicon-containing middle layer and a resist upper layer film, containing: (A) a resin having structural units shown by formula (1) and formula (2); (B) a thermal acid generator; and (C) an organic solvent, in the component (A), the structural unit shown by formula (1) having a molar fraction of 5% or more and the structural unit shown by formula (2) having a molar fraction of 30% or more. An objective is to provide a material for forming an adhesive film in a fine patterning process by a multilayer resist method in a semiconductor device manufacturing process, where the material gives an adhesive film that has high adhesiveness to a resist upper layer film, has an effect of suppressing fine pattern collapse, and also makes it possible to form an excellent pattern profile; a patterning process using the material.

(Continued)

(1)

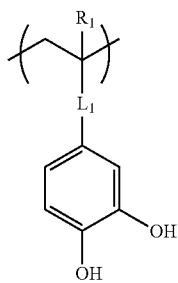

(2)

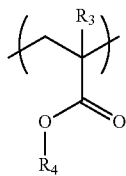

17 Claims, 2 Drawing Sheets

(51) Int. Cl.
*C08F 220/32* (2006.01)
*G03F 7/004* (2006.01)
*H01L 21/027* (2006.01)
*H01L 21/311* (2006.01)

(52) U.S. Cl.
CPC ........ *G03F 7/0045* (2013.01); *H01L 21/0276* (2013.01); *H01L 21/31116* (2013.01); *H01L 21/31138* (2013.01); *H01L 21/31144* (2013.01)

(58) Field of Classification Search
CPC ............. C08F 220/325; H01L 21/0276; H01L 21/31116; H01L 21/31138; H01L 21/31144
See application file for complete search history.

(56) References Cited

U.S. PATENT DOCUMENTS

| | | | |
|---|---|---|---|
| 2006/0228648 | A1* | 10/2006 | Ohsawa ............... C07D 307/68 430/921 |
| 2012/0288795 | A1 | 11/2012 | Umezaki et al. |
| 2017/0153547 | A1* | 6/2017 | Sim .................. H01L 21/02282 |
| 2018/0284614 | A1 | 10/2018 | Satoh et al. |
| 2020/0124965 | A1 | 4/2020 | Nishita et al. |
| 2020/0183282 | A1 | 6/2020 | Hashimoto et al. |
| 2021/0278766 | A1 | 9/2021 | Niida et al. |

FOREIGN PATENT DOCUMENTS

| | | |
|---|---|---|
| JP | 2004-115630 A | 4/2004 |
| JP | 2007-199653 A | 8/2007 |
| JP | 2009-269953 A | 11/2009 |
| JP | 2013-253227 A | 12/2013 |
| JP | 5708938 B2 | 4/2015 |
| JP | 2016-117878 A | 6/2016 |
| TW | 201827480 A | 8/2018 |
| TW | 201842421 A | 12/2018 |
| WO | 2003/017002 A1 | 2/2003 |
| WO | 2004/066377 A1 | 8/2004 |
| WO | 2018/143359 A1 | 8/2018 |
| WO | 2019/044510 A1 | 3/2019 |
| WO | 2020/113795 A1 | 6/2020 |

OTHER PUBLICATIONS

Feb. 13, 2023 Extended Search Report issued in European Patent Application No. 22196371.3.
Jun. 4, 2024 Office Action issued in Japanese Patent Application No. 2021-153704.
Jun. 9, 2023 Office Action and Search Report issued in Taiwanese Patent Application No. 111135303.
Dec. 16, 2024 Office Action issued in European Patent Application No. 22196371.3.

* cited by examiner

[FIG. 1]
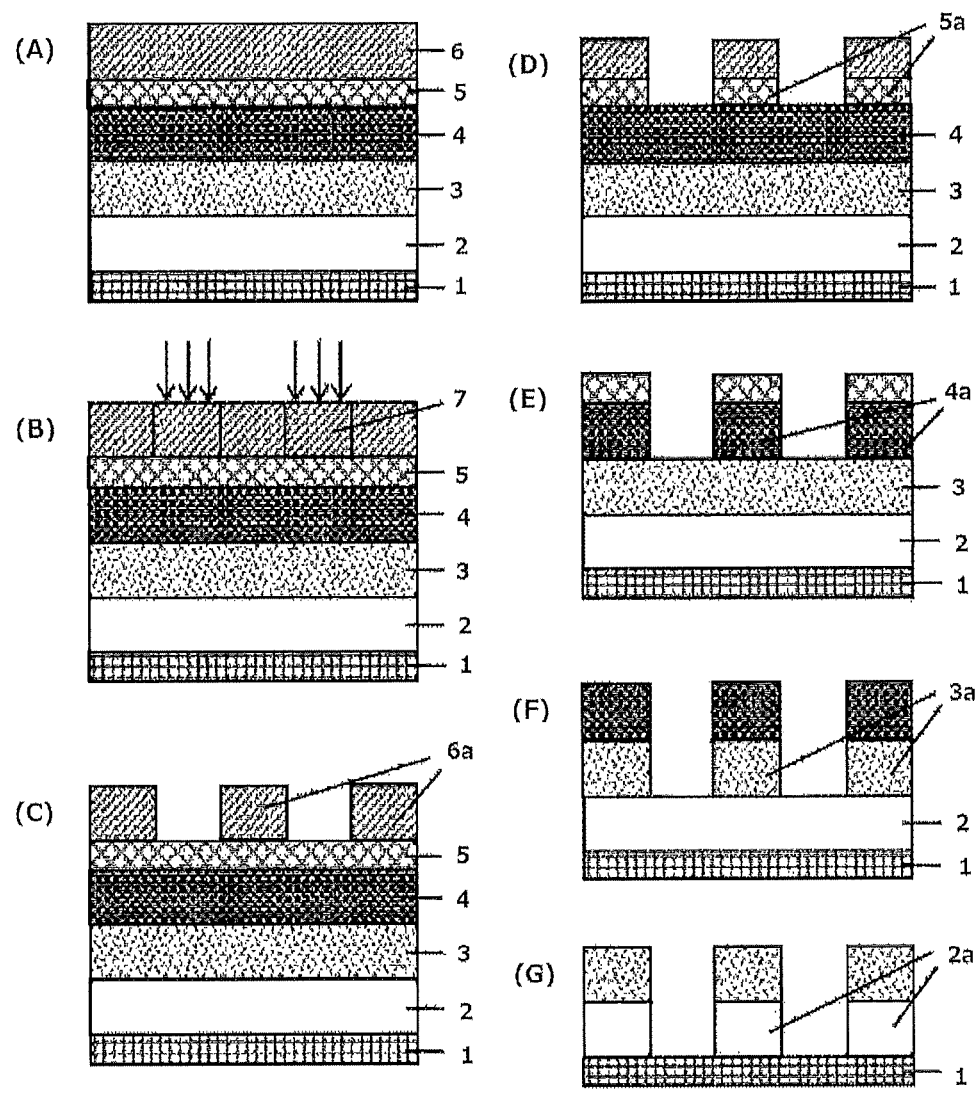

[FIG. 2]
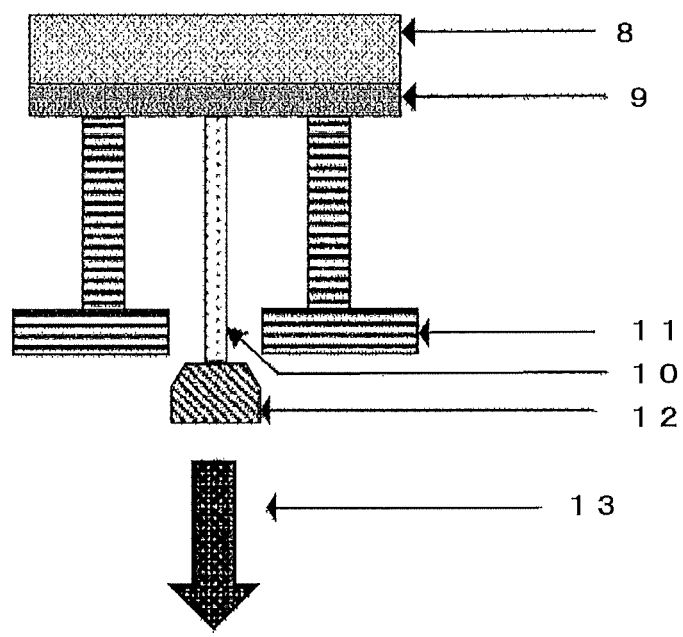

MATERIAL FOR FORMING ADHESIVE FILM, PATTERNING PROCESS, AND METHOD FOR FORMING ADHESIVE FILM

TECHNICAL FIELD

The present invention relates to: a material for forming an adhesive film; a patterning process using the material for forming an adhesive film; and a method for forming an adhesive film by using the material for forming an adhesive film.

BACKGROUND ART

As LSI advances toward high integration and high processing speed, miniaturization of pattern size is progressing rapidly. Along with the miniaturization, lithography technology has achieved a fine patterning by shortening the wavelength of a light source and selecting an appropriate resist composition accordingly. The composition mainly used is a positive photoresist composition for monolayer. The monolayer positive photoresist composition not only allows a resist resin to have a skeleton having etching resistance against dry etching with chlorine- or fluorine-based gas plasma, but also provides a resist mechanism that makes an exposed part soluble, thereby dissolving the exposed part to form a pattern and processing a substrate to be processed coated with a photoresist composition by dry etching while using the remaining resist pattern as an etching mask.

However, when the pattern becomes finer, that is, the pattern width is reduced without changing the thickness of the photoresist film to be used, resolution performance of the photoresist film is lowered. In addition, pattern development of the photoresist film with a developer excessively increases a so-called aspect ratio of the pattern, resulting in pattern collapse. Therefore, the film thickness of the photoresist film has been thinned along with the miniaturization.

On the other hand, a substrate to be processed has been generally processed by dry etching while using a pattern-formed photoresist film as an etching mask. In practice, however, there is no dry etching method capable of providing an absolute etching selectivity between the photoresist film and the substrate to be processed. The photoresist film is thus damaged during processing of the substrate to be processed and the photoresist film collapses during processing of the substrate to be processed, so that the resist pattern cannot be transferred accurately to the substrate to be processed. Accordingly, higher dry etching resistance has been required in a photoresist composition accompanying miniaturization of the pattern. In addition, resins used for photoresist compositions have been required to have low absorbance at the wavelength to be used for the exposure owing to the shortening of the exposure wavelength. Accordingly, along with the shift from i-beam to KrF and to ArF, the resin also shifts to novolak resins, polyhydroxystyrene, and resins having an aliphatic polycyclic skeleton. This shift actually accelerates an etching rate under the dry etching conditions, and recent photoresist compositions having high resolution tend to have low etching resistance.

As a result, a substrate to be processed has to be dry-etched with a thinner photoresist film having lower etching resistance. A material for this process and the process itself are urgently needed.

A multilayer resist method is one solution for these problems. This method is as follows: a middle layer film having a different etching selectivity from a photoresist film (i.e., a resist upper layer film) is placed between the resist upper layer film and a substrate to be processed; a pattern is formed in the resist upper layer film; then, the pattern is transferred to the middle layer film by dry etching while using the resist upper layer film pattern as a dry etching mask; and the pattern is further transferred to the substrate to be processed by dry etching while using the middle layer film as a dry etching mask.

One of the multilayer resist methods is a 3-layer resist method, which can be performed with a typical resist composition used in the monolayer resist method. For example, this 3-layer resist method includes the following steps: an organic film containing a novolak or the like is formed as a resist underlayer film on a substrate to be processed; a silicon-containing film is formed thereon as a silicon-containing resist middle layer film; and a usual organic photoresist film is formed thereon as a resist upper layer film. Since the organic resist upper layer film exhibits a favorable etching selectivity ratio relative to the silicon-containing resist middle layer film when dry etching is performed with fluorine-based gas plasma, the resist upper layer film pattern is transferred to the silicon-containing resist middle layer film by dry etching with fluorine-based gas plasma. Furthermore, when etching is performed using oxygen gas or hydrogen gas, the silicon-containing resist middle layer film exhibits a favorable etching selectivity ratio relative to the resist underlayer film, so that the silicon-containing resist middle layer film pattern is transferred to the resist underlayer film by etching with oxygen gas or hydrogen gas. According to this process, even when using a photoresist composition which is difficult to form a pattern in so that the pattern has a sufficient film thickness for directly processing the substrate to be processed or a photoresist composition which does not have sufficient dry etching resistance for processing the substrate, a pattern can be transferred to a silicon-containing film (silicon-containing resist middle layer film). In this manner, it is possible to obtain a pattern of an organic film (resist underlayer film) containing a novolak or the like having a sufficient dry etching resistance for the processing.

Meanwhile, the recent advents of ArF immersion lithography, EUV lithography, and so forth start to realize finer pattern formations. On the other hand, ultrafine patterns have such small areas of contact with the substrate that the patterns quite easily collapse. Suppressing such pattern collapse is an enormous challenge. Recently, it is regarded that the interaction in the interface between the resist upper layer film and the resist underlayer film in fine patterns has an effect on pattern collapse, and the improvement of the performance of resist underlayer films is also considered necessary.

A material is reported that improves adhesiveness to a resist upper layer film by the use of a resist underlayer film containing a polar functional group such as a lactone structure or a urea structure in order to suppress pattern collapse (Patent Documents 1, 2). However, in the present situation, where the formation of finer patterns is required, these materials cannot be said to have sufficient pattern collapse suppression performance. Furthermore, there is report of a resist underlayer film that combines a phenolic hydroxy group-containing resin and a vinylether group-containing compound, but thermosetting property cannot be regarded as sufficient (Patent Document 3). From the above, a material having higher pattern collapse suppression performance and higher adhesiveness is desired.

CITATION LIST

Patent Literature

Patent Document 1: WO 2003/017002 A1
Patent Document 2: WO 2018/143359 A1
Patent Document 3: JP 5708938 B2

SUMMARY OF INVENTION

Technical Problem

The present invention has been made in view of the above-described circumstances. An object of the present invention is to provide: a material for forming an adhesive film in a fine patterning process by a multilayer resist method in a semiconductor device manufacturing process, where the material gives an adhesive film that has high adhesiveness to a resist upper layer film, has an effect of suppressing fine pattern collapse, and that also makes it possible to form an excellent pattern profile; a patterning process using the material; and a method for forming the adhesive film.

Solution to Problem

To achieve the object, the present invention provides a material for forming an adhesive film formed between a silicon-containing middle layer film and a resist upper layer film, the material comprising:

(A) a resin having structural units shown by the following general formula (1) and the following general formula (2);
(B) a thermal acid generator; and
(C) an organic solvent, in the component (A), the structural unit shown by the following general formula (1) having a molar fraction of 5% or more and the structural unit shown by the following general formula (2) having a molar fraction of 30% or more,

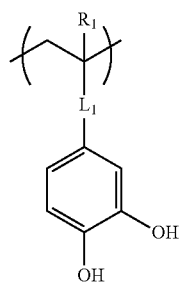
(1)

wherein $R_1$ represents a hydrogen atom or a methyl group, $L_1$ represents a single bond, a divalent organic group containing —C(=O)O—, or a divalent organic group containing —C(=O)NR_2—, and $R_2$ represents a hydrogen atom or a linear or branched alkyl group having 1 to 3 carbon atoms,

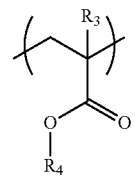
(2)

wherein $R_3$ represents a hydrogen atom or a methyl group, and $R_4$ represents a group selected from the following formulae (2-1) to (2-3),

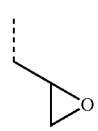
(2-1)

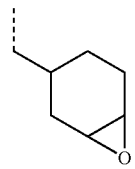
(2-2)

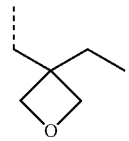
(2-3)

wherein a broken line represents a bonding arm.

Using such a material for forming an adhesive film, it is possible to form an adhesive film that has high adhesiveness to a resist upper layer film, has an effect of suppressing fine pattern collapse, and also gives a favorable pattern profile.

Furthermore, in the present invention, the general formula (1) is preferably shown by the following general formula (3),

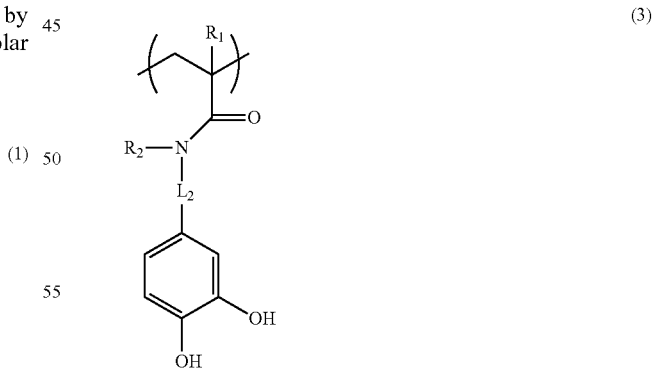
(3)

wherein $R_1$ and $R_2$ are as defined above and $L_2$ represents a single bond or an alkylene group having 1 or 2 carbon atoms, a hydrogen atom of the alkylene group optionally being substituted with a hydroxy group, and a methylene group included in the alkylene group optionally being substituted with a carbonyl group.

By the introduction of a catechol structural unit containing an amide bond as described, adhesiveness not only to the resist upper layer film, but also to the silicon-containing middle layer film is also enhanced, and the effect of suppressing fine pattern collapse can be enhanced.

Furthermore, in the present invention, the silicon-containing middle layer film is preferably a silicon-containing resist middle layer film or an inorganic hard mask middle layer film.

In the present invention, such middle layer films can be used suitably as the silicon-containing middle layer film.

Furthermore, the inventive material preferably further comprises one or more compounds shown by the following general formula (4) as (D) a photo-acid generator,

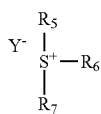
(4)

wherein $R_5$, $R_6$, and $R_7$ each independently represent a linear alkyl group or alkenyl group having 1 to 10 carbon atoms or a branched or cyclic alkyl group or alkenyl group having 3 to 10 carbon atoms, optionally substituted with a heteroatom, and optionally having an intervening heteroatom, or represent an aryl group or aralkyl group having 6 to 21 carbon atoms, optionally substituted with a heteroatom, and optionally having an intervening heteroatom, wherein any two of $R_5$, $R_6$, and $R_7$ are optionally bonded with each other to form a ring with the sulfur atom in the formula, and $Y^-$ represents one of the following general formula (5) and the following general formula (6), $$R_8\text{---}CF_2\text{---}SO_3\text{---} \tag{5}$$

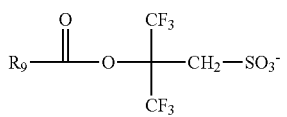
(6)

wherein $R_8$ and $R_9$ are independent of each other, and represent a monovalent hydrocarbon group containing an aliphatic ring structure having 3 to 40 carbon atoms, optionally substituted with a heteroatom, and optionally having an intervening heteroatom.

Such a material for forming an adhesive film has an effect of suppressing fine pattern collapse and allows an appropriate adjustment of pattern profile, exposure sensitivity, and so forth of a resist upper layer film.

In this event, the general formula (5) is preferably shown by the following general formula (7),

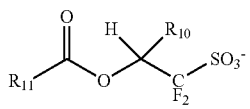
(7)

wherein $R_{10}$ represents a hydrogen atom or a trifluoromethyl group, and $R_{11}$ represents a monovalent hydrocarbon group containing an aliphatic ring structure having 3 to 35 carbon atoms, optionally substituted with a heteroatom, and optionally having an intervening heteroatom.

Such a material for forming an adhesive film has sufficient acidity, allows an appropriate adjustment of acid diffusion, and is also effective for the reduction of residue derived from the resist upper layer film in some cases.

Furthermore, in the present invention, the resin (A) preferably has a weight-average molecular weight of 1,000 to 30,000.

A material for forming an adhesive film containing a resin having a weight-average molecular weight within such a range has excellent film-formability. In addition, the generation of a sublimation product during heat-curing can be suppressed and the contamination of apparatuses due to sublimation products can be suppressed. Moreover, the generation of coating defects can be suppressed.

Furthermore, the present invention preferably further comprises at least one out of (E) a surfactant, (F) a crosslinking agent, (G) a plasticizer, and (H) a colorant.

It is possible to make fine adjustments to performance according to customer requirements, for example, film-formability, filling property, optical characteristics, and reduction of sublimation products by the presence, absence, or choice of these additives, and this is favorable for practicality.

In addition, the present invention provides a patterning process for forming a pattern in a substrate to be processed, comprising the steps of:
(I-1) forming a resist underlayer film on the substrate to be processed;
(I-2) forming a silicon-containing resist middle layer film on the resist underlayer film;
(I-3) applying the above-described materials for forming an adhesive film on the silicon-containing resist middle layer film and then performing a heat treatment to form an adhesive film;
(I-4) forming a resist upper layer film on the adhesive film by using a photoresist material;
(I-5) subjecting the resist upper layer film to pattern exposure and then to development with a developer to form a pattern in the resist upper layer film;
(I-6) transferring the pattern to the adhesive film by dry etching while using the resist upper layer film having the formed pattern as a mask;
(I-7) transferring the pattern to the silicon-containing resist middle layer film by dry etching while using the adhesive film having the formed pattern as a mask;
(I-8) transferring the pattern to the resist underlayer film by dry etching while using the silicon-containing resist middle layer film having the transferred pattern as a mask; and
(I-9) transferring the pattern to the substrate to be processed by dry etching while using the resist underlayer film having the transferred pattern as a mask.

In addition, the present invention provides
a patterning process for forming a pattern in a substrate to be processed, comprising the steps of:
(II-1) forming a resist underlayer film on the substrate to be processed;
(II-2) forming an inorganic hard mask middle layer film selected from a silicon oxide film, a silicon nitride film, and a silicon oxynitride film on the resist underlayer film;
(II-3) applying the above-described materials for forming an adhesive film on the inorganic hard mask middle layer film and then performing a heat treatment to form an adhesive film;
(II-4) forming a resist upper layer film on the adhesive film by using a photoresist material;

(II-5) subjecting the resist upper layer film to pattern exposure and then to development with a developer to form a pattern in the resist upper layer film;
(II-6) transferring the pattern to the adhesive film by dry etching while using the resist upper layer film having the formed pattern as a mask;
(II-7) transferring the pattern to the inorganic hard mask middle layer film by dry etching while using the adhesive film having the formed pattern as a mask;
(II-8) transferring the pattern to the resist underlayer film by dry etching while using the inorganic hard mask middle layer film having the transferred pattern as a mask; and
(II-9) transferring the pattern to the substrate to be processed by dry etching while using the resist underlayer film having the transferred pattern as a mask.

As described, the inventive material for forming an adhesive film can be used suitably for various patterning processes such as a 4-layer resist process in which the adhesive film is formed on the silicon-containing middle layer film (silicon-containing resist middle layer film, inorganic hard mask middle layer film). According to these patterning processes, pattern collapse can be relieved effectively by the formation of the adhesive film, and these patterning processes are suitable for photolithography of a resist upper layer film.

In this event, the inorganic hard mask middle layer film is preferably formed by a CVD method or an ALD method.

Furthermore, in the present invention, photolithography at a wavelength of 10 nm or more to 300 nm or less, a direct drawing by electron beam, a nanoimprinting, or a combination thereof is preferably employed as a method for forming a circuit pattern in the resist upper layer film.

Furthermore, in the present invention, alkaline development or development with an organic solvent is preferably employed as a development method.

In the present invention, pattern formation can be performed favorably and efficiently according to such a patterning process.

Furthermore, in the present invention, the substrate to be processed is preferably a semiconductor device substrate or the semiconductor device substrate coated with any of a metal film, a metal carbide film, a metal oxide film, a metal nitride film, a metal oxycarbide film, and a metal oxynitride film.

In this event, as the metal, silicon, titanium, tungsten, hafnium, zirconium, chromium, germanium, copper, silver, gold, aluminum, indium, gallium, arsenic, palladium, iron, tantalum, iridium, cobalt, manganese, molybdenum, or an alloy thereof is preferably used.

According to the inventive patterning processes, the substrates to be processed described above can be processed in the above manner to form a pattern.

In addition, the present invention provides a method for forming an adhesive film that functions as an adhesive layer employed in a semiconductor device manufacturing process, the method comprising:
spin-coating a substrate to be processed with the above-described material for forming an adhesive film; and
heating the substrate coated with the material for forming an adhesive film at a temperature of 100° C. or higher to 300° C. or lower for 10 to 600 seconds to form a cured film.

In addition, the present invention provides a method for forming an adhesive film that functions as an adhesive layer employed in a semiconductor device manufacturing process, the method comprising:
spin-coating a substrate to be processed with the above-described material for forming an adhesive film; and
heating the substrate coated with the material for forming an adhesive film in an atmosphere having an oxygen concentration of 0.1% or more to 21% or less to form a cured film.

According to such methods, the crosslinking reaction during formation of the adhesive film can be promoted, so that mixing with the resist upper layer film can be more highly suppressed. Furthermore, by adjusting the heating temperature, time, and oxygen concentration appropriately within the above-described ranges, an effect of suppressing pattern collapse of the adhesive film suited to the usage can be provided, and in addition, pattern profile adjustment properties of the resist upper layer film can be achieved.

In addition, the present invention provides a method for forming an adhesive film that functions as an adhesive layer employed in a semiconductor device manufacturing process, the method comprising:
spin-coating a substrate to be processed with the above-described material for forming an adhesive film; and
heating the substrate coated with the material for forming an adhesive film in an atmosphere having an oxygen concentration of less than 0.1% to form a cured film.

According to such a method, the substrate to be processed is not degraded, the crosslinking reaction during formation of the adhesive film can be promoted, and intermixing with the upper layer film can be suppressed more highly even when the substrate to be processed contains a material that is unstable to heating under an oxygen atmosphere. Therefore, such a method is useful.

Advantageous Effects of Invention

As described above, according to the present invention, it is possible to provide a material for forming an adhesive film having high adhesiveness to a resist upper layer film and having an effect of suppressing fine pattern collapse. Moreover, this material for forming an adhesive film has high adhesiveness and has an effect of suppressing fine pattern collapse, and also makes it possible to make appropriate adjustments to the pattern profile, exposure sensitivity, and so forth of the resist upper layer film. Therefore, the material is extremely useful in multilayer resist processes, for example, a 4-layer resist process in which the adhesive film is formed on a silicon-containing middle layer film. In addition, according to the inventive method for forming an adhesive film, it is possible to form an adhesive film that cures sufficiently on a substrate to be processed and has high adhesiveness to a resist upper layer film. In addition, according to the inventive patterning process, a fine pattern can be formed in a substrate to be processed with high precision in a multilayer resist process.

BRIEF DESCRIPTION OF DRAWINGS

FIG. 1 is an explanatory diagram of an example of an inventive patterning process according to a 4-layer resist process.
FIG. 2 is an explanatory diagram showing a method for measuring the adhesiveness in Examples.

DESCRIPTION OF EMBODIMENTS

As described above, there have been demands for: a material for forming an adhesive film that has high adhesiveness to a resist upper layer film and has an effect of suppressing fine pattern collapse in a fine patterning process according to a multilayer resist method in a semiconductor device manufacturing process; a patterning process using the material; and a method for forming an adhesive film.

The present inventors have earnestly studied the above-described problems and investigated materials for forming an adhesive film having high adhesiveness to a resist upper layer film by the formation of an adhesive film and having an effect of suppressing fine pattern collapse in multilayer lithography, and also investigated patterning processes using the materials. As a result, the present inventors have found out that a material for forming an adhesive film having, as a main component, a resin having a certain terminal structure, a patterning process using the material, and a method for forming an adhesive film are extremely effective, and completed the present invention.

That is, the present invention is a material for forming an adhesive film formed between a silicon-containing middle layer film and a resist upper layer film, the material comprising:

(A) a resin having structural units shown by the following general formula (1) and the following general formula (2);

(B) a thermal acid generator; and (C) an organic solvent, in the component (A), the structural unit shown by the following general formula (1) having a molar fraction of 5% or more and the structural unit shown by the following general formula (2) having a molar fraction of 30% or more,

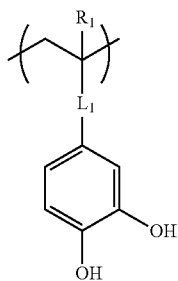

(1)

wherein $R_1$ represents a hydrogen atom or a methyl group, $L_1$ represents a single bond, a divalent organic group containing —C(=O)O—, or a divalent organic group containing —C(=O)NR$_2$—, and $R_2$ represents a hydrogen atom or a linear or branched alkyl group having 1 to 3 carbon atoms,

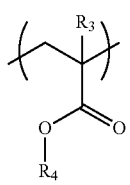

(2)

wherein $R_3$ represents a hydrogen atom or a methyl group, and $R_4$ represents a group selected from the following formulae (2-1) to (2-3),

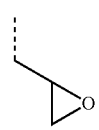

(2-1)

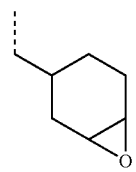

(2-2)

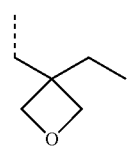

(2-3)

wherein a broken line represents a bonding arm.

Hereinafter, the present invention will be described in detail. However, the present invention is not limited thereto.

[Material for Forming Adhesive Film]

The present invention provides a material for forming an adhesive film that gives an adhesive film formed between a silicon-containing middle layer film and a resist upper layer film, the material for forming an adhesive film containing:

(A) a resin having structural units shown by the following general formula (1) and the following general formula (2);

(B) a thermal acid generator; and (C) an organic solvent, in the component (A), the structural unit shown by the following general formula (1) having a molar fraction of 5% or more and the structural unit shown by the following general formula (2) having a molar fraction of 30% or more.

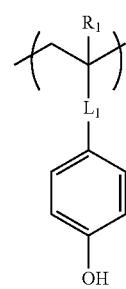

(1)

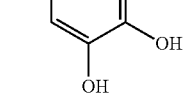

In the formula, $R_1$ represents a hydrogen atom or a methyl group, $L_1$ represents a single bond, a divalent organic group containing —C(=O)O—, or a divalent organic group containing —C(=O)NR$_2$—, and $R_2$ represents a hydrogen atom or a linear or branched alkyl group having 1 to 3 carbon atoms.

(2)

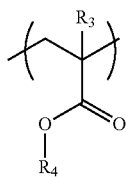

In the formula, R₃ represents a hydrogen atom or a methyl group, and R₄ represents a group selected from the following formulae (2-1) to (2-3).

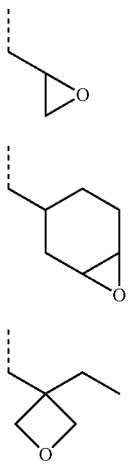

(2-1)

(2-2)

(2-3)

In the formulae, a broken line represents a bonding arm.

Note that in the inventive material for forming an adhesive film, one kind of the resin (A) may be used, or two or more kinds thereof may be used in combination. Furthermore, the material for forming an adhesive film may contain components other than the components (A) to (C). In the following, each component will be described.

[(A) Resin]

The resin (A) contained in the inventive material for forming an adhesive film has structural units shown by the following general formula (1) and the following general formula (2), and in the component (A), the structural unit shown by the following general formula (1) has a molar fraction of 5% or more, and the structural unit shown by the following general formula (2) has a molar fraction of 30% or more.

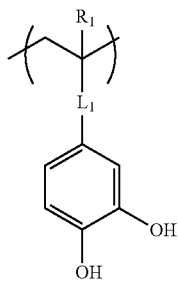

(1)

In the formula, $R_1$ represents a hydrogen atom or a methyl group, $L_1$ represents a single bond, a divalent organic group containing —C(=O)O—, or a divalent organic group containing —C(=O)NR₂—, and R₂ represents a hydrogen atom or a linear or branched alkyl group having 1 to 3 carbon atoms.

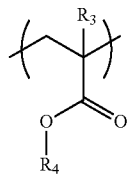

(2)

In the formula, R₃ represents a hydrogen atom or a methyl group, and R₄ represents a group selected from the following formulae (2-1) to (2-3).

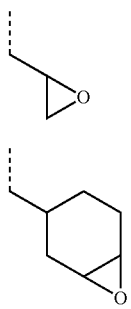

(2-1)

(2-2)

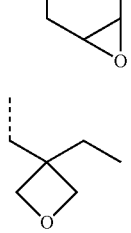

(2-3)

In the formulae, a broken line represents a bonding arm.

It can be considered that the structural unit shown by the general formula (1) functions as an adhesive group, specifically, adhesiveness is enhanced by the catechol group terminal structure causing interaction such as a hydrogen bond with the silicon-containing middle layer film and the resist upper layer film.

Specific examples of the $L_1$ in the general formula (1) other than the single bond include the following.

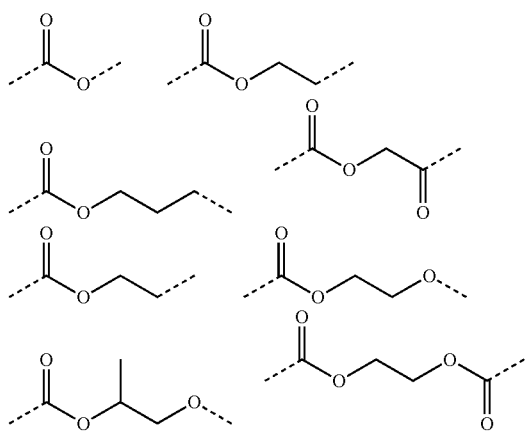

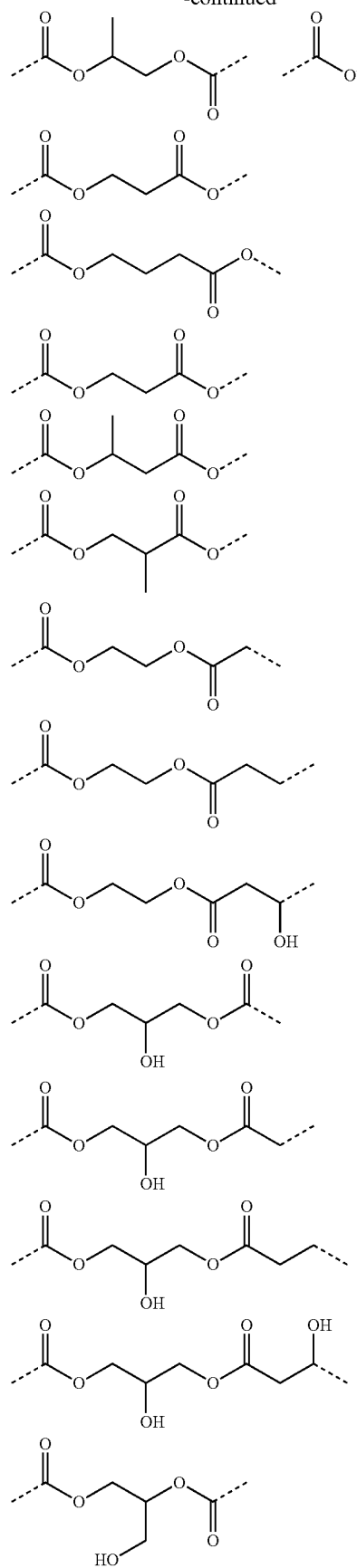
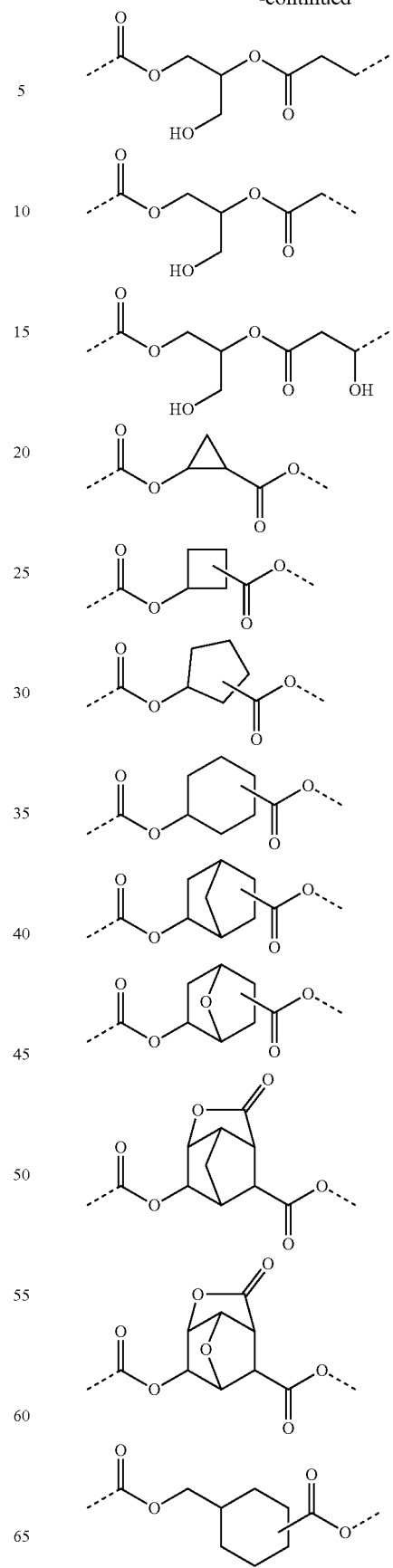

-continued

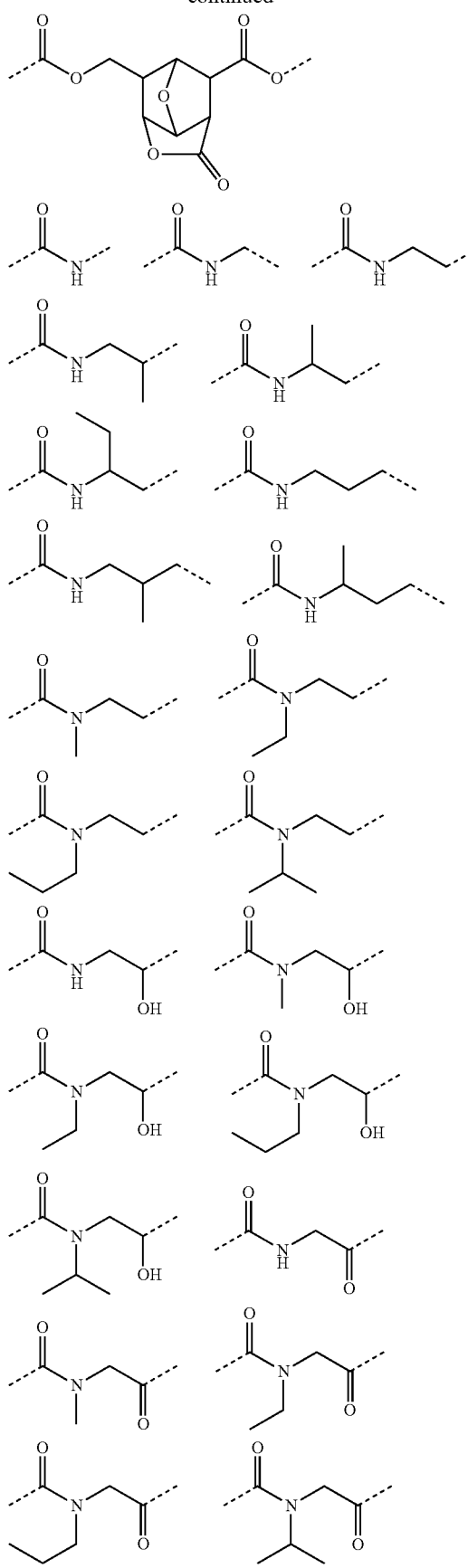
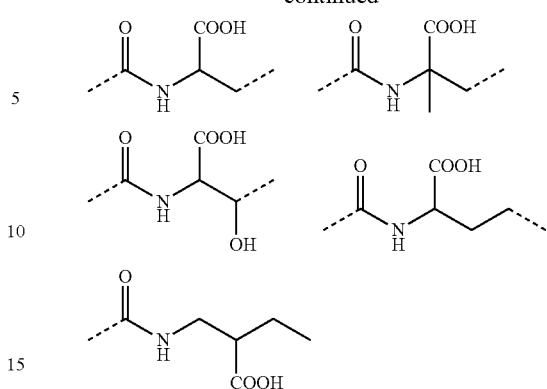

In the formulae, a broken line represents a bonding arm.

Furthermore, the structural unit shown by the general formula (1) preferably has a structure shown by the following general formula (3).

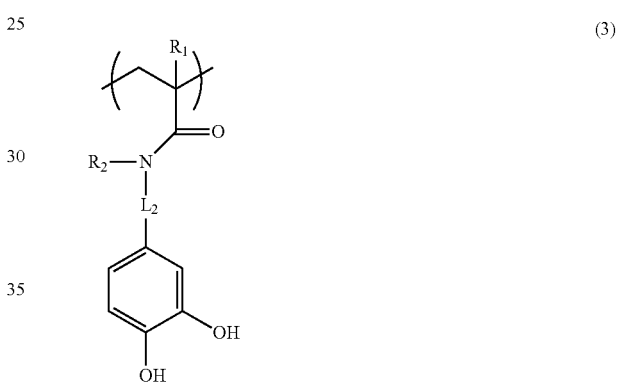

In the formula, $R_1$ and $R_2$ are as defined above and $L_2$ represents a single bond or an alkylene group having 1 or 2 carbon atoms, a hydrogen atom of the alkylene group optionally being substituted with a hydroxy group, and a methylene group included in the alkylene group optionally being substituted with a carbonyl group.

Specific examples of the structural unit shown by the general formula (3) include the following or the like. In particular, in view of adhesiveness and availability of the raw materials, those in which $L_2$ represents an alkylene group having 2 carbon atoms (ethylene group) are particularly preferable.

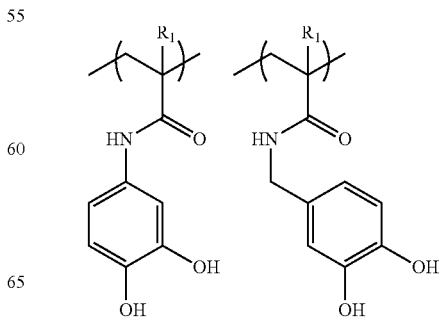

-continued

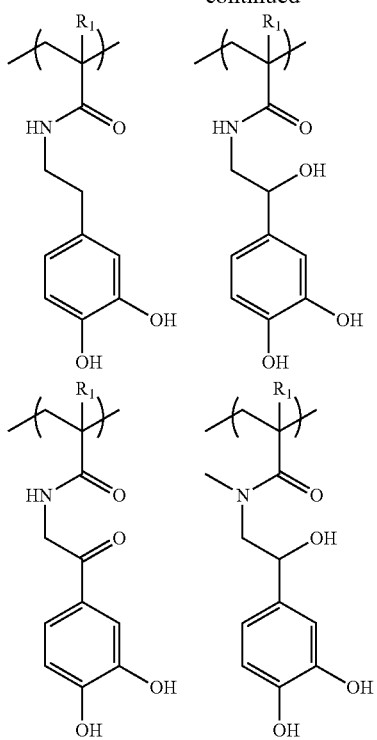

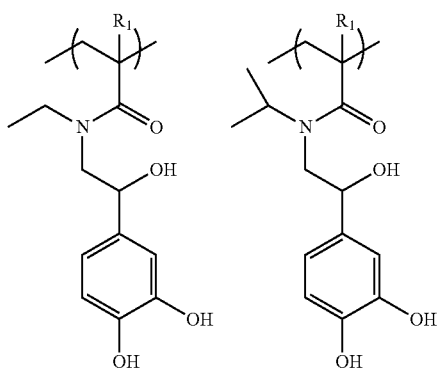

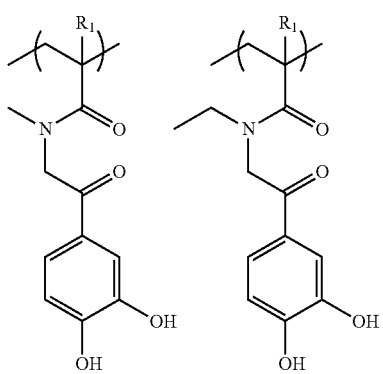

-continued

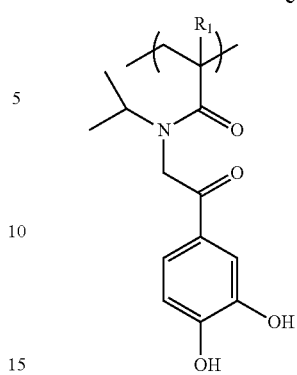

The structural unit shown by the general formula (2) functions as a crosslinking group. Owing to the interaction of hydroxy groups generated by a ring opening reaction that occurs during curing of an epoxy or oxetane structure as in the following figure, curability can be provided without losing the adhesiveness to the resist upper layer film and the silicon-containing middle layer film.

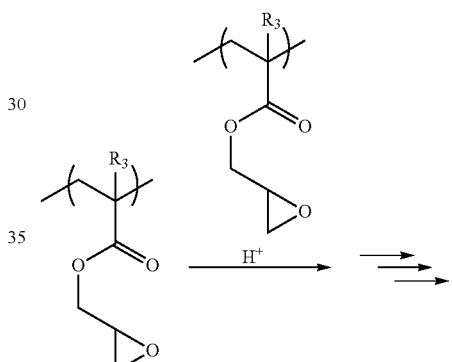

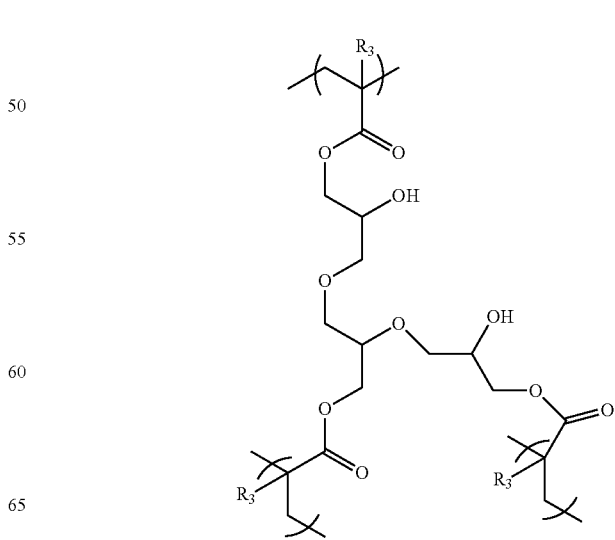

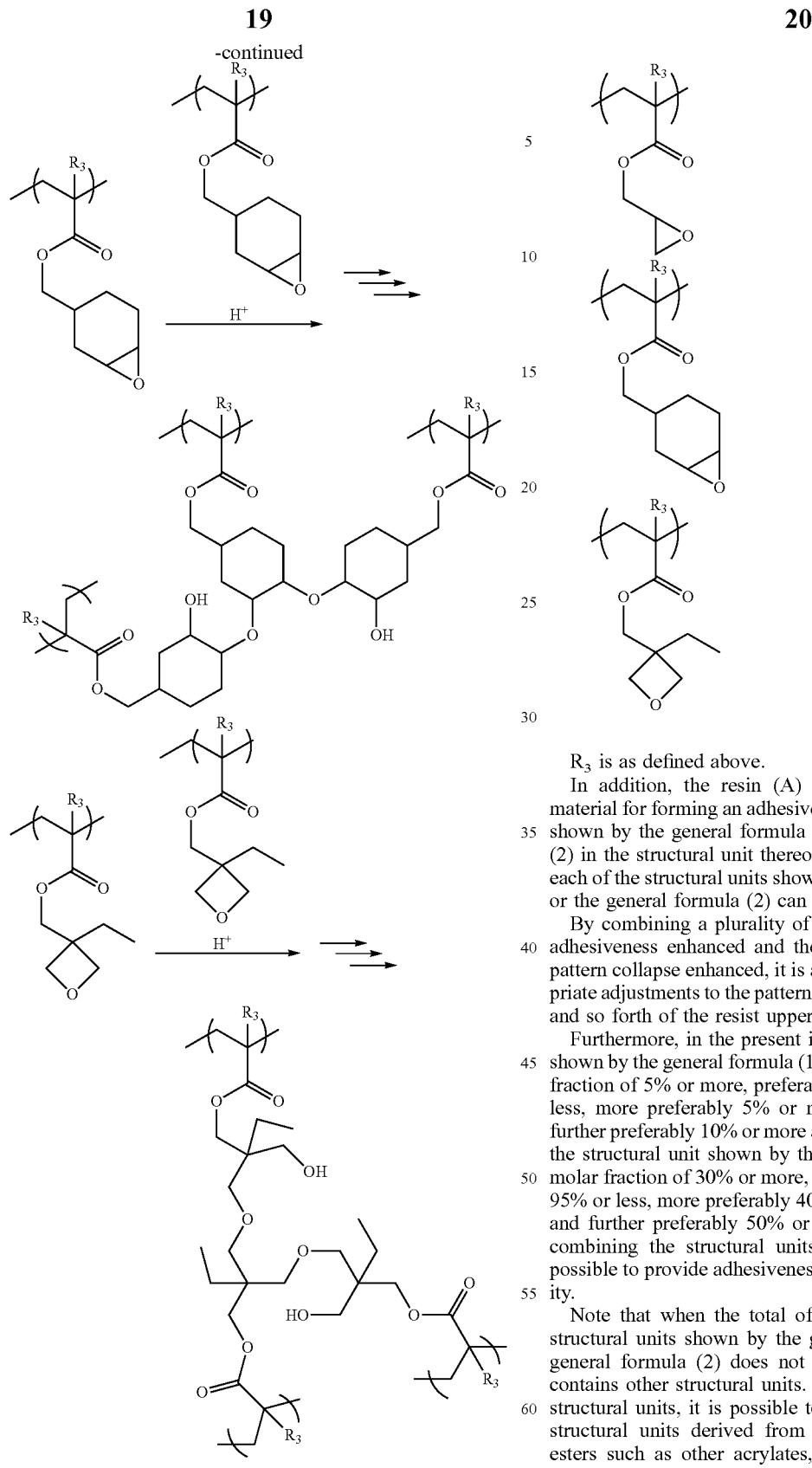

$R_3$ is as defined above.

In addition, specific examples of the structural unit shown by the general formula (2) include the following.

$R_3$ is as defined above.

In addition, the resin (A) contained in the inventive material for forming an adhesive film has the structural units shown by the general formula (1) and the general formula (2) in the structural unit thereof, and one or more kinds of each of the structural units shown by the general formula (1) or the general formula (2) can be used in combination.

By combining a plurality of structural units, not only is adhesiveness enhanced and the effect of suppressing fine pattern collapse enhanced, it is also possible to make appropriate adjustments to the pattern profile, exposure sensitivity, and so forth of the resist upper layer film.

Furthermore, in the present invention, the structural unit shown by the general formula (1) in the resin (A) has a molar fraction of 5% or more, preferably 5% or more and 50% or less, more preferably 5% or more and 30% or less, and further preferably 10% or more and 30% or less. Meanwhile, the structural unit shown by the general formula (2) has a molar fraction of 30% or more, preferably 30% or more and 95% or less, more preferably 40% or more and 90% or less, and further preferably 50% or more and 90% or less. By combining the structural units within such ranges, it is possible to provide adhesiveness while maintaining curability.

Note that when the total of the molar fractions of the structural units shown by the general formula (1) and the general formula (2) does not reach 100%, the resin (A) contains other structural units. In such a case, as the other structural units, it is possible to use a combination of any structural units derived from α,β-unsaturated carboxylic esters such as other acrylates, other methacrylates, other acrylamides, other methacrylamides, crotonates, maleates, and itaconates; α,β-unsaturated carboxylic acids such as methacrylic acid, acrylic acid, maleic acid, and itaconic acid; acrylonitrile; methacrylonitrile; α,β-unsaturated lactones such as 5,5-dimethyl-3-methylene-2-oxotetrahydrofuran;

cyclic olefins such as norbornene derivatives and tetracyclo [4.4.0.1$^{2,5}$.1$^{7,10}$]dodecene derivatives; α,β-unsaturated carboxylic anhydrides such as maleic anhydride and itaconic anhydride; allyl ethers; vinyl ethers; vinyl esters; and vinyl silanes.

By using a material for forming an adhesive film containing such a resin for forming a multilayer resist film applied in fine processing in a manufacturing process of a semiconductor device or the like, it is possible to provide a material for forming an adhesive film that has high adhesiveness to a resist upper layer film, has an effect of suppressing fine pattern collapse, and that can be manufactured easily, a method for forming an adhesive film, and a patterning process.

The resin can be synthesized according to a known method by polymerizing monomers protected with a protecting group as necessary, and then performing a deprotection reaction as necessary. The polymerization reaction is not particularly limited, but is preferably radical polymerization or anion polymerization. Regarding these methods, JP 2004-115630 A may be consulted.

The resin preferably has a weight-average molecular weight (Mw) of 1,000 to 30,000, more preferably 5,000 to 25,000, further preferably 5,000 to 15,000. When the Mw is 1,000 or more, excellent film-formability can be provided, the generation of sublimation products during heat-curing can be suppressed, and the contamination of apparatuses due to sublimation products can be suppressed. Meanwhile, when the Mw is 30,000 or less, coatability failure or coating defects due to insufficient solubility to solvents can be suppressed. Furthermore, the resin preferably has a molecular weight distribution (Mw/Mn) of 1.0 to 3.0, more preferably 1.0 to 2.5. Note that in the present invention, Mw and molecular weight distribution are values measured in terms of polystyrene by gel permeation chromatography (GPC) using tetrahydrofuran (THF) as an eluent.

[(B) Thermal Acid Generator]

In the inventive material for forming an adhesive film, a thermal acid generator (B) is contained in order to promote the crosslinking reaction by heat.

Examples of a thermal acid generator (B) that can be used in the inventive material for forming an adhesive film include general formula (8).

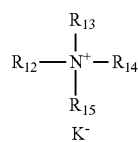

(8)

In the formula, K$^-$ represents a non-nucleophilic counter ion. $R_{12}$, $R_{13}$, $R_{14}$, and $R_{15}$ each represent a hydrogen atom, a linear, branched, or cyclic alkyl group, alkenyl group, oxoalkyl group, or oxoalkenyl group having 1 to 12 carbon atoms, an aryl group having 6 to 20 carbon atoms, or an aralkyl group or aryloxoalkyl group having 7 to 12 carbon atoms, some or all of the hydrogen atoms of these groups optionally being substituted with an alkoxy group or the like. In addition, $R_{12}$ and $R_{13}$ may form a ring, and $R_{12}$, $R_{13}$, and $R_{14}$ may form a ring. When forming a ring, $R_{12}$ and $R_{13}$, or $R_{12}$, $R_{13}$, and $R_{14}$ represent an alkylene group having 3 to 10 carbon atoms, or a heterocyclic aromatic ring containing the nitrogen atom in the formula therein. $R_{12}$, $R_{13}$, $R_{14}$, and $R_{15}$ may be identical to or different from one another. Specifically, examples of the alkyl group include a methyl group, an ethyl group, a propyl group, an isopropyl group, an n-butyl group, a sec-butyl group, a tert-butyl group, a pentyl group, a hexyl group, a heptyl group, an octyl group, a cyclopentyl group, a cyclohexyl group, a cycloheptyl group, a cyclopropylmethyl group, a 4-methylcyclohexyl group, a cyclohexylmethyl group, a norbornyl group, an adamantyl group, and the like. Examples of the alkenyl group include a vinyl group, an allyl group, a propenyl group, a butenyl group, a hexenyl group, a cyclohexenyl group, and the like. Examples of the oxoalkyl group include a 2-oxocyclopentyl group, a 2-oxocyclohexyl group, etc., and include a 2-oxopropyl group, a 2-cyclopentyl-2-oxoethyl group, a 2-cyclohexyl-2-oxoethyl group, a 2-(4-methylcyclohexyl)-2-oxoethyl group, and the like. Examples of the oxoalkenyl group include a 2-oxo-4-cyclohexenyl group, a 2-oxo-4-propenyl group, and the like. Examples of the aryl group include a phenyl group, a naphthyl group, and the like; alkoxyphenyl groups such as a p-methoxyphenyl group, an m-methoxyphenyl group, an o-methoxyphenyl group, an ethoxyphenyl group, a p-tert-butoxyphenyl group, and an m-tert-butoxyphenyl group; alkylphenyl groups such as a 2-methylphenyl group, a 3-methylphenyl group, a 4-methylphenyl group, an ethylphenyl group, a 4-tert-butylphenyl group, a 4-butylphenyl group, and a dimethylphenyl group; alkylnaphthyl groups such as a methylnaphthyl group and an ethylnaphthyl group; alkoxynaphthyl groups such as a methoxynaphthyl group and an ethoxynaphthyl group; dialkylnaphthyl groups such as a dimethylnaphthyl group and a diethylnaphthyl group; dialkoxynaphthyl groups such as a dimethoxynaphthyl group and a diethoxynaphthyl group; and the like. Examples of the aralkyl group include a benzyl group, a phenylethyl group, a phenethyl group, and the like. Examples of the aryloxoalkyl group include 2-aryl-2-oxoethyl groups such as a 2-phenyl-2-oxoethyl group, a 2-(1-naphthyl)-2-oxoethyl group, and a 2-(2-naphthyl)-2-oxoethyl group; and the like.

In addition, examples of the heterocyclic aromatic ring, the $R_{12}$, $R_{13}$, $R_{14}$, and Rn having, in the ring, the nitrogen atom in the formula, include imidazole derivatives (for example, imidazole, 4-methylimidazole, 4-methyl-2-phenylimidazole, etc.), pyrazole derivatives, furazan derivatives, pyrroline derivatives (for example, pyrroline, 2-methyl-1-pyrroline, etc.), pyrrolidine derivatives (for example, pyrrolidine, N-methylpyrrolidine, pyrrolidinone, N-methylpyrrolidone, etc.), imidazoline derivatives, imidazolidine derivatives, pyridine derivatives (for example, pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridone, 4-pyrrolidinopyridine, 1-methyl-4-phenylpyridine, 2-(1-ethylpropyl) pyridine, aminopyridine, dimethylaminopyridine, etc.), pyridazine derivatives, pyrimidine derivatives, pyrazine derivatives, pyrazoline derivatives, pyrazolidine derivatives, piperidine derivatives, piperadine derivatives, morpholine derivatives, indole derivatives, isoindole derivatives, 1H-indazole derivatives, indoline derivatives, quinoline derivatives (for example, quinoline, 3-quinolinecarbonitrile, etc.), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, uridine derivatives, etc.

The non-nucleophilic counter ion of K⁻ includes halide ions such as a chloride ion and a bromide ion; fluoroalkyl sulfonate ions such as triflate ion, 1,1,1-trifluoroethanesulfonate ion, and nonafluorobutanesulfonate ion; arylsulfonate ions such as tosylate ion, benzenesulfonate ion, 4-fluorobenzenesulfonate ion, and 1,2,3,4,5-pentafluorobenzenesulfonate ion; alkylsulfonate ions such as mesylate ion and butanesulfonate ion; imidic acid ions such as bis(trifluoromethylsulfonyl)imide ion, bis(perfluoroethylsulfonyl)imide ion, and bis(perfluorobutylsulfonyl)imide ion; methide acid ions such as tris(trifluoromethylsulfonyl)methide ion and tris(perfluoroethylsulfonyl)methide ion; furthermore, sulfonate ions having the α-position substituted with fluorine shown in the following general formula (9); and sulfonate ions having the α- and β-positions substituted with fluorine shown in the following general formula (10).

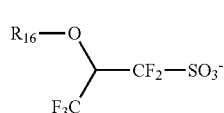

(9)

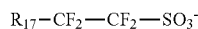

(10)

In the general formula (9), $R_{16}$ represents a hydrogen atom, a linear, branched, or cyclic alkyl group or acyl group having 1 to 20 carbon atoms, an alkenyl group having 2 to 20 carbon atoms, or an aryl group or aryloxy group having 6 to 20 carbon atoms. In the general formula (10), $R_{17}$ represents a hydrogen atom, a linear, branched, or cyclic alkyl group having 1 to 20 carbon atoms, an alkenyl group having 2 to 20 carbon atoms, or an aryl group having 6 to 20 carbon atoms.

Specific examples of the above-described thermal acid generator include the following.

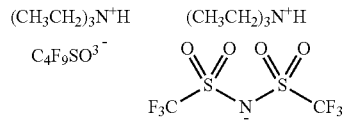

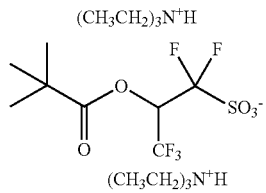

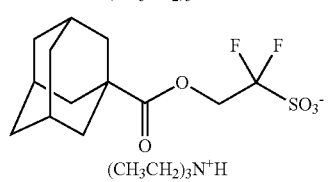

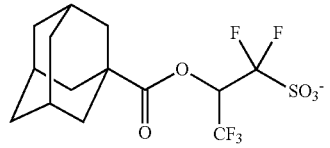

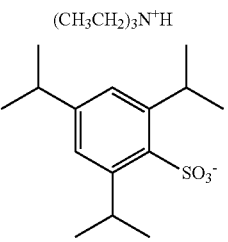

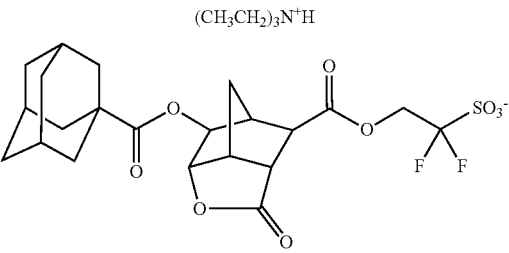

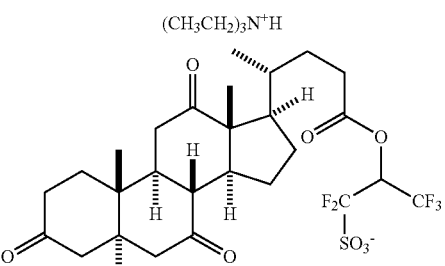

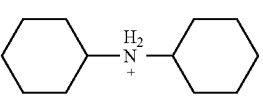

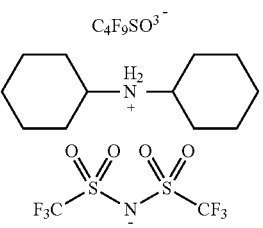

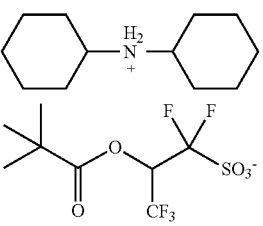

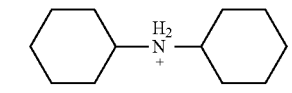

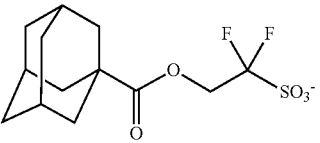

-continued

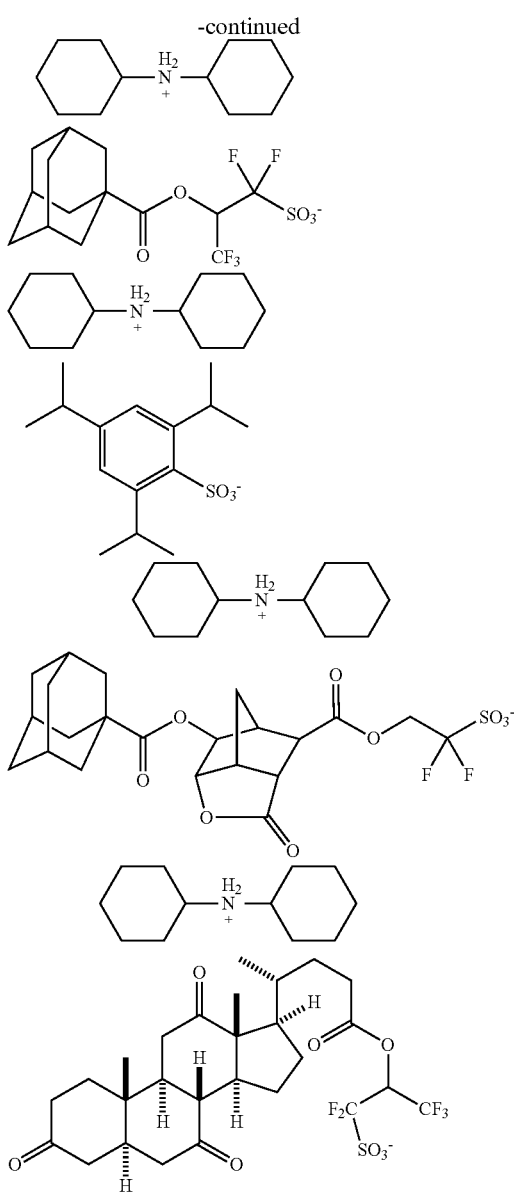

One kind of the thermal acid generator may be used or two or more kinds thereof may be used in combination.

The amount of the thermal acid generator to be contained is preferably 0.05 to 50 parts by mass, more preferably 0.1 to 10 parts by mass based on 100 parts by mass of the above-described resin (A). When the amount is 0.05 parts by mass or more, there is little risk of insufficient crosslinking reaction due to insufficient amount of generated acid. When the amount is 50 parts by mass or less, there is little risk of a mixing phenomenon occurring due to acid moving into the upper layer resist.

[(C) Organic Solvent]

There is no particular restriction to the organic solvent (C) contained in the material for forming an adhesive film used in the inventive method for forming an adhesive film as long as the resin (A), the thermal acid generator (B), if present, the photo-acid generator (D) described below, other additives, and so forth can be dissolved in the solvent. Specifically, solvents with a boiling point of lower than 180° C. such as those disclosed in paragraphs [0091] and [0092] of JP 2007-199653 A can be used. Above all, propylene glycol monomethyl ether acetate, propylene glycol monomethyl ether, 2-heptanone, cyclopentanone, cyclohexanone, and a mixture of two or more thereof are preferably used.

It is desirable to adjust the amount of the organic solvent to be contained according to the set film thickness of the adhesive film, but usually, the amount is in the range of 100 to 50,000 parts by mass based on 100 parts by mass of the resin (A).

Such a material for forming an adhesive film can be applied by spin-coating, and since the resin (A) as described above is contained, it is possible to achieve a composition for forming an adhesive film that has high adhesiveness to a resist upper layer film and has an effect of suppressing fine pattern collapse.

[(D) Photo-Acid Generator]

In addition, the inventive material for forming an adhesive film preferably contains a photo-acid generator as the component (D). The photo-acid generator is preferably shown by the following general formula (4).

In the formula, $R_5$, $R_6$, and $R_7$ each independently represent a linear alkyl group or alkenyl group having 1 to 10 carbon atoms or a branched or cyclic alkyl group or alkenyl group having 3 to 10 carbon atoms, optionally substituted with a heteroatom, and optionally having an intervening heteroatom, or represent an aryl group or aralkyl group having 6 to 21 carbon atoms, optionally substituted with a heteroatom, and optionally having an intervening heteroatom. Here, any two of $R_5$, $R_6$, and $R_7$ are optionally bonded with each other to form a ring with the sulfur atom in the formula, and $Y^-$ represents one of the following general formula (5) and the following general formula (6).

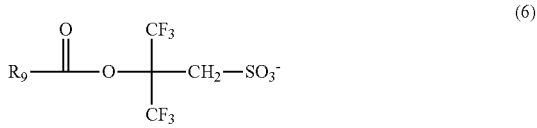

In the formula, $R_8$ and $R_9$ are independent of each other, and represent a monovalent hydrocarbon group containing an aliphatic ring structure having 3 to 40 carbon atoms, optionally substituted with a heteroatom, and optionally having an intervening heteroatom.

In this event, the general formula (5) is more preferably shown by the following general formula (7).

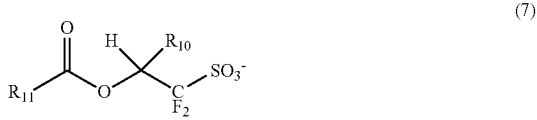

In the formula, $R_{10}$ represents a hydrogen atom or a trifluoromethyl group, and $R_{11}$ represents a monovalent hydrocarbon group containing an aliphatic ring structure having 3 to 35 carbon atoms, optionally substituted with a heteroatom, and optionally having an intervening heteroatom.

The $R_5$, $R_6$, and $R_7$ in the general formula (4) each independently represent a linear alkyl group or alkenyl group having 1 to 10 carbon atoms or a branched or cyclic alkyl group or alkenyl group having 3 to 10 carbon atoms, optionally substituted with a heteroatom, and optionally having an intervening heteroatom, or represent an aryl group or aralkyl group having 6 to 21 carbon atoms, optionally substituted with a heteroatom, and optionally having an intervening heteroatom. Specific examples thereof include alkyl groups such as a methyl group, an ethyl group, an n-propyl group, an isopropyl group, an n-butyl group, a tert-butyl group, a cyclopropyl group, a cyclopentyl group, a cyclohexyl group, a cyclopropylmethyl group, a. 4-methylcyclohexyl group, a cyclohexylmethyl group, a norbornyl group, and an adamantyl group; alkenyl groups such as a vinyl group, an allyl group, a propenyl group, a butenyl group, a hexenyl group, and a cyclohexenyl group; aryl groups such as a phenyl group, a naphthyl group, and a thienyl group; aralkyl groups such as a benzyl group, a 1-phenylethyl group, and a 2-phenylethyl group; etc. Aryl groups are preferable. Additionally, some of the hydrogen atoms of these groups may be substituted with a heteroatom such as an oxygen atom, a sulfur atom, a nitrogen atom, and a halogen atom. A heteroatom such as an oxygen atom, a sulfur atom, and a nitrogen atom may be contained. As a result, a hydroxy group, a cyano group, a carbonyl group, an ether bond, an ester bond, a sulfonic acid ester bond, a carbonate bond, a lactone ring, a sultone ring, carboxylic anhydride, a haloalkyl group, or the like may be formed or contained. In addition, any two of $R_5$, $R_6$, and $R_7$ are optionally bonded with each other to form a ring with the sulfur atom in the formula.

Specific examples of the partial structure shown by $R_5$, $R_6$, $R_7$, and $S^+$ in the general formula (4) include triphenylsulfonium, 4-hydroxyphenyldiphenylsulfonium, bis(4-hydroxyphenyl)phenylsulfonium, tris(4-hydroxyphenyl)sulfonium, 4-tert-butoxyphenyldiphenylsulfonium, bis(4-tert-butoxyphenyl)phenylsulfonium, tris(4-tert-butoxyphenyl)sulfonium, 3-tert-butoxyphenyldiphenylsulfonium, bis(3-tert-butoxyphenyl)phenylsulfonium, tris(3-tert-butoxyphenyl)sulfonium, 3,4-di-tert-butoxyphenyldiphenylsulfonium, bis(3,4-di-tert-butoxyphenyl)phenylsulfonium, tris(3,4-di-tert-butoxyphenyl)sulfonium, diphenyl(4-thiophenoxyphenyl) sulfonium, 4-tert-butoxycarbonylmethyloxyphenyldiphenylsulfonium, tris(4-tert-butoxycarbonylmethyloxyphenyl)sulfonium, (4-tert-butoxyphenyl)bis(4-dimethylaminophenyl)sulfonium, tris(4-dimethylaminophenyl)sulfonium, 2-naphthyldiphenylsulfonium, (4-hydroxy-3,5-dimethylphenyl)diphenylsulfonium, (4-n-hexyloxy-3,5-dimethylphenyl)diphenylsulfonium, dimethyl(2-naphthyl)sulfonium, 4-hydroxyphenyldimethylsulfonium, 4-methoxyphenyldimethylsulfonium, trimethylsulfonium, 2-oxocyclohexylcyclohexylmethylsulfonium, trinaphthylsulfonium, tribenzylsulfonium, diphenylmethylsulfonium, dimethylphenylsulfonium, 2-oxo-2-phenylethylthiacyclopentanium, diphenyl-2-thienylsulfonium, 4-n-butoxynaphthyl-1-thiacyclopentanium, 2-n-butoxynaphthyl-1-thiacyclopentanium, 4-methoxynaphthyl-1-thiacyclopentanium, 2-methoxynaphthyl-1-thiacyclopentanium, and the like. More preferable examples include triphenylsulfonium, 4-tert-butylphenyldiphenylsulfonium, 4-tert-butoxyphenyldiphenylsulfonium, tris(4-tert-butylphenyl)sulfonium, tris(4-tert-butoxyphenyl)sulfonium, dimethylphenylsulfonium, and the like.

Further examples also include those shown by the following structures.

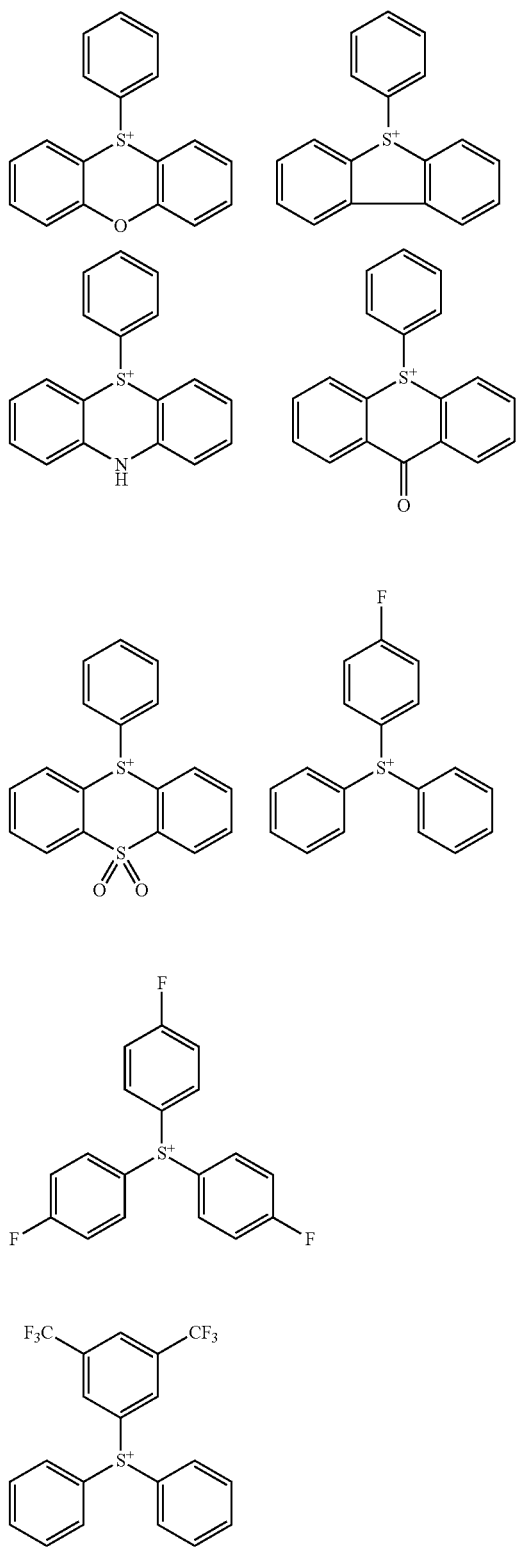

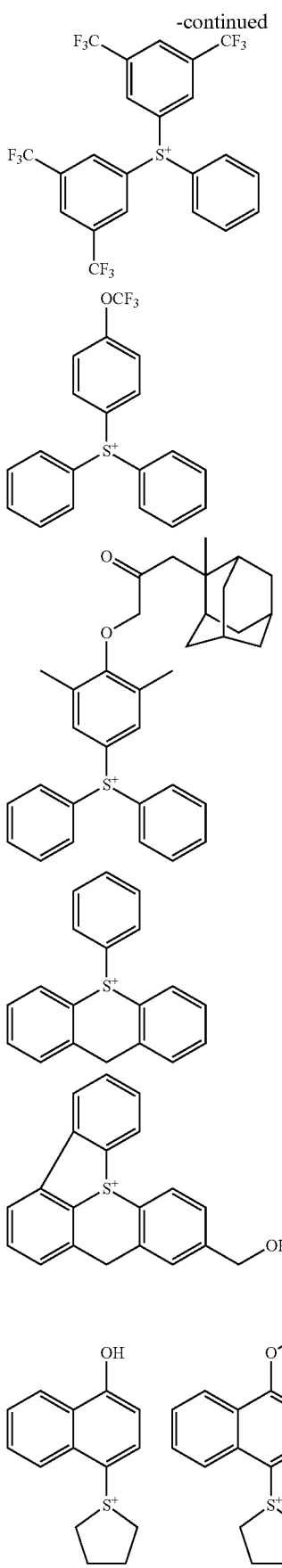

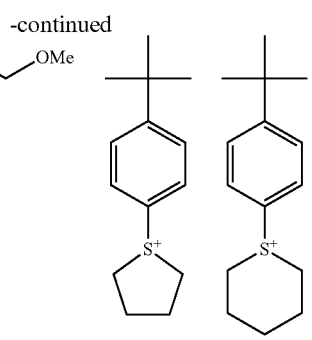

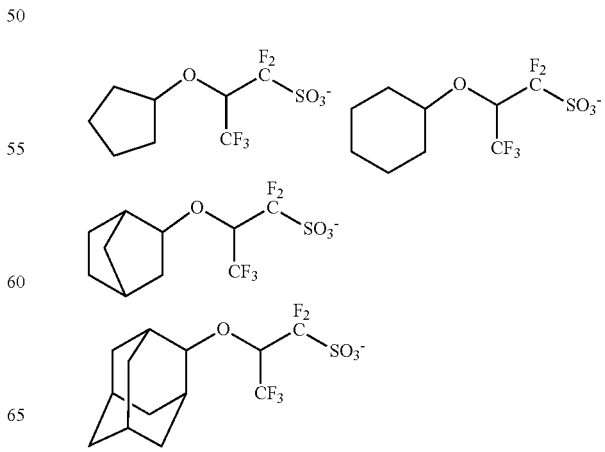

Meanwhile, the Y⁻ in the general formula (4) represents one of the general formula (5) or the general formula (6), but is not limited thereto. In the general formula (5) or the general formula (6), $R_8$ and $R_9$ each independently represent a monovalent hydrocarbon group containing an aliphatic ring structure having 3 to 40 carbon atoms, optionally substituted with a heteroatom, and optionally having an intervening heteroatom. $R_8$ and $R_9$ preferably represent a 1-norbornyl group, a 1-adamantyl group, a 2-adamantyl group, or a 4-oxo-1-adamantyl group.

Furthermore, the general formula (5) is preferably shown by the general formula (7). In the general formula (7), $R_{10}$ represents a hydrogen atom or a trifluoromethyl group, preferably a trifluoromethyl group. $R_{11}$ represents a monovalent hydrocarbon group containing an aliphatic ring structure having 3 to 35 carbon atoms, optionally substituted with a heteroatom, and optionally having an intervening heteroatom. $R_{11}$ preferably represents a 1-norbornyl group, a 1-adamantyl group, a 2-adamantyl group, or a 4-oxo-1-adamantyl group.

Specific examples of the Y— shown by the general formulae (5), (6), and (7) include the following, but are not limited thereto.

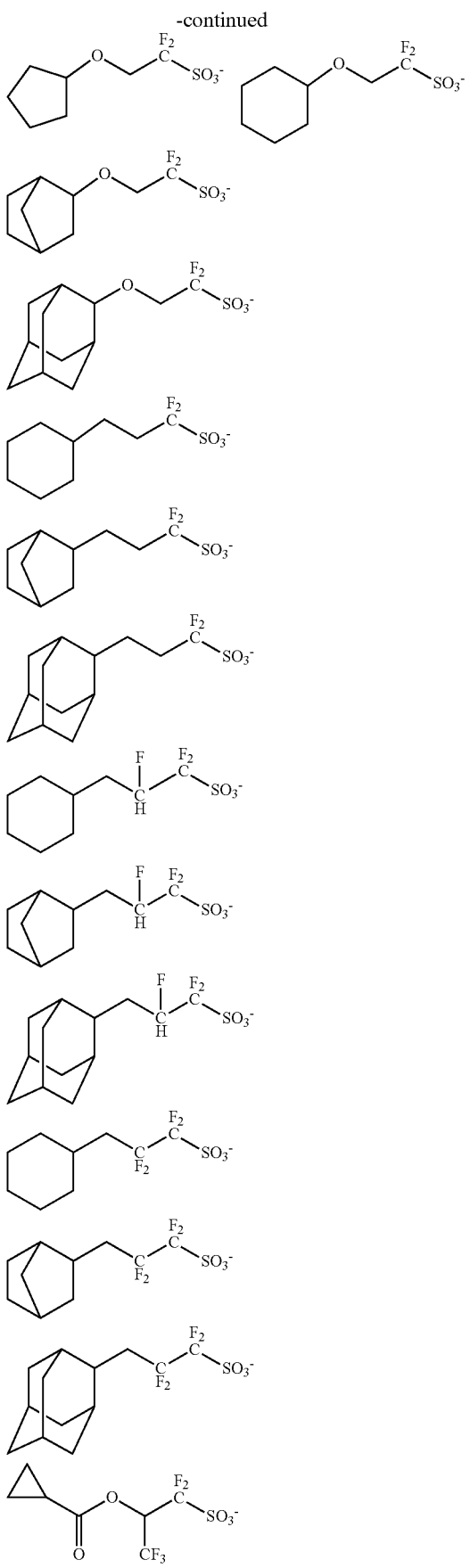
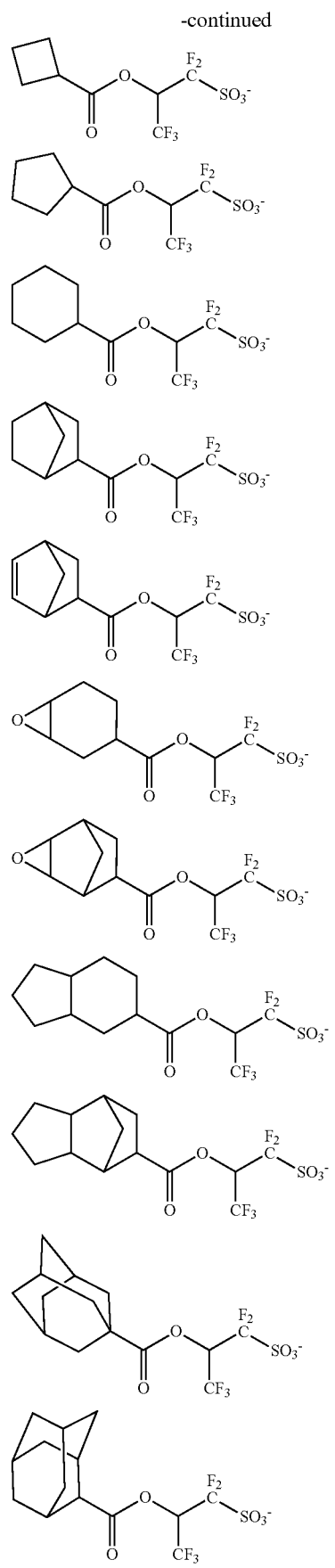

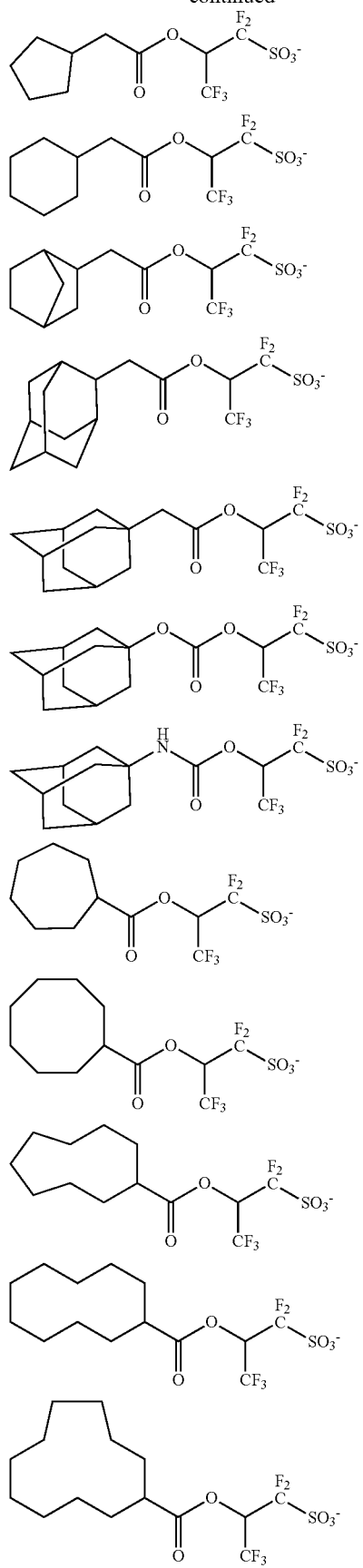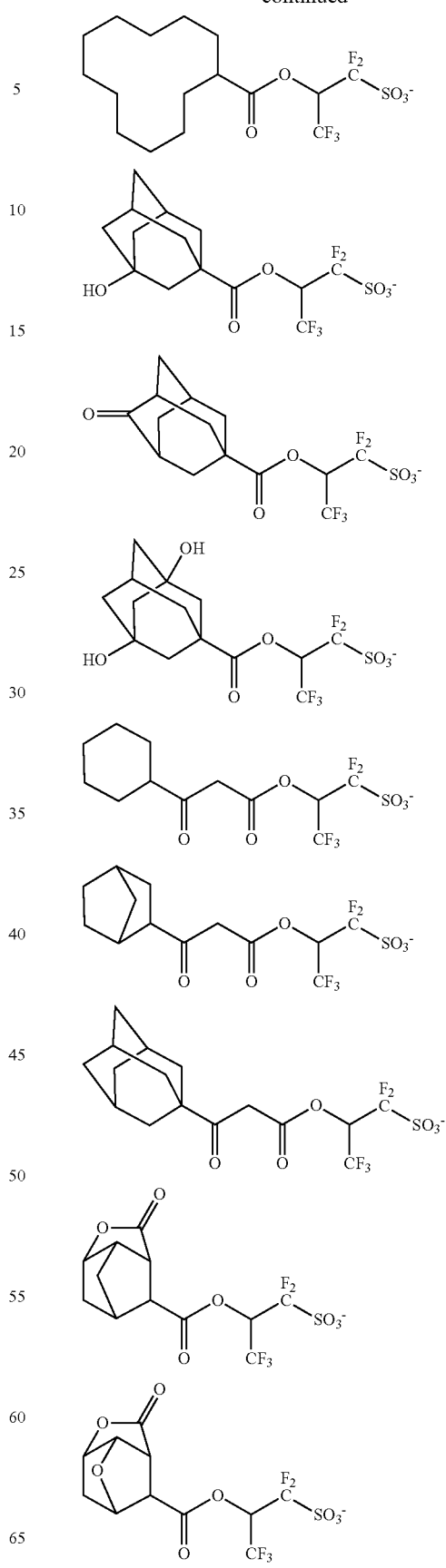

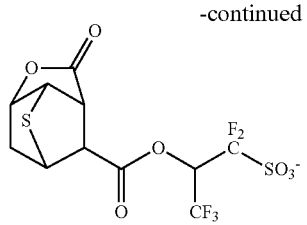
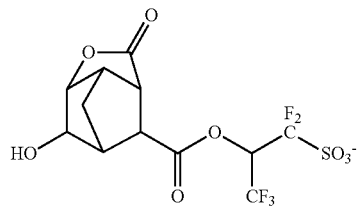
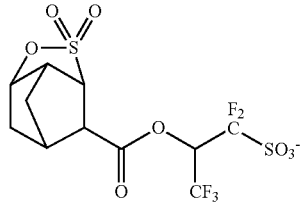
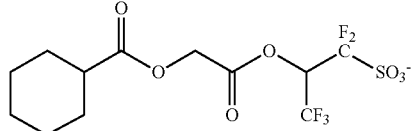
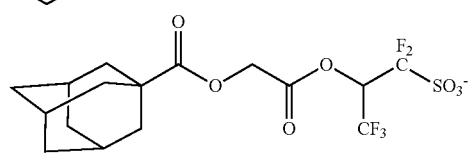
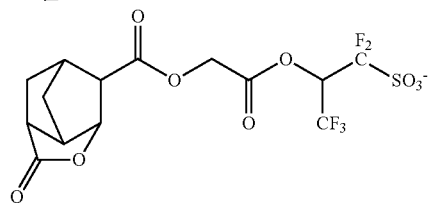
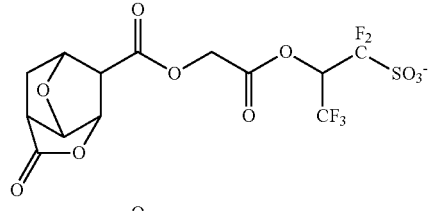
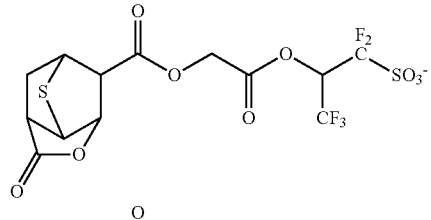
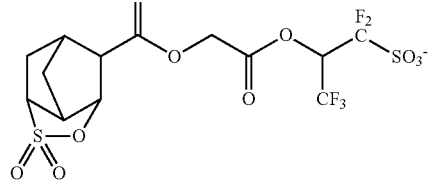
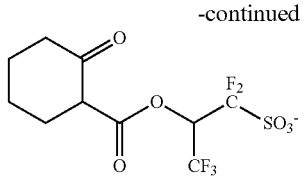
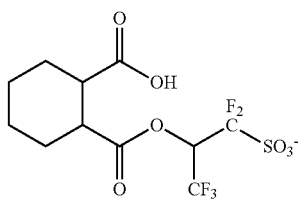
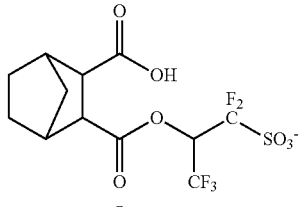
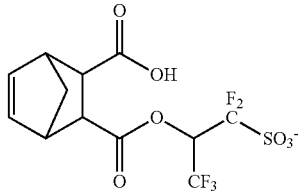
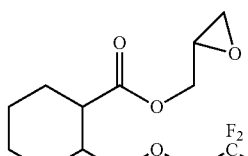
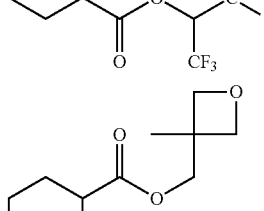
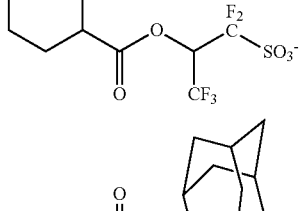
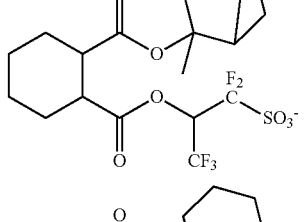
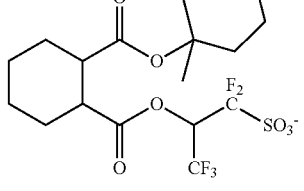

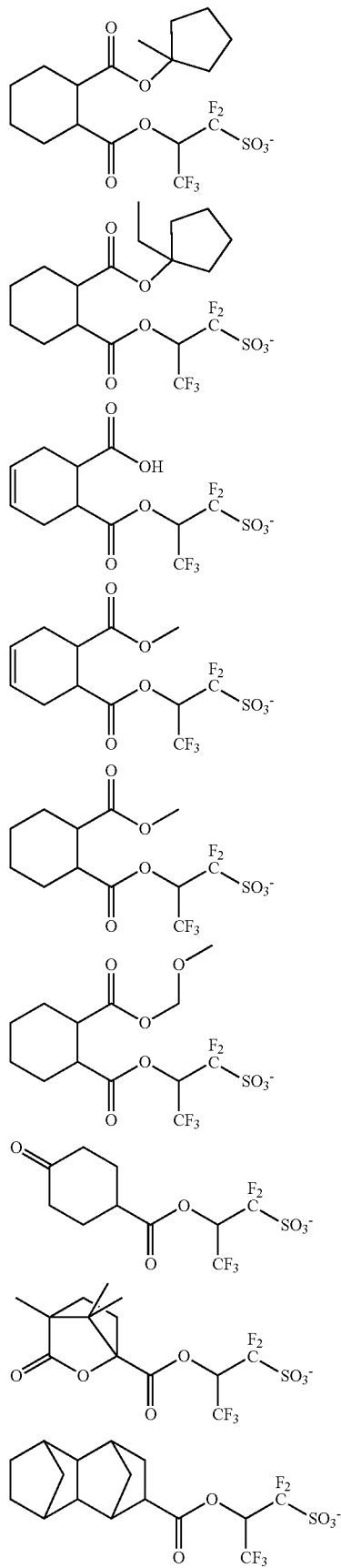
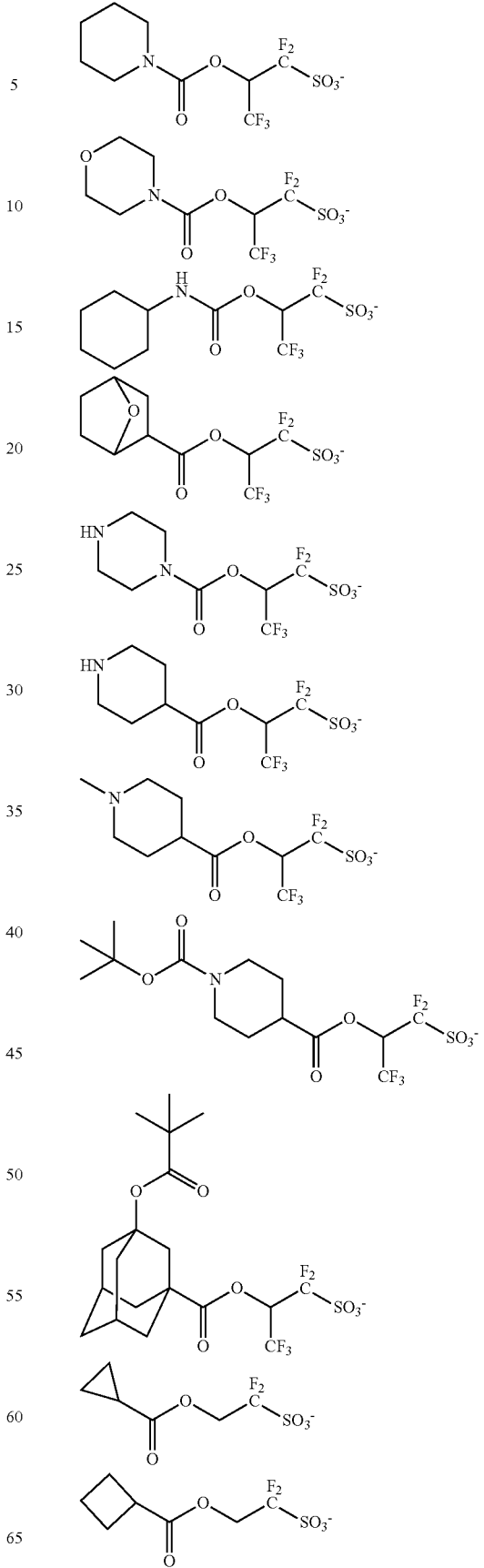

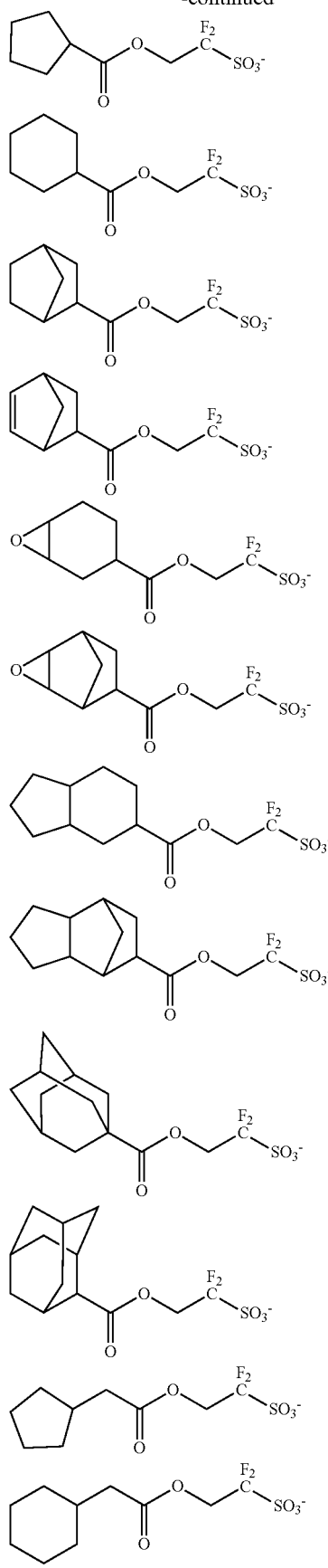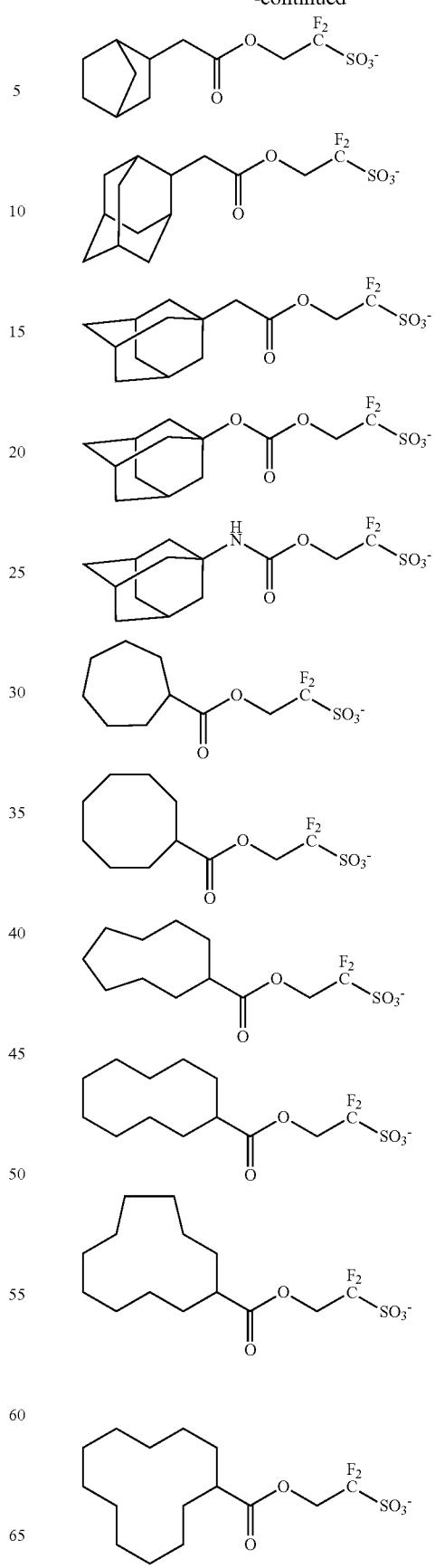

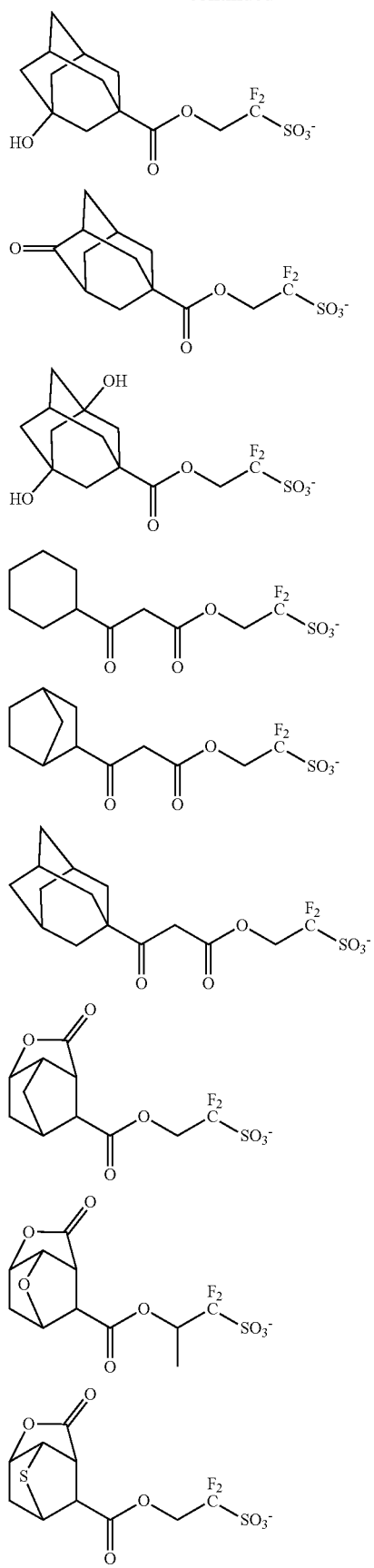
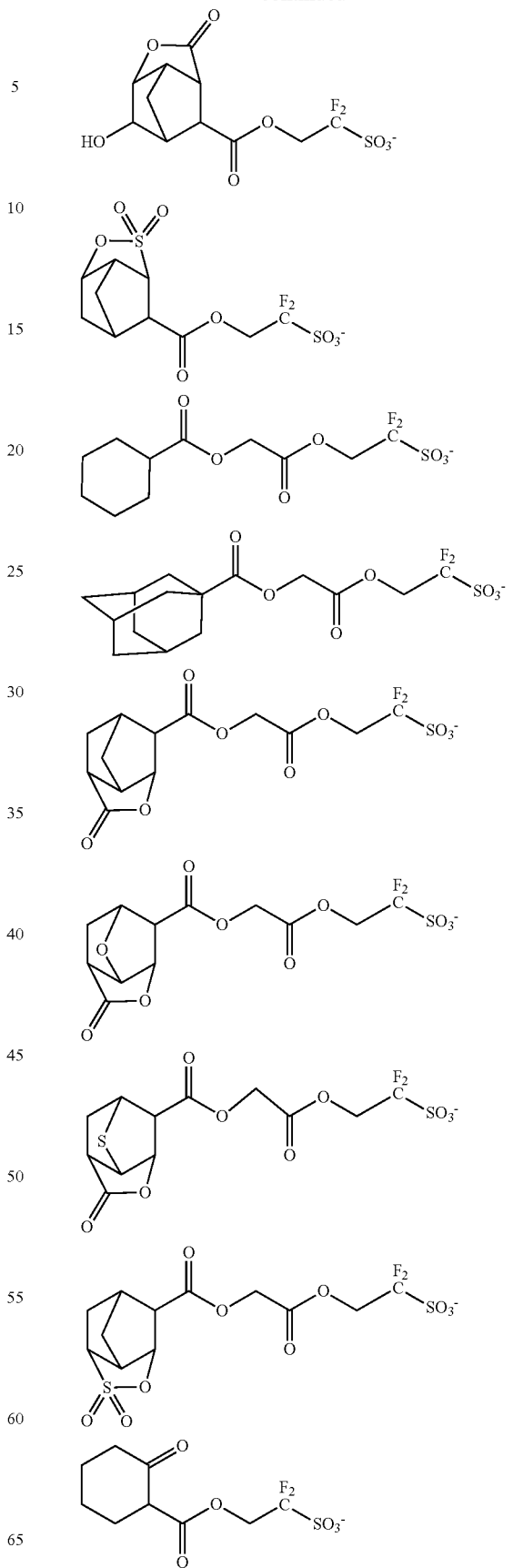

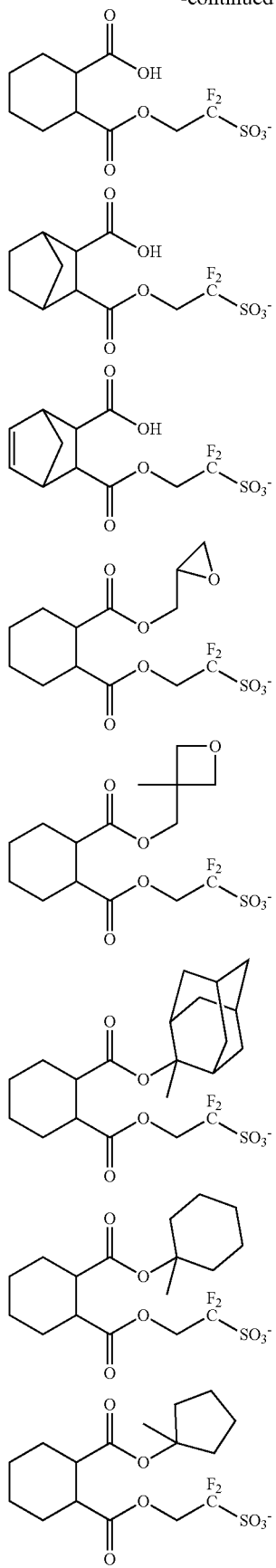
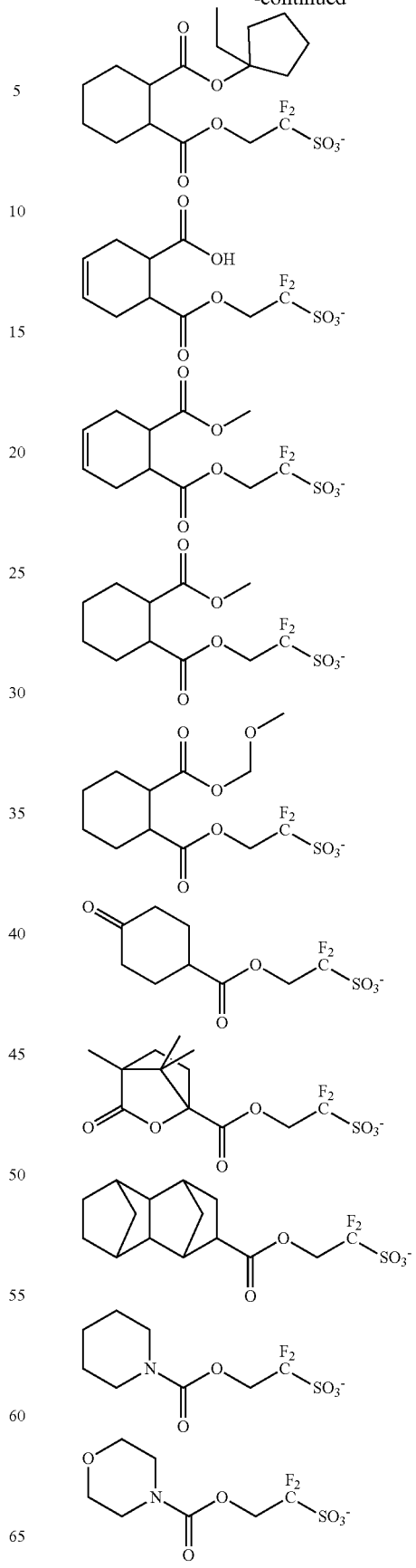

-continued
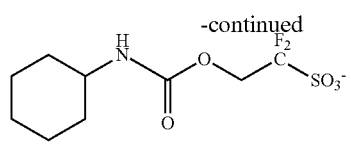
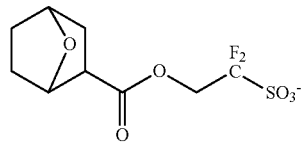
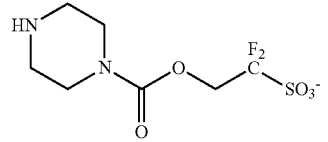
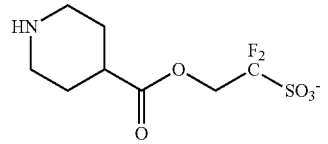
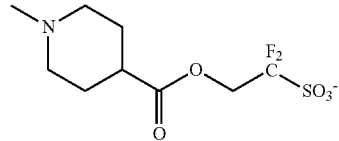
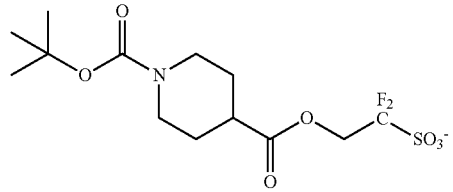
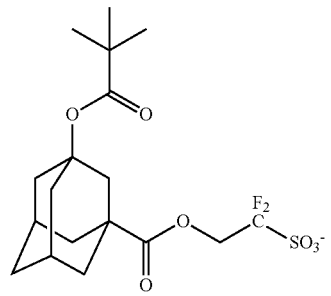
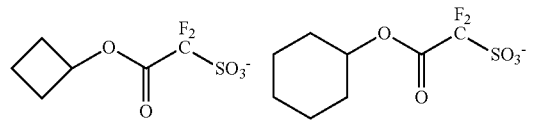
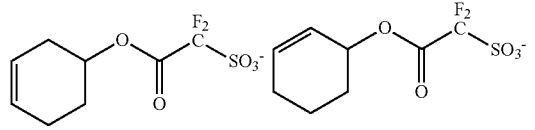
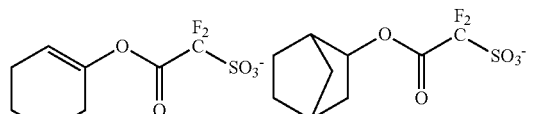
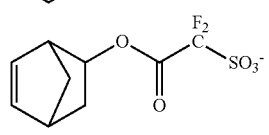
-continued
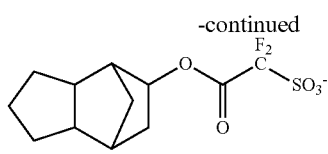
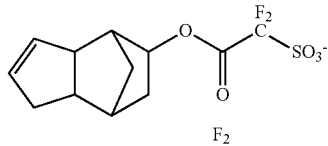
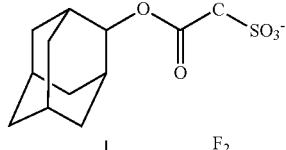
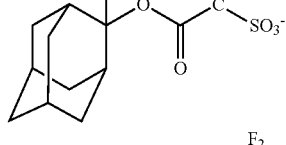
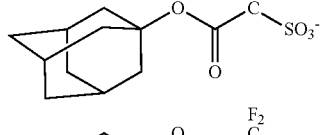
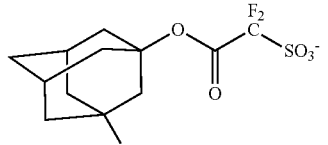
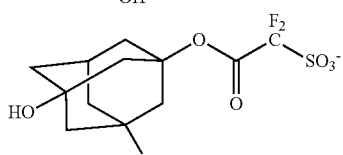
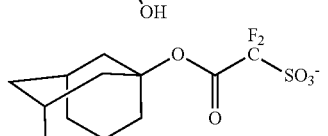
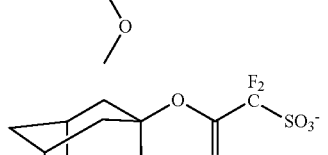
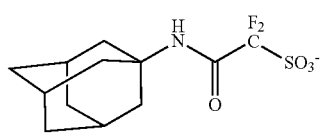

-continued
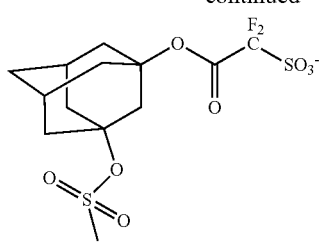
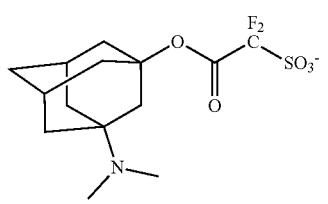
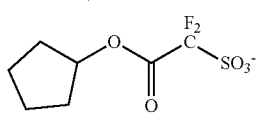
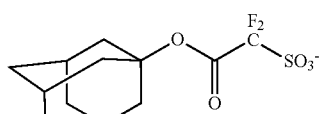
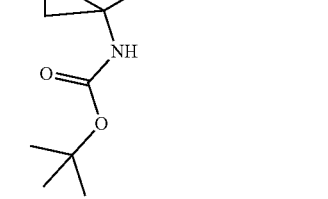
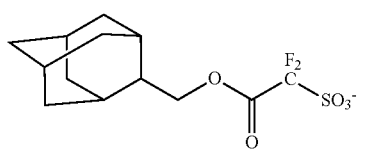
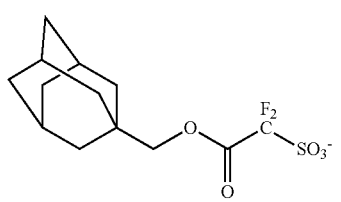
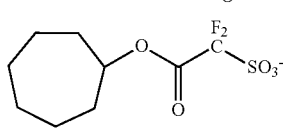
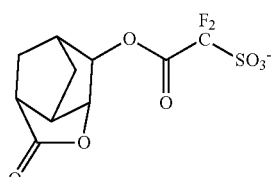
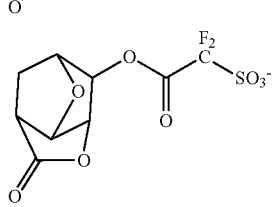
-continued
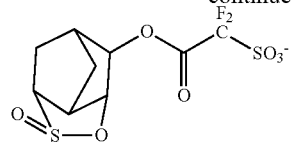
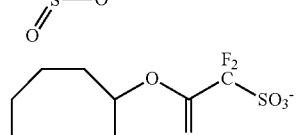
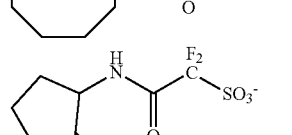
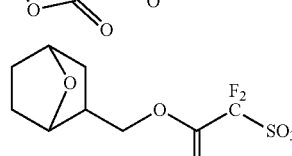
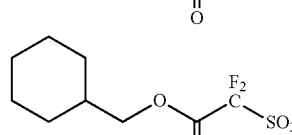
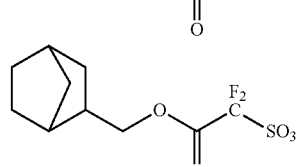
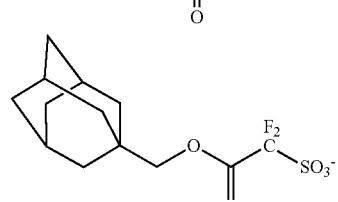
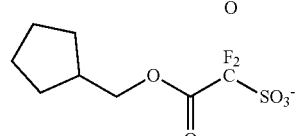
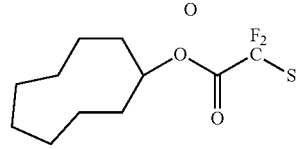
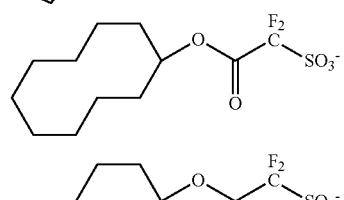
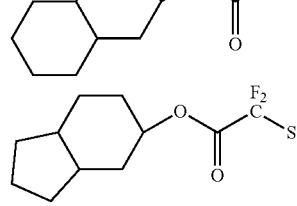

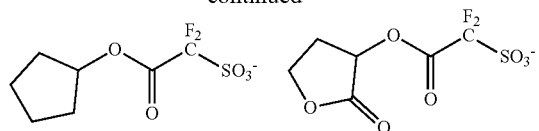
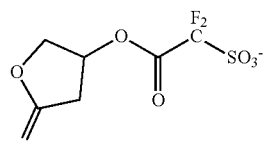
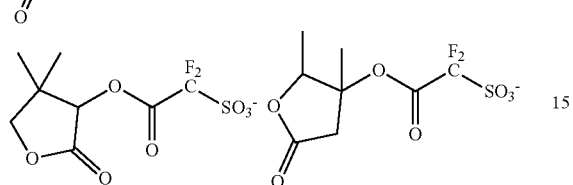
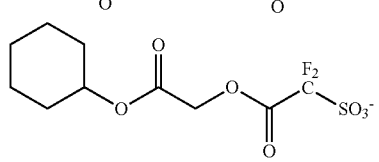
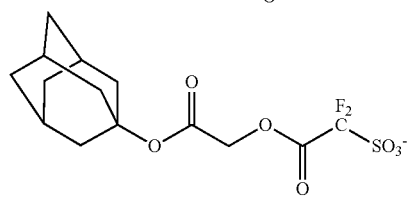
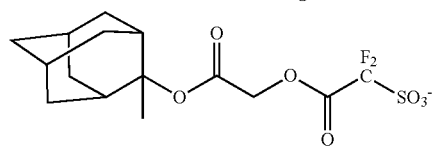
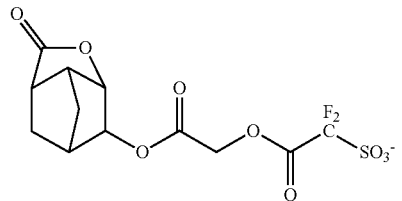
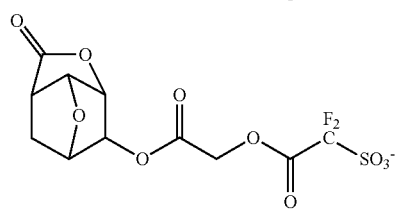
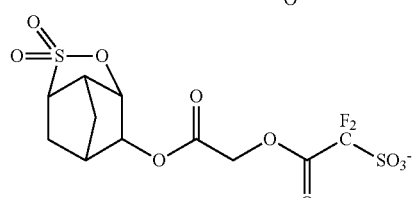
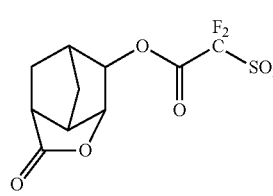
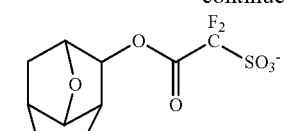
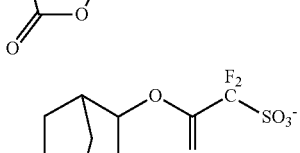
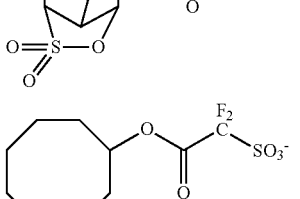
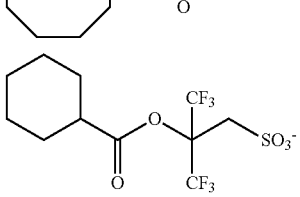
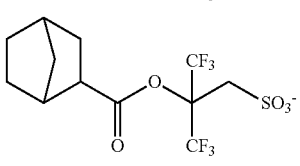
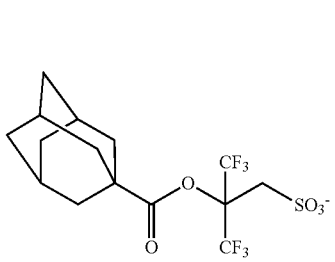
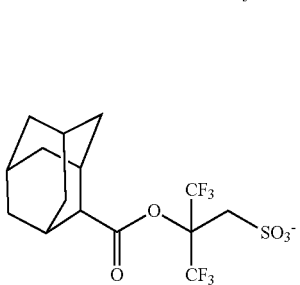
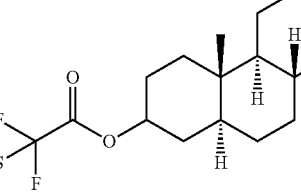

51
-continued
52
-continued
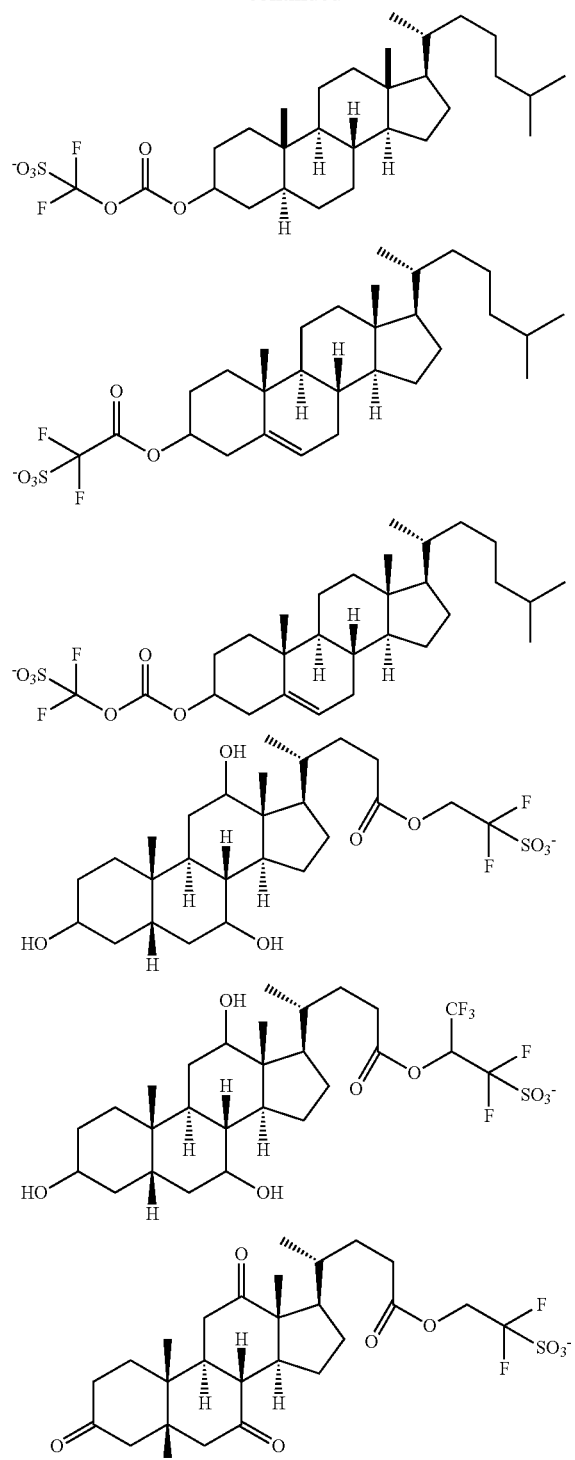
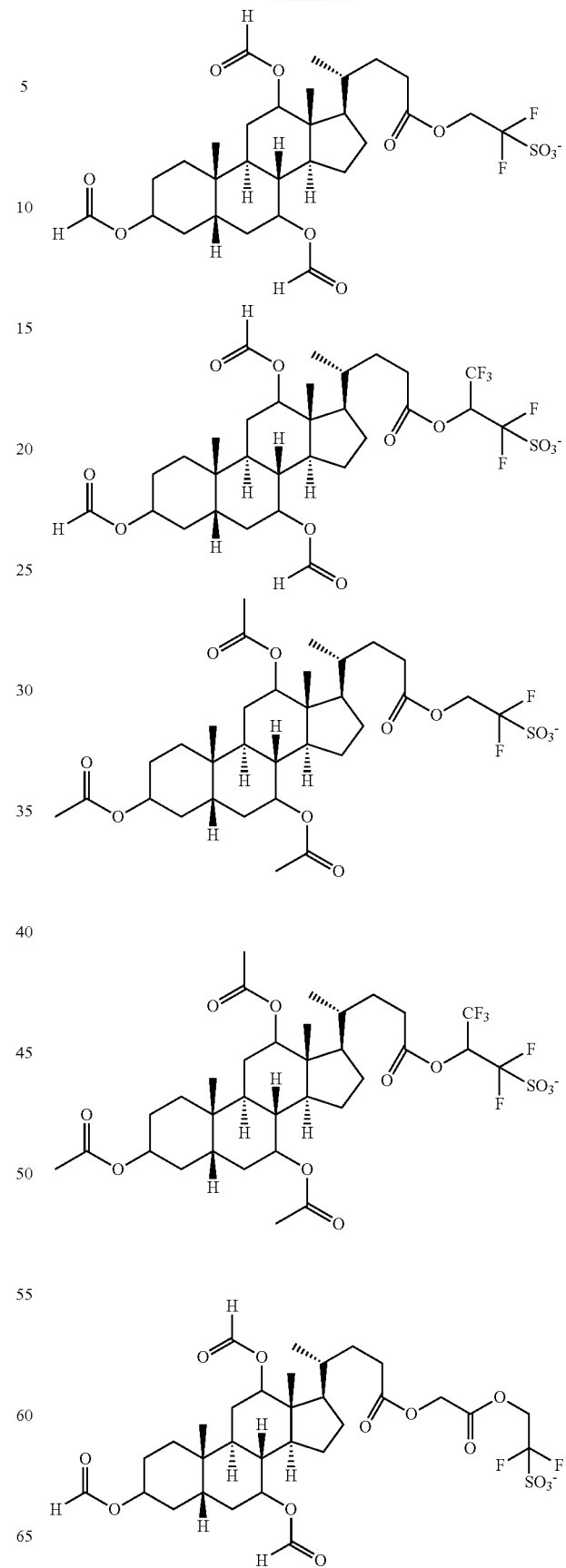

53
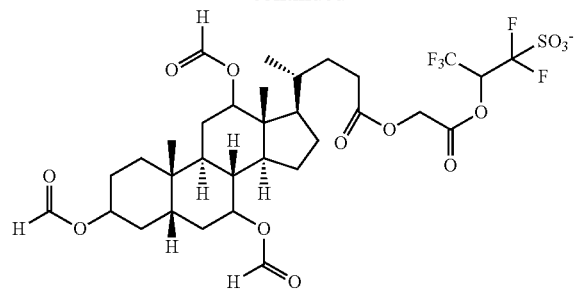
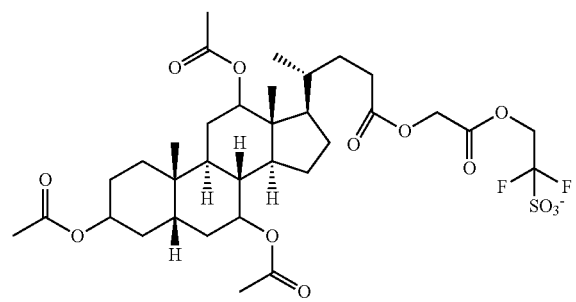
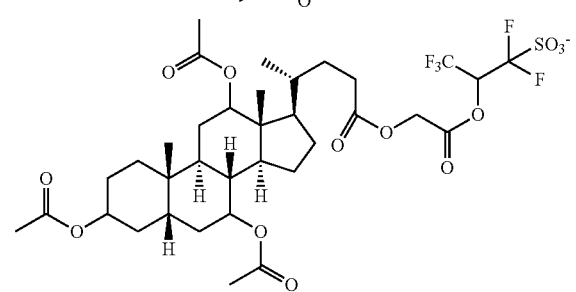
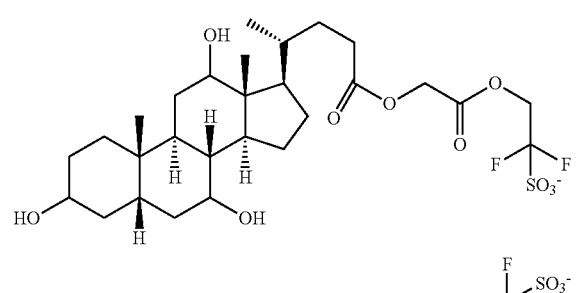
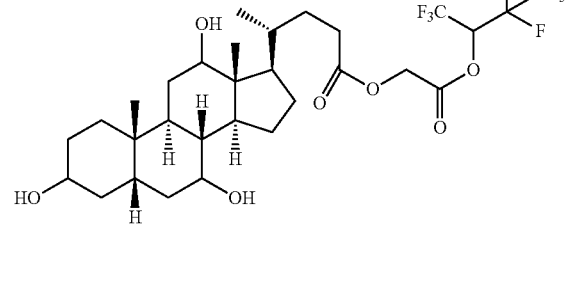
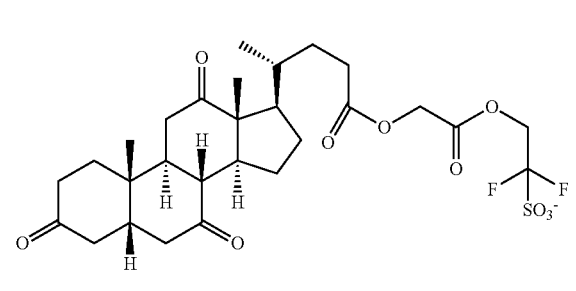
54
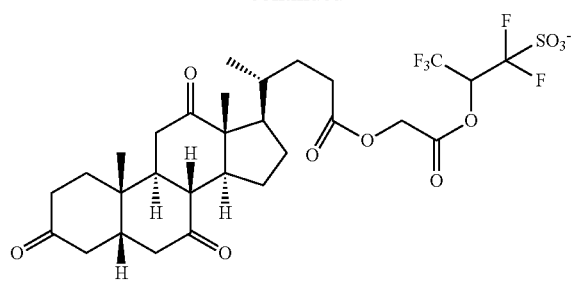
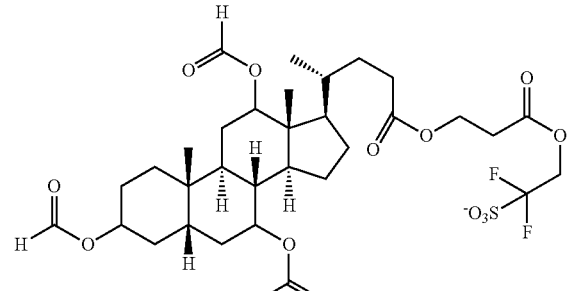
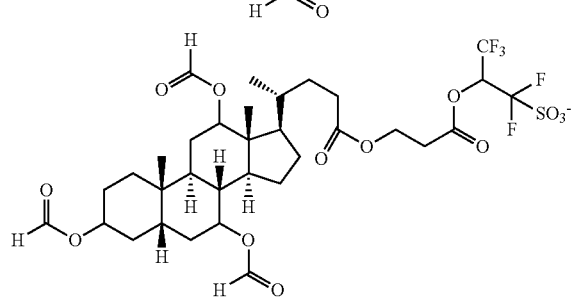
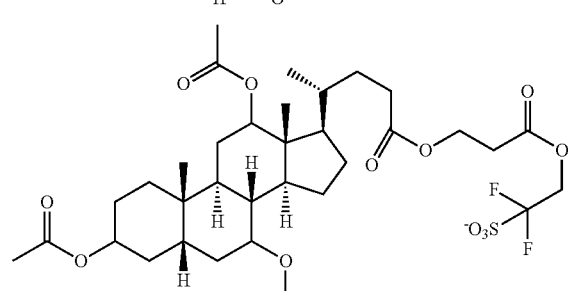
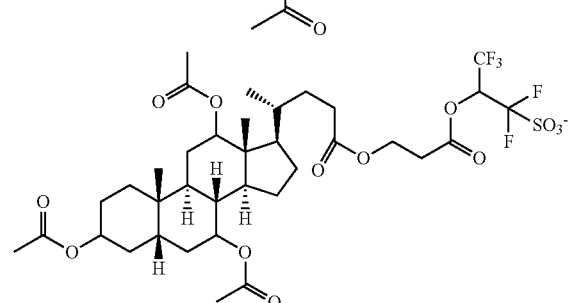
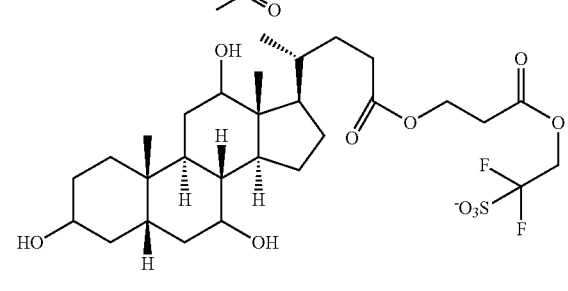

-continued

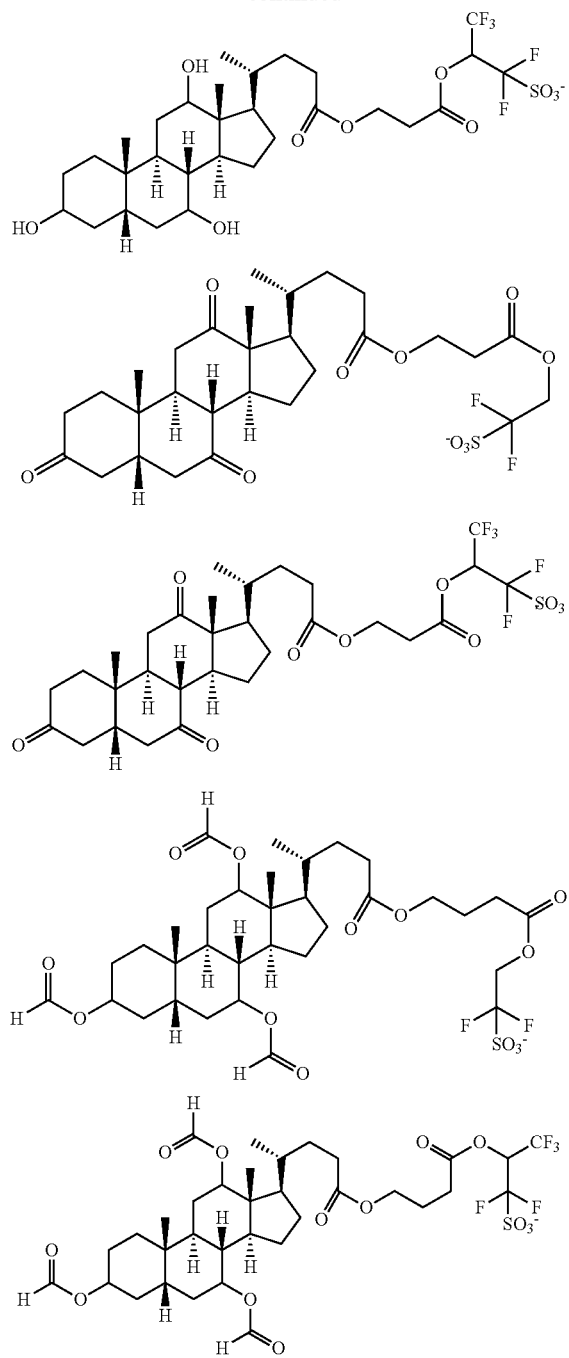

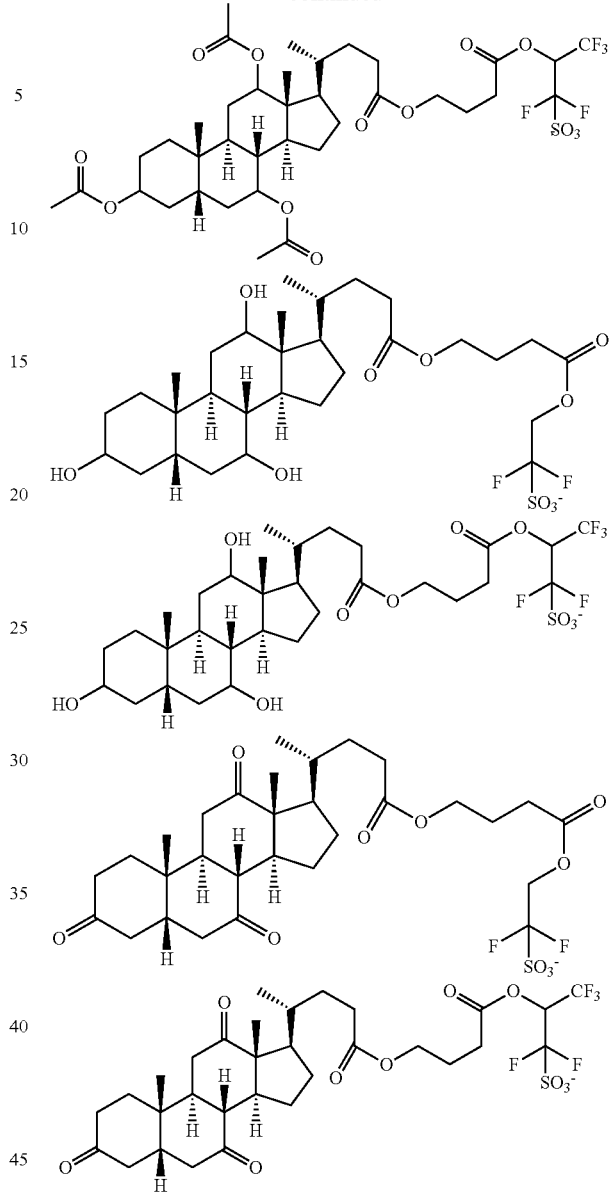

One kind of the photo-acid generator (D) may be used or two or more kinds thereof may be used in combination to make appropriate adjustments to the pattern profile, exposure sensitivity, etc. of the resist upper layer film. When the photo-acid generator (D) is to be contained, the amount to be contained is preferably 0.5 parts by mass to 20 parts by mass, more preferably 1 to 15 parts by mass based on 100 parts by mass of the resin (A). When the contained amount of the photo-acid generator (D) is within such ranges, resolution is favorable, and there is no risk of problems of foreign substances that cause defects occurring after resist development or during removal.

[Other Additives]

The inventive material for forming an adhesive film can further contain one or more out of (E) a surfactant, (F) a crosslinking agent, (G) a plasticizer, and (H) a colorant besides the components (A) to (D). Each component will be described below.

[(E) Surfactant]

In the inventive material for forming an adhesive film, a surfactant (E) can be contained so as to enhance the coating property in spin-coating. As examples of the surfactant, those disclosed in [0142] to [0147] of JP 2009-269953 A can be used. When the surfactant is to be added, the added amount is preferably 0.001 to 20 parts by mass, more preferably 0.01 to 10 parts by mass based on 100 parts by mass of the resin (A).

[(F) Crosslinking Agent]

In addition, in the inventive material for forming an adhesive film, a crosslinking agent (F) can also be contained so as to increase curability and to further suppress intermixing with a resist upper layer film. The crosslinking agent is not particularly limited, and known various types of crosslinking agents can be widely used. Examples thereof include melamine-based crosslinking agents, glycoluril-based crosslinking agents, benzoguanamine-based crosslinking agents, urea-based crosslinking agents, p-hydroxyalkylamide-based crosslinking agents, isocyanurate-based crosslinking agents, aziridine-based crosslinking agents, oxazoline-based crosslinking agents, epoxy-based crosslinking agents, and phenol-based crosslinking agents (polynuclear-phenol-based crosslinking agents).

One kind of the crosslinking agent (F) can be used, or two or more kinds thereof can be used in combination. When the crosslinking agent is to be contained, the contained amount is preferably 5 to 50 parts by mass, more preferably 10 to 40 parts by mass based on 100 parts by mass of the resin (A). When the contained amount is 5 parts by mass or more, sufficient curability can be exhibited, so that intermixing with the resist upper layer film can be suppressed. Meanwhile, when the contained amount is 50 parts by mass or less, there is no risk of adhesiveness degradation due to a decrease in the proportion of the resin (A) in the composition.

Specific examples of the melamine-based crosslinking agents include hexamethoxymethylated melamine, hexabutoxymethylated melamine, alkoxy- and/or hydroxy-substituted derivatives thereof, and partial self-condensates thereof. Specific examples of the glycoluril-based crosslinking agents include tetramethoxymethylated glycoluril, tetrabutoxymethylated glycoluril, alkoxy- and/or hydroxy-substituted derivatives thereof, and partial self-condensates thereof. Specific examples of the benzoguanamine-based crosslinking agents include tetramethoxymethylated benzoguanamine, tetrabutoxymethylated benzoguanamine, alkoxy- and/or hydroxy-substituted derivatives thereof, and partial self-condensates thereof. Specific examples of the urea-based crosslinking agents include dimethoxymethylated dimethoxyethyleneurea, alkoxy- and/or hydroxy-substituted derivatives thereof, and partial self-condensates thereof. A specific example of the β-hydroxyalkylamide-based crosslinking agents includes N,N,N',N'-tetra(2-hydroxyethyl)adipic acid amide. Specific examples of the isocyanurate-based crosslinking agents include triglycidyl isocyanurate and triallyl isocyanurate. Specific examples of the aziridine-based crosslinking agents include 4,4'-bis(ethyleneiminocarbonylamino)diphenylmethane and 2,2-bishydroxymethylbutanol-tris[3-(1-aziridinyl)propionate]. Specific examples of the oxazoline-based crosslinking agents include 2,2'-isopropylidene bis(4-benzyl-2-oxazoline), 2,2'-isopropylidene bis(4-phenyl-2-oxazoline), 2,2'-methylenebis4,5-diphenyl-2-oxazoline, 2,2'-methylenebis-4-phenyl-2-oxazoline, 2,2'-methylenebis-4-tert-butyl-2-oxazoline, 2,2'-bis(2-oxazoline), 1,3-phenylenebis(2-oxazoline), 1,4-phenylenebis(2-oxazoline), and a 2-isopropenyloxazoline copolymer. Specific examples of the epoxy-based crosslinking agents include diglycidyl ether, ethylene glycol diglycidyl ether, 1,4-butanediol diglycidyl ether, 1,4-cyclohexanedimethanol diglycidyl ether, poly(glycidyl methacrylate), trimethylolethane triglycidyl ether, trimethylolpropane triglycidyl ether, and pentaerythritol tetraglycidyl ether.

Specific examples of the polynuclear-phenol-based crosslinking agents include compounds shown by the following general formula (12).

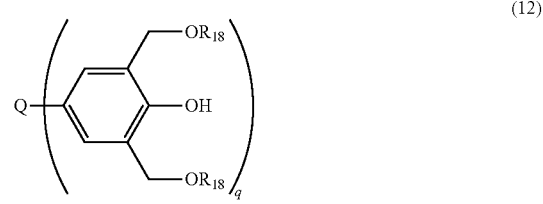

In the formula, Q represents a single bond or a hydrocarbon group with a valency of "q" having 1 to 20 carbon atoms. Ria represents a hydrogen atom or an alkyl group having 1 to 20 carbon atoms. "q" represents an integer of 1 to 5.

Q represents a single bond or a hydrocarbon group with a valency of "q" having 1 to 20 carbon atoms. "q" represents an integer of 1 to 5, more preferably 2 or 3. Specific examples of Q include methane, ethane, propane, butane, isobutane, pentane, cyclopentane, hexane, cyclohexane, methyl pentane, methyl cyclohexane, dimethyl cyclohexane, trimethyl cyclohexane, benzene, toluene, xylene, ethyl benzene, ethyl isopropylbenzene, diisopropylbenzene, methylnaphthalene, ethyl naphthalene, and eicosane. $R_{18}$ represents a hydrogen atom or an alkyl group having 1 to 20 carbon atoms. Specific examples of the alkyl group having 1 to 20 carbon atoms include a methyl group, an ethyl group, a propyl group, an isopropyl group, a butyl group, an isobutyl group, a pentyl group, an isopentyl group, a hexyl group, an octyl group, an ethylhexyl group, a decyl group, and an eicosanyl group. A hydrogen atom or a methyl group is preferable.

Specific examples of the compound shown by the general formula (12) include the following compounds. In particular, in view of enhancing the curability and film thickness uniformity of the adhesive film, hexamethoxymethylated compounds of triphenolmethane, triphenolethane, 1,1,1-tris (4-hydroxyphenyl)ethane, and tris(4-hydroxyphenyl)-1-ethyl-4-isopropylbenzene are preferable.

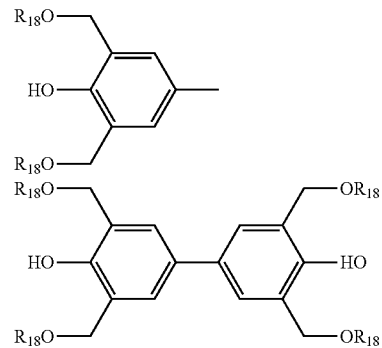

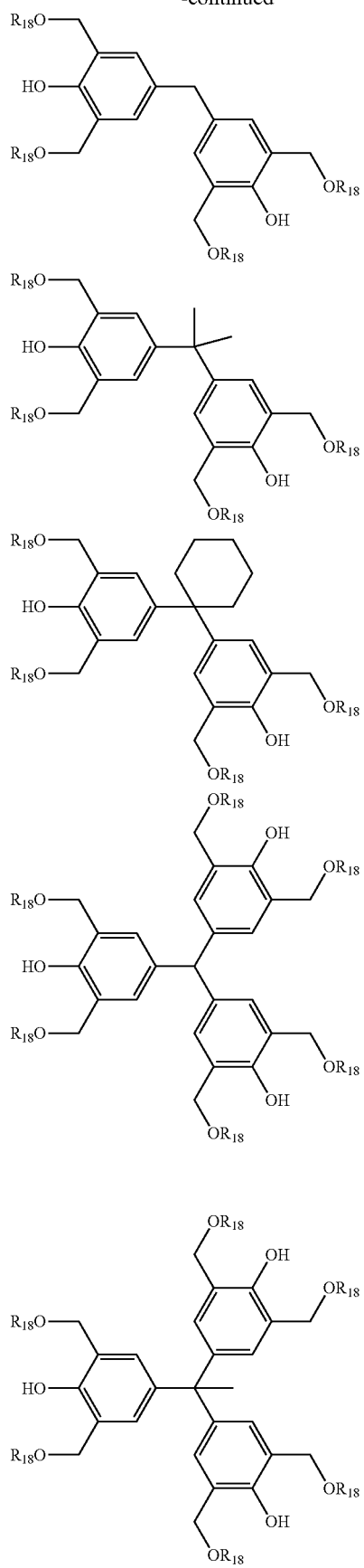
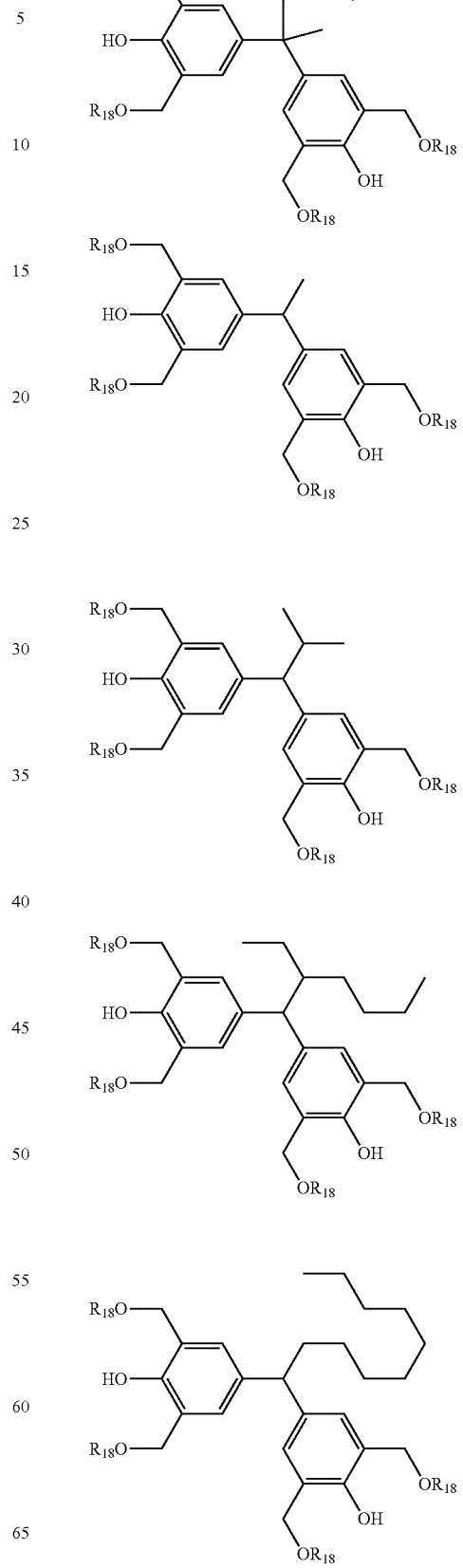

61
-continued
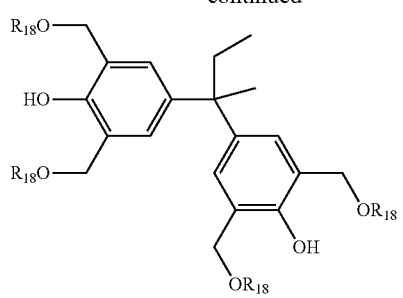
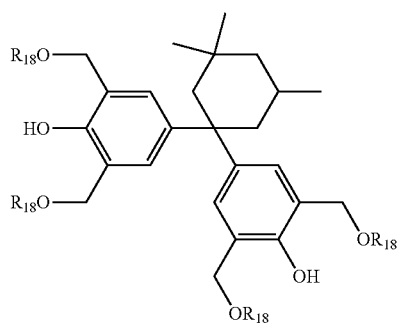
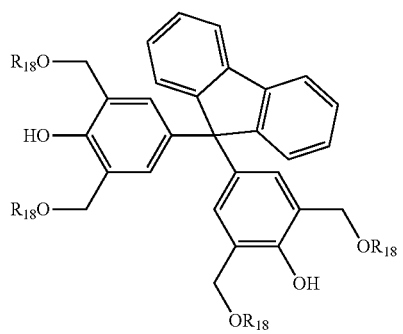
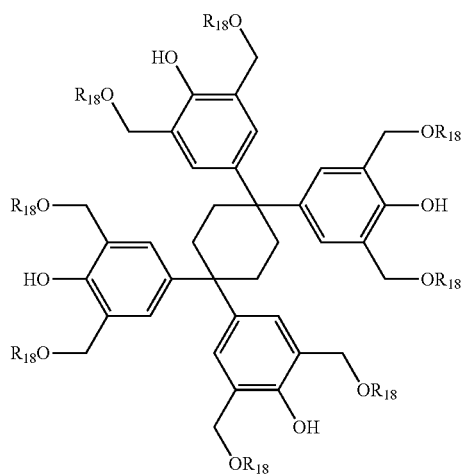
62
-continued
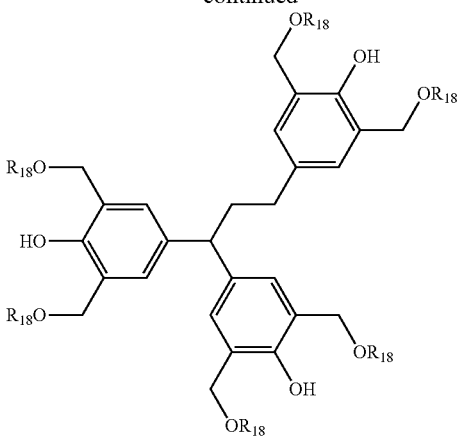
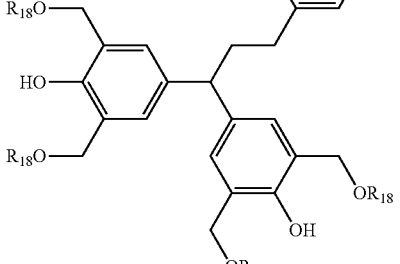
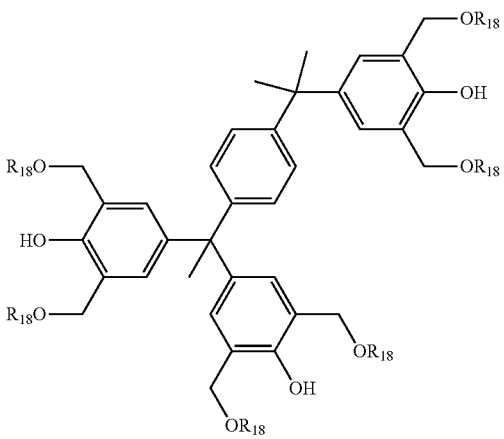
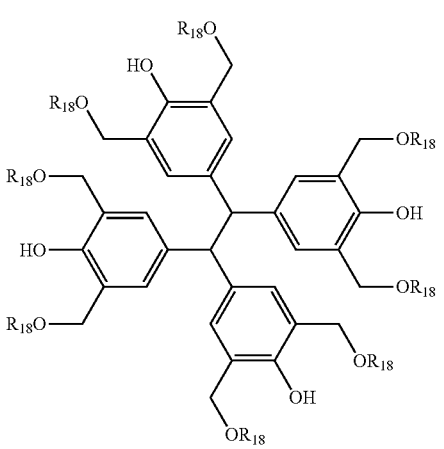

-continued

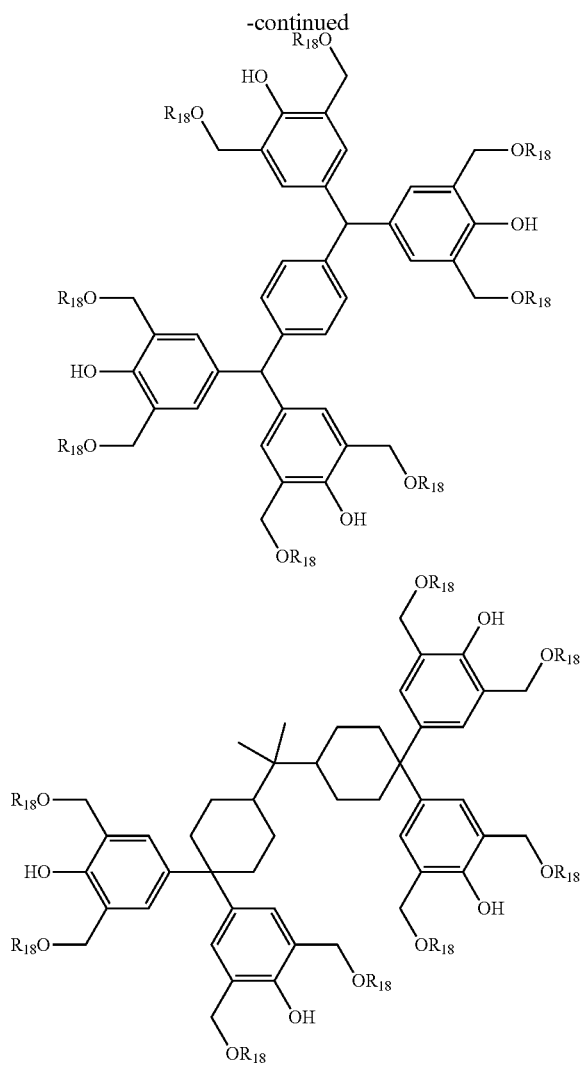

[(G) Plasticizer]

Furthermore, in the inventive material for forming an adhesive film, a plasticizer can be contained. The plasticizer is not particularly limited, and known various types of plasticizers can be widely used. Examples thereof include low-molecular-weight compounds such as phthalic acid esters, adipic acid esters, phosphoric acid esters, trimellitic acid esters, and citric acid esters; and polymers such as polyethers, polyesters, and polyacetal-based polymers disclosed in JP 2013-253227 A. When the plasticizer is contained, the contained amount is preferably 5 to 500 parts by mass, more preferably 10 to 200 parts by mass based on 100 parts by mass of the resin (A).

[(H) Colorant]

Furthermore, in the inventive material for forming an adhesive film, a colorant may be contained so as to enhance the resolution during patterning in multilayer lithography further. The colorant is not particularly limited as long as the colorant is a compound that has an appropriate absorption at the exposure wavelength, and known various compounds can be widely used. Examples thereof include benzenes, naphthalenes, anthracenes, phenanthrenes, pyrenes, isocyanuric acids, and triazines. When the colorant is contained, the contained amount is preferably 0.01 to 10 parts by mass, more preferably 0.1 to 5 parts by mass based on 100 parts by mass of the resin (A).

In addition, the inventive material for forming an adhesive film is extremely useful as an adhesive film material for multilayer resist processes such as a 4-layer resist process using a resist underlayer film and a silicon-containing middle layer film.

The silicon-containing middle layer film can be a silicon-containing resist middle layer film or an inorganic hard mask middle layer film in accordance with the patterning processes described below. The inorganic hard mask middle layer film is preferably selected from a silicon oxide film, a silicon nitride film, and a silicon oxynitride film.

[Method for Forming Adhesive Film]

The present invention provides a method for forming an adhesive film by using the above-described material for forming an adhesive film, the adhesive film having high adhesiveness to a resist upper layer film and having an effect of suppressing fine pattern collapse in a fine patterning process according to a multilayer resist method in a semiconductor device manufacturing process.

In the inventive method for forming an adhesive film, a substrate to be processed is coated with the above-described material for forming an adhesive film by a spin-coating method or the like. After the spin-coating, baking (a heat treatment) is performed in order to evaporate the organic solvent and promote a crosslinking reaction to prevent intermixing with the resist upper layer film or the silicon-containing middle layer film. The baking is preferably performed at 100° C. or higher and 300° C. or lower for 10 to 600 seconds, more preferably at 200° C. or higher and 250° C. or lower for 10 to 300 seconds. Considering the effect on damage to the adhesive film and deformation of the wafer, the upper limit of the heating temperature in the wafer process of the lithography is preferably set to 300° C. or lower, more preferably 250° C. or lower.

Alternatively, in the inventive method for forming an adhesive film, an adhesive film can also be formed by coating a substrate to be processed with the inventive material for forming an adhesive film by a spin-coating method or the like in the same manner as above and curing the material for forming an adhesive film by baking in an atmosphere having an oxygen concentration of 0.1% or more to 21% or less. By baking the inventive material for forming an adhesive film in such an oxygen atmosphere, a sufficiently cured film can be obtained.

The atmosphere during the baking may be in air, or an inert gas such as $N_2$, Ar, and He may also be introduced. In this event, the atmosphere may have an oxygen concentration of less than 0.1%. In addition, the baking temperature and so forth can be as described above. The crosslinking reaction during the adhesive film formation can be promoted without causing degradation of the substrate to be processed even when the substrate to be processed contains a material that is unstable to heating under an oxygen atmosphere.

[Patterning Process]

The present invention provides the following two methods as patterning processes according to 4-layer resist processes using the above-described material for forming an adhesive film.

Firstly, the first method provides a patterning process for forming a pattern in a substrate to be processed, including at least the following steps:
(I-1) forming a resist underlayer film by using an organic film material on the substrate to be processed;
(I-2) forming a silicon-containing middle layer film (silicon-containing resist middle layer film) by using a resist middle layer film material containing a silicon atom on the resist underlayer film;

(I-3) applying the inventive material for forming an adhesive film on the silicon-containing resist middle layer film and then performing a heat treatment to form an adhesive film;

(I-4) forming a resist upper layer film by using a resist upper layer film material (photoresist material) including a photoresist composition on the adhesive film so that a multilayer resist film is constructed;

(I-5) forming a pattern in the resist upper layer film by exposing a pattern circuit region of the resist upper layer film (pattern exposure), then developing with a developer;

(I-6) transferring the pattern to the adhesive film by dry etching the adhesive film while using the resist upper layer film having the formed pattern as an etching mask;

(I-7) transferring the pattern to the silicon-containing resist middle layer film by dry etching the silicon-containing resist middle layer film while using the adhesive film having the formed pattern as an etching mask;

(I-8) transferring the pattern to the resist underlayer film by dry etching the resist underlayer film while using the silicon-containing resist middle layer film having the formed pattern as an etching mask; and (I-9) further transferring the pattern to the substrate to be processed by dry etching the substrate to be processed while using the resist underlayer film having the formed pattern as an etching mask.

As the silicon-containing resist middle layer film in the 4-layer resist process, a polysilsesquioxane-based middle layer film is also favorably used. The silicon-containing resist middle layer film having an antireflective effect can suppress the reflection. Particularly, for 193-nm light exposure, a material containing many aromatic groups and having high substrate etching resistance is used as a resist underlayer film, so that the k-value and thus the substrate reflection are increased. However, the reflection can be suppressed by the silicon-containing resist middle layer film, and so the substrate reflection can be reduced to 0.5% or less. As the silicon-containing resist middle layer film having the antireflective effect, a polysilsesquioxane is preferably used, the polysilsesquioxane having anthracene for 248-nm and 157-nm light exposure, or a phenyl group or a light-absorbing group having a silicon-silicon bond for 193-nm light exposure in a pendant structure, and being crosslinked by an acid or heat.

In this case, forming a silicon-containing resist middle layer film by a spin-coating method is simpler and more advantageous regarding cost than a CVD method.

Alternatively, as the second method, an inorganic hard mask middle layer film may be formed as the silicon-containing middle layer film, and in this case, a method for forming a pattern in a substrate to be processed can include at least the following steps:

(II-1) forming a resist underlayer film by using an organic film material on the substrate to be processed;

(II-2) forming an inorganic hard mask middle layer film selected from a silicon oxide film, a silicon nitride film, and a silicon oxynitride film on the resist underlayer film;

(II-3) applying the inventive material for forming an adhesive film on the inorganic hard mask middle layer film and then performing a heat treatment to form an adhesive film;

(II-4) forming a resist upper layer film by using a resist upper layer film material (photoresist material) including a photoresist composition on the adhesive film;

(II-5) forming a pattern in the resist upper layer film by exposing a pattern circuit region of the resist upper layer film (pattern exposure), and then developing with a developer;

(II-6) transferring the pattern to the adhesive film by dry etching the adhesive film while using the resist upper layer film having the formed pattern as an etching mask;

(II-7) transferring the pattern to the inorganic hard mask middle layer film by dry etching the inorganic hard mask middle layer film while using the adhesive film having the formed pattern as an etching mask;

(II-8) transferring the pattern to the resist underlayer film by dry etching the resist underlayer film while using the inorganic hard mask middle layer film having the formed pattern as an etching mask; and (II-9) further transferring the pattern to the substrate to be processed by dry etching the substrate to be processed while using the resist underlayer film having the formed pattern as an etching mask.

The resist underlayer film is not particularly limited, and any known resist underlayer films can be used. For example, a resist underlayer film material is applied onto a substrate to be processed by a spin-coating method or the like. After spin-coating, the solvent is evaporated, and in order to prevent mixing with the silicon-containing middle layer film, baking is performed to promote a crosslinking reaction. The baking is performed at a temperature of 100° C. or higher to 600° C. or lower for 10 seconds to 600 seconds, preferably 10 to 300 seconds. When the baking temperature is 100° C. or higher, the curing progresses sufficiently, so that mixing with the upper layer film or the middle layer film does not occur. When the baking temperature is 600° C. or lower, thermal decomposition of the base resin can be suppressed, and the film thickness does not decrease, so that the film surface becomes uniform. In addition, the thickness of the resist underlayer film is appropriately selected, but is preferably 2 to 20,000 nm, particularly preferably 50 to 15,000 nm.

In the case where an inorganic hard mask middle layer film is formed on the resist underlayer film as described above, a silicon oxide film, a silicon nitride film, and a silicon oxynitride film (SiON film) can be formed by a CVD method, an ALD method, or the like. The method for forming the silicon nitride film is disclosed in, for example, JP 2002-334869 A and WO 2004/066377 A1. The film thickness of the inorganic hard mask middle layer film is preferably 5 to 200 nm, more preferably 10 to 100 nm. As the inorganic hard mask middle layer film, a SiON film is most preferably used, being effective as an antireflective coating. When the SiON film is formed, the substrate temperature reaches 300 to 500° C. Hence, the resist underlayer film needs to withstand the temperature of 300 to 500° C.

The resist upper layer film in the 4-layer resist process may be a positive type or a negative type, and any generally-used photoresist composition can be employed. After spin-coating of the photoresist composition, pre-baking is preferably performed at 60 to 180° C. for 10 to 300 seconds. Then, light exposure, post-exposure baking (PEB), and development are performed according to conventional methods to obtain the resist upper layer film pattern. Note that the thickness of the resist upper layer film is not particularly limited, but is preferably 30 to 500 nm, and 50 to 400 nm is particularly preferable.

A circuit pattern (resist upper layer film pattern) is formed in the resist upper layer film. In the circuit pattern formation, the circuit pattern is preferably formed by a lithography using light having a wavelength of 10 nm or more to 300 nm or less, a direct drawing by electron beam, a nanoimprinting, or a combination thereof.

Note that examples of exposure light include a high-energy beam with a wavelength of 300 nm or less, specifically, deep ultraviolet ray, KrF excimer laser beam (248 nm), ArF excimer laser beam (193 nm), $F_2$ laser beam (157 nm), $Kr_2$ laser beam (146 nm), Ara laser beam (126 nm), soft X-ray of 3 to 20 nm (EUV), electron beam (EB), ion beam, X-ray, and the like. It is particularly preferable to use ArF excimer laser beam (193 nm), soft X-ray of 3 to 20 nm (EUV), and electron beam (EB), which are exposure lights for forming ultrafine patterns.

Additionally, in the development method in forming the circuit pattern, the circuit pattern is preferably developed by alkaline development or development with an organic solvent.

Next, etching is performed while using the obtained resist upper layer film pattern as a mask. The etching of the adhesive film in the 4-layer resist process is performed by using an oxygen-based gas while using the resist upper layer film pattern as a mask. Thereby, the adhesive film pattern is formed.

Subsequently, etching is performed while using the obtained adhesive film pattern as a mask. The etching of the silicon-containing resist middle layer film and the inorganic hard mask middle layer film is performed by using a fluorocarbon-based gas while using the adhesive film pattern as a mask. Thereby, the silicon-containing resist middle layer film pattern and the inorganic hard mask middle layer film pattern are formed.

The etching of the adhesive film may be performed continuously before the etching of the silicon-containing middle layer film. Alternatively, after the adhesive film is etched alone, the etching apparatus is changed, for example, and then the etching of the silicon-containing middle layer film may be performed.

Next, the resist underlayer film is etched while using the obtained silicon-containing resist middle layer film pattern and inorganic hard mask middle layer film pattern as masks.

Subsequently, the substrate to be processed can be etched according to a conventional method. For example, the substrate to be processed made of $SiO_2$, SiN, or silica-based low-dielectric insulating film is etched mainly with a fluorocarbon-based gas; and p-Si, Al, or W is etched mainly with a chlorine- or bromine-based gas. When the substrate is processed by etching with a fluorocarbon-based gas, the silicon-containing middle layer film pattern in the 4-layer resist process is removed when the substrate is processed. When the substrate is etched with a chlorine- or bromine-based gas, the silicon-containing middle layer film pattern needs to be removed by additional dry etching with a fluorocarbon-based gas after the substrate processing.

Note that the substrate to be processed is not particularly limited, and it is possible to use a semiconductor device substrate or the semiconductor device substrate coated with any of a metal film, a metal carbide film, a metal oxide film, a metal nitride film, a metal oxycarbide film, or a metal oxynitride film. As the metal, it is possible to use silicon, titanium, tungsten, hafnium, zirconium, chromium, germanium, copper, silver, gold, aluminum, indium, gallium, arsenic, palladium, iron, tantalum, iridium, cobalt, manganese, molybdenum, or an alloy thereof.

Specific examples include: substrates made of Si, α-Si, p-Si, $SiO_2$, SiN, SiON, W, TiN, Al, or the like; the substrate coated with a layer to be processed; etc. Examples of the layer to be processed include: various Low-k films made of Si, $SiO_2$, SiON, SiN, p-Si, α-Si, W, W—Si, Al, Cu, Al—Si, or the like; and stopper films thereof. Generally, the layer can be formed to have a thickness of 50 to 10,000 nm, in particular, 100 to 5,000 nm. Note that when the layer to be processed is formed, the substrate and the layer to be processed are formed from different materials.

Hereinbelow, an example of the 4-layer resist process will be specifically described with reference to FIG. 1. As shown in FIG. 1 (A), in the 4-layer resist process, a resist underlayer film 3 is formed by using an organic film material on a layer 2 to be processed that has been stacked on a substrate 1. Then, a silicon-containing middle layer film 4 is formed, an adhesive film 5 is formed by using the inventive material for forming an adhesive film thereon, and a resist upper layer film 6 is formed thereon.

Next, as shown in FIG. 1 (B), an exposed part (predetermined portion) 7 of the resist upper layer film is exposed to light, followed by PEB and development to form a resist upper layer film pattern 6a (FIG. 1 (C)). While using the obtained resist upper layer film pattern 6a as a mask, the adhesive film 5 is etched by using an $O_2$-based gas. Thereby, an adhesive film pattern 5a is formed (FIG. 1 (D)). While using the obtained adhesive film pattern 5a as a mask, the silicon-containing middle layer film 4 is etched by using a CF-based gas. Thereby, a silicon-containing middle layer film pattern 4a is formed (FIG. 1 (E)). After the adhesive film pattern 5a is removed, the resist underlayer film 3 is etched with an $O_2$-based gas while using the obtained silicon-containing middle layer film pattern 4a as a mask. Thereby, a resist underlayer film pattern 3a is formed (FIG. 1 (F)). Furthermore, after the silicon-containing middle layer film pattern 4a is removed, the layer 2 to be processed is etched while using the resist underlayer film pattern 3a as a mask. Thus, a pattern 2a is formed (FIG. 1 (G)).

As described above, the inventive patterning processes make it possible to form a fine pattern with high precision in a substrate to be processed in the multilayer resist processes.

EXAMPLE

Hereinafter, the present invention will be described further specifically with reference to Synthesis Examples, Examples, and Comparative Examples. However, the present invention is not limited thereto. Note that, specifically, the molecular weight was measured by the following method. Weight-average molecular weight (Mw) and number-average molecular weight (Mn) were measured by gel permeation chromatography (GPC) using tetrahydrofuran as an eluent (solvent) in terms of polystyrene, and dispersity (Mw/Mn) was calculated therefrom.

Polymers (A1) to (A8) and comparative polymers (R1) to (R9) to be used as a resin (A) for materials for forming an adhesive film were synthesized using the monomers (B1) to (B12) shown below.

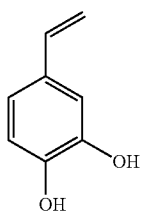 (B1)
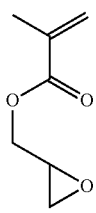 (B6)
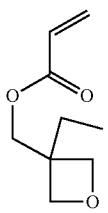 (B7)
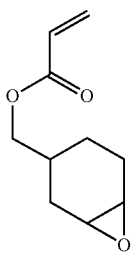 (B8)
(B2)
(B3)
(B4) 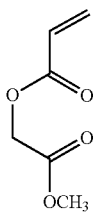 (B9)
(B10)
(B5) 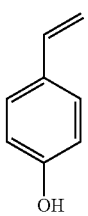
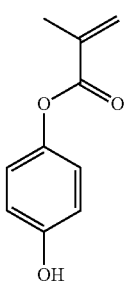 (B11)

(B12)

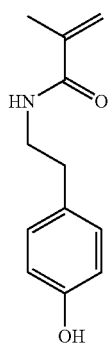

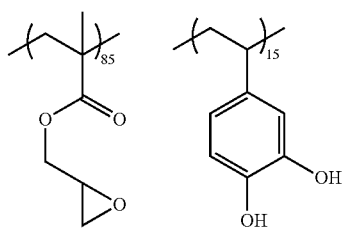

(A1)

Mw = 14300
Mw/Mn = 1.95

[Synthesis Example 1] Synthesis of Polymer (A1)

37.5 g of propylene glycol monomethyl ether acetate (PGMEA) was heated and stirred under a nitrogen atmosphere at 80° C. A mixture of 7.22 g of (B1), 42.78 g of (B6), and 82.5 g of PGMEA and a mixture of 4.07 g of dimethyl 2,2-azobis(2-methylpropionate) and 30.0 g of PGMEA were added thereto over 2 hours simultaneously and separately. After further heating and stirring for 24 hours, the mixture was cooled to room temperature to obtain a solution of the target polymer (A1) in PGMEA. As a result of analysis, the polymer (A1) had a weight-average molecular weight (Mw) of 14,300 and a dispersity (Mw/Mn) of 1.95.

(A1)

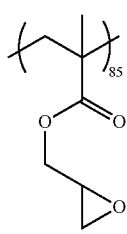 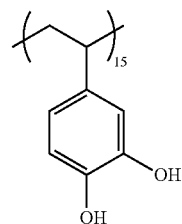

[Synthesis Examples 2 to 17] Synthesis of Polymers (A2) to (A8) and Comparative Polymers (R1) to (R9)

Except that the type and mole ratio of the used raw material monomers were altered according to the structure of each polymer, the polymers (A2) to (A8) and comparative polymers (R1) to (R9) shown below were obtained as products by methods based on Synthesis Example 1. In addition, the weight-average molecular weight (Mw) and dispersity (Mw/Mn) determined by GPC are shown.

(A2)

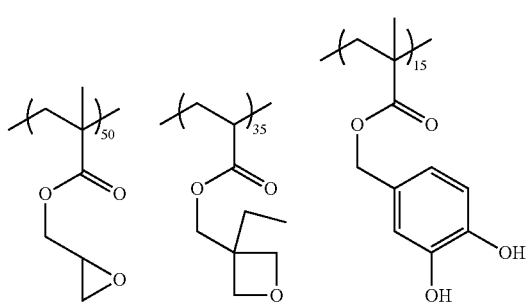

Mw = 17800
Mw/Mn = 2.12

(A3)

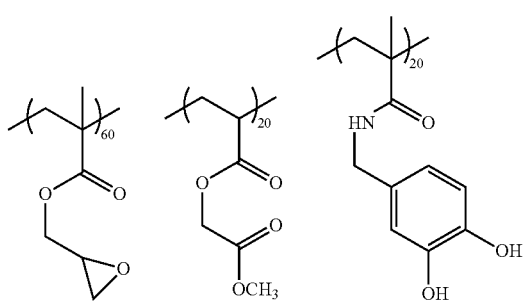

Mw = 11200
Mw/Mn = 2.07

(A4)

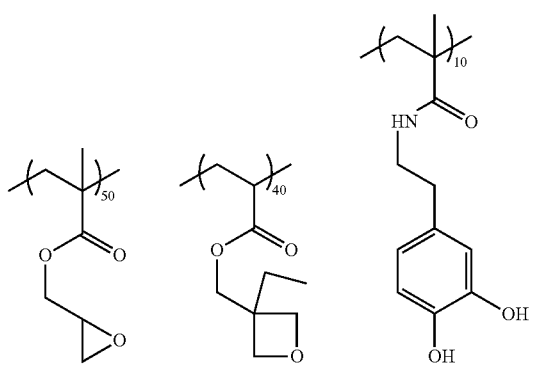

Mw = 13400
Mw/Mn = 1.65

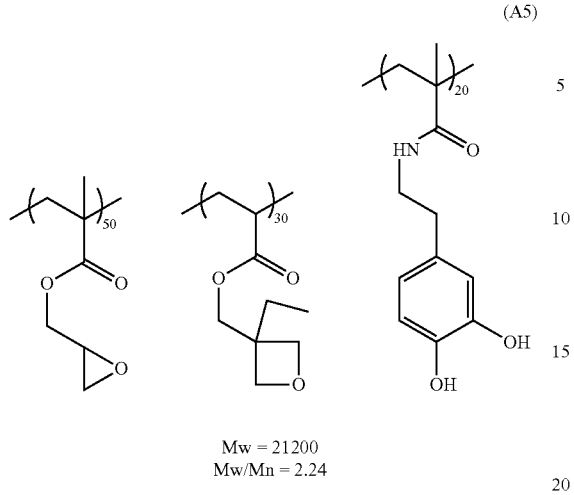
(A5)
Mw = 21200
Mw/Mn = 2.24
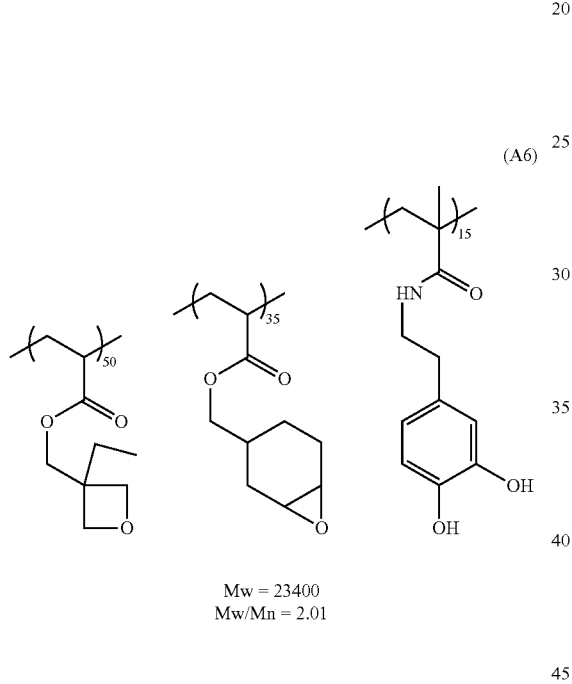
(A6)
Mw = 23400
Mw/Mn = 2.01
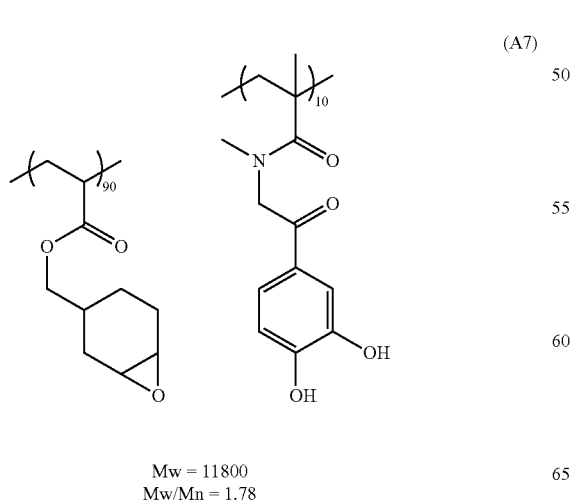
(A7)
Mw = 11800
Mw/Mn = 1.78
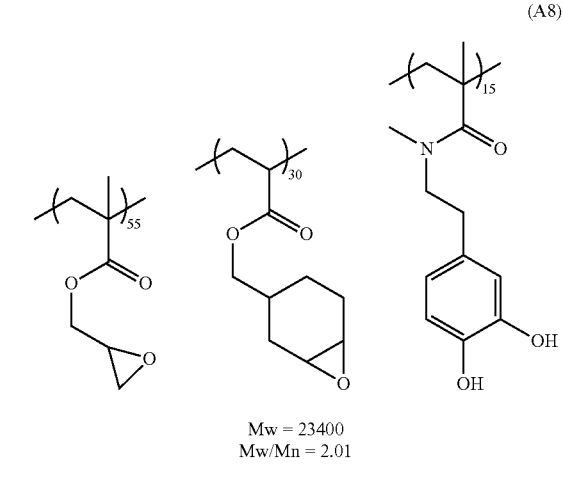
(A8)
Mw = 23400
Mw/Mn = 2.01
(R1)
Mw = 13700
Mw/Mn = 1.88
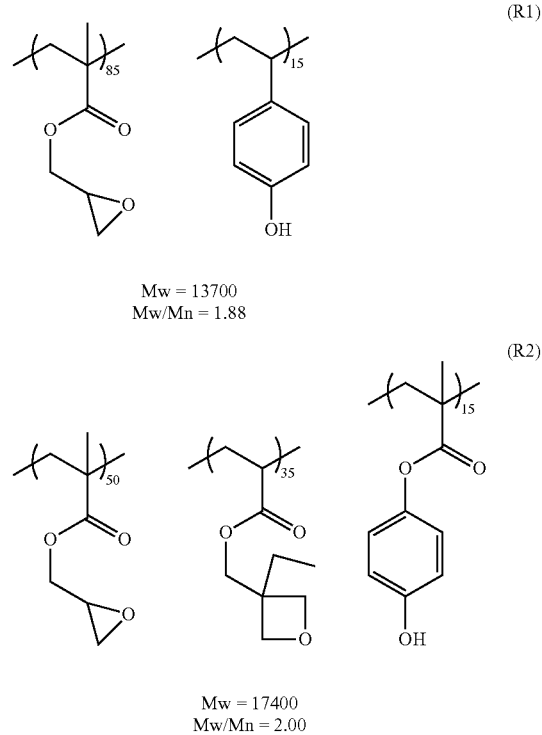
(R2)
Mw = 17400
Mw/Mn = 2.00
(R3)
Mw = 12900
Mw/Mn = 1.59

(R4)

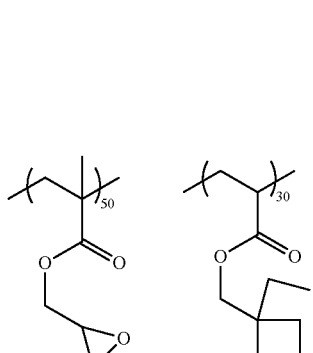

Mw = 20300
Mw/Mn = 2.11

(R7)

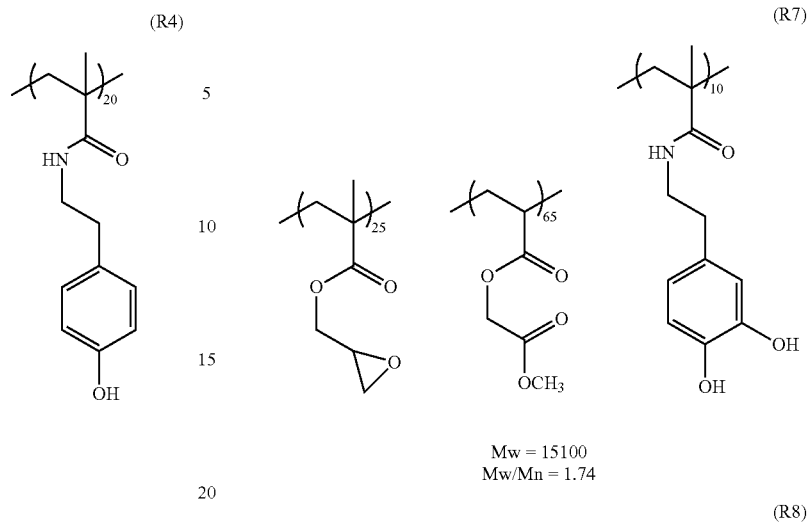

Mw = 15100
Mw/Mn = 1.74

(R6)

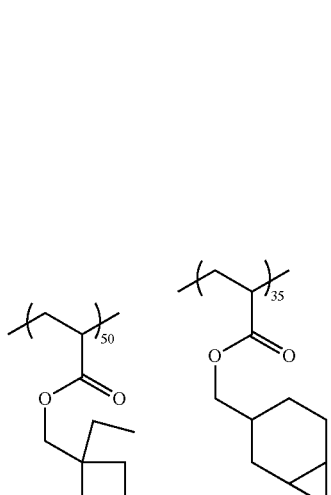

Mw = 20500
Mw/Mn = 1.95

(R8)

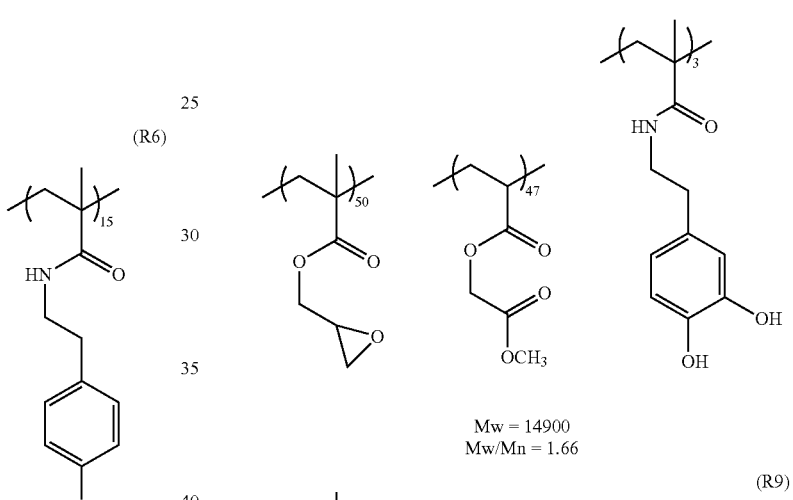

Mw = 14900
Mw/Mn = 1.66

(R9)

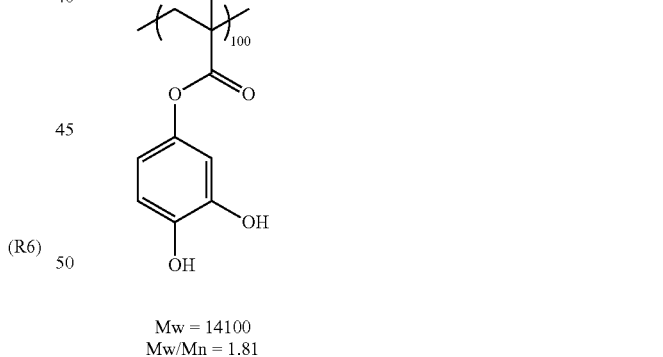

Mw = 14100
Mw/Mn = 1.81

(R6)

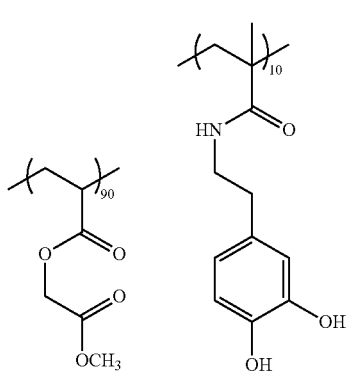

Mw = 15400
Mw/Mn = 1.71

Preparation of Materials (AL-1 to -14, Comparative AL-1 to -9) for Forming Adhesive Film For the preparation of materials for forming an adhesive film and comparative materials, the following were used: the polymers (A1) to (A8) and the comparative polymers (R1) to (R9); (T1) to (T3) as thermal acid generators; (P1) to (P3) as photo-acid generators; and (X1) as a crosslinking agent. Using propylene glycol monomethyl ether acetate (PG-MEA) containing 0.1 mass % of PF636 (manufactured by OMNOVA), the compounds were dissolved in proportions shown in Table 1. The solution was then filtered through a 0.1-μm filter made of fluorinated resin to prepare materials (AL-1 to -14, comparative AL-1 to -9) for forming an adhesive film.
(Thermal Acid Generator)
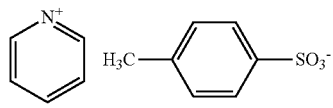
(T1)
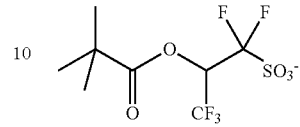
(T2)
(T3)
(Photo-Acid Generator) (P1)
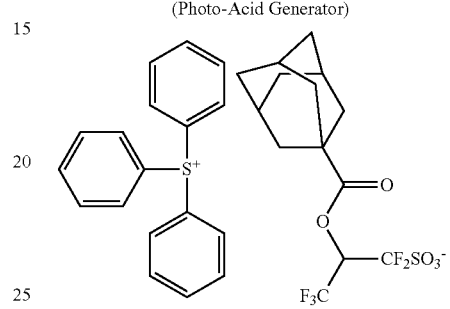
(P2)
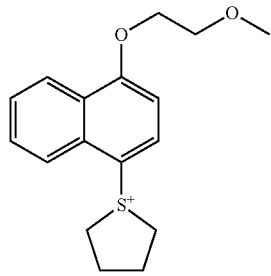 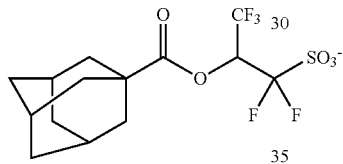
(P3)
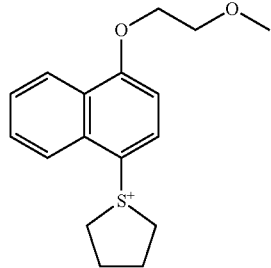 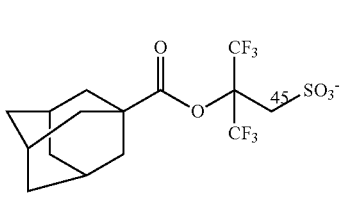
(Crosslinking Agent) (X1)
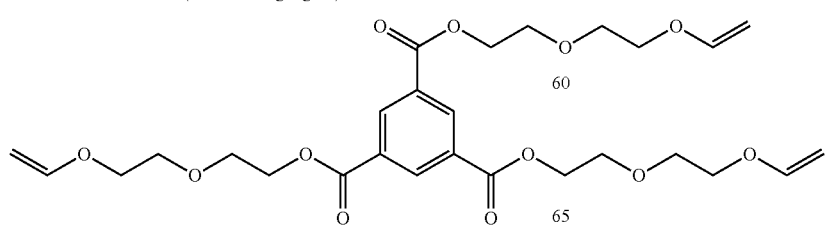

TABLE 1

| Material for forming adhesive film | Polymer (parts by mass) | Thermal acid generator (parts by mass) | Photo-acid generator (parts by mass) | Crosslinking agent (parts by mass) | PGMEA (parts by mass) |
|---|---|---|---|---|---|
| AL-1 | A1 (10) | T1 (1) | — | — | 2500 |
| AL-2 | A2 (10) | T2 (1) | — | — | 2500 |
| AL-3 | A3 (10) | T2 (1) | — | — | 2500 |
| AL-4 | A4 (10) | T1 (1) | — | — | 2500 |
| AL-5 | A5 (10) | T2 (1) | — | — | 2500 |
| AL-6 | A6 (10) | T1 (1) | — | — | 2500 |
| AL-7 | A7 (10) | T2 (1) | — | — | 2500 |
| AL-8 | A8 (10) | T1 (1) | — | — | 2500 |
| AL-9 | A1 (10) | T1 (1) | P1 (2) | — | 2500 |
| AL-10 | A2 (10) | T1 (1) | P1 (2) | — | 2500 |
| AL-11 | A4 (10) | T1 (1) | P3 (3) | — | 2500 |
| AL-12 | A6 (10) | T1 (1) | P2 (3) | — | 2500 |
| AL-13 | A7 (10) | T1 (1) | P1 (2) | — | 2500 |
| AL-14 | A8 (10) | T1 (1) | P2 (2) | — | 2500 |
| Comparative AL-1 | R1 (10) | T1 (1) | — | — | 2500 |
| Comparative AL-2 | R2 (10) | T2 (1) | — | — | 2500 |
| Comparative AL-3 | R3 (10) | T1 (1) | — | — | 2500 |
| Comparative AL-4 | R4 (10) | T2 (1) | — | — | 2500 |
| Comparative AL-5 | R5 (10) | T1 (1) | — | — | 2500 |
| Comparative AL-6 | R6 (10) | T2 (1) | — | — | 2500 |
| Comparative AL-7 | R7 (10) | T2 (1) | — | — | 2500 |
| Comparative AL-8 | R8 (10) | T2 (1) | — | — | 2500 |
| Comparative AL-9 | R9 (10) | T3 (1) | P1 (2) | X1 (5) | 2500 |

Example 1: Solvent Resistance Evaluation (Examples 1-1 to 1-14, Comparative Examples 1-1 to 1-9)

The materials (AL-1 to -14, comparative AL-1 to -9) for forming an adhesive film prepared above were respectively applied onto a silicon substrate and baked at 220° C. for 60 seconds. Then, the film thickness was measured. A PGMEA solvent was dispensed thereon, left to stand for 30 seconds, spin-dried, and baked at 100° C. for 60 seconds to evaporate the PGMEA solvent. The film thickness was then remeasured. Solvent resistance was evaluated by determining the difference between the film thicknesses of before and after the PGMEA treatment. Table 2 shows the results.

TABLE 2

| | Material for forming adhesive film | Film thickness after film formation: a (Å) | Film thickness after PGMEA treatment: b (Å) | b/a × 100 (%) |
|---|---|---|---|---|
| Example 1-1 | AL-1 | 204 | 203 | 99.5 |
| Example 1-2 | AL-2 | 199 | 198 | 99.5 |
| Example 1-3 | AL-3 | 203 | 202 | 99.5 |
| Example 1-4 | AL-4 | 207 | 206 | 99.5 |
| Example 1-5 | AL-5 | 201 | 200 | 99.5 |
| Example 1-6 | AL-6 | 208 | 206 | 99.0 |
| Example 1-7 | AL-7 | 201 | 200 | 99.5 |
| Example 1-8 | AL-8 | 207 | 207 | 100.0 |
| Example 1-9 | AL-9 | 199 | 199 | 100.0 |
| Example 1-10 | AL-10 | 201 | 200 | 99.5 |
| Example 1-11 | AL-11 | 200 | 199 | 99.5 |
| Example 1-12 | AL-12 | 200 | 200 | 100.0 |
| Example 1-13 | AL-13 | 209 | 208 | 99.5 |
| Example 1-14 | AL-14 | 204 | 204 | 100.0 |
| Comparative Example 1-1 | Comparative AL-1 | 206 | 205 | 99.5 |
| Comparative Example 1-2 | Comparative AL-2 | 209 | 209 | 100.0 |
| Comparative Example 1-3 | Comparative AL-3 | 210 | 208 | 99.0 |
| Comparative Example 1-4 | Comparative AL-4 | 204 | 203 | 99.5 |
| Comparative Example 1-5 | Comparative AL-5 | 200 | 199 | 99.5 |
| Comparative Example 1-6 | Comparative AL-6 | 203 | 11 | 5.4 |
| Comparative Example 1-7 | Comparative AL-7 | 209 | 67 | 32.1 |
| Comparative Example 1-8 | Comparative AL-8 | 207 | 203 | 98.1 |
| Comparative Example 1-9 | Comparative AL-9 | 207 | 206 | 99.5 |

As shown in Table 2, in Examples 1-1 to 1-14, in which the inventive materials (AL-1 to -14) for forming an adhesive film were used, there was hardly any reduction in film thickness due to treatment with a solvent, and it can be observed that a film having favorable solvent resistance was obtained. On the other hand, in Comparative Example 1-6, where there were no moieties of the structural unit shown by the general formula (2) that contribute to crosslinking, and in Comparative Example 1-7, where there were few of such moieties, it can be observed that sufficient solvent resistance was not achieved. Meanwhile, in Comparative Example 1-8, where the introduction ratio of the structural unit shown by the general formula (1) was small, the film remaining percentage was inclined to be rather low.

Example 2: Adhesiveness Test (Examples 2-1 to 2-14, Comparative Examples 2-1 to 2-9)

The materials (AL-1 to -14, comparative AL-1 to -9) for forming an adhesive film were each applied onto an $SiO_2$ wafer substrate and baked at 220° C. for 60 seconds in the atmosphere by using a hot plate. Thus, an adhesive film with a film thickness of 200 nm was formed. This wafer with an adhesive film was cut into a 1×1 cm square, and an aluminum pin with epoxy adhesive was fastened to the cut wafer with a dedicated jig. Thereafter, the assembly was heated with an oven at 150° C. for 1 hour to bond the aluminum pin to the substrate. After cooling to room temperature, initial adhesiveness was evaluated based on the resistance force by a thin-film adhesion strength measurement apparatus (Sebastian Five-A).

FIG. 2 shows an explanatory diagram showing an adhesiveness measurement method. In FIG. 2, reference number 8 denotes a silicon wafer (substrate), 9 denotes a cured film, 10 denotes an aluminum pin with adhesive, 11 denotes a support, 12 denotes a grip, and 13 denotes a tensile direction. The adhesion is an average of 12 measurement points, and a larger value indicates that the adhesive film has higher adhesiveness with respect to the substrate. The adhesiveness was evaluated by comparing the obtained values. Table 3 shows the results.

TABLE 3

|  | Material for forming adhesive film | Adhesion (mN) |
| --- | --- | --- |
| Example 2-1 | AL-1 | 480 |
| Example 2-2 | AL-2 | 520 |
| Example 2-3 | AL-3 | 690 |
| Example 2-4 | AL-4 | 620 |
| Example 2-5 | AL-5 | 710 |
| Example 2-6 | AL-6 | 630 |
| Example 2-7 | AL-7 | 610 |
| Example 2-8 | AL-8 | 660 |
| Example 2-9 | AL-9 | 490 |
| Example 2-10 | AL-10 | 530 |
| Example 2-11 | AL-11 | 630 |
| Example 2-12 | AL-12 | 610 |
| Example 2-13 | AL-13 | 610 |
| Example 2-14 | AL-14 | 650 |
| Comparative Example 2-1 | Comparative AL-1 | 180 |
| Comparative Example 2-2 | Comparative AL-2 | 190 |
| Comparative Example 2-3 | Comparative AL-3 | 230 |
| Comparative Example 2-4 | Comparative AL-4 | 220 |
| Comparative Example 2-5 | Comparative AL-5 | 270 |
| Comparative Example 2-6 | Comparative AL-6 | 430 |
| Comparative Example 2-7 | Comparative AL-7 | 490 |
| Comparative Example 2-8 | Comparative AL-8 | 330 |
| Comparative Example 2-9 | Comparative AL-9 | 370 |

As shown in Table 3, it can be observed that in Examples 2-1 to 2-14, where the inventive materials (AL-1 to -14) for forming an adhesive film were used, adhesion was excellent owing to the contribution of the structural unit shown by the general formula (1) compared with Comparative Examples 2-1 to 2-5, where the structure was similar and a structure having one hydroxy group was introduced. Meanwhile, it can be observed that in Comparative Example 2-8, where comparative AL-8, having few structural units shown by the general formula (1) introduced, was used, sufficient adhesion was not exhibited. In addition, from the results of Comparative Examples 2-6 and 2-7, where comparative AL-6 and -7 were used, it can be observed that the structural unit shown by the general formula (2) also contributes to improvement of adhesion. Furthermore, a crosslinking agent was used in comparative AL-9, and therefore, the curing method was different, and it can be observed that adhesion was low even though many hydroxy groups were contained in the polymer. From these results, it can be observed that a combination of the structural units shown by the general formula (1) and the general formula (2) of the present invention at an appropriate proportion functions effectively for enhancing adhesion.

Example 3: Patterning Test (Examples 3-1 to 3-14, Comparative Examples 3-1 to 3-7)

Spin-on carbon ODL-301 (carbon content: 88 mass %) available from Shin-Etsu Chemical Co., Ltd. was applied to silicon wafer substrates and the resulting substrates were baked at 350° C. for 60 seconds to form a 200-nm thick resist underlayer film. A CVD-SiON hard mask middle layer film was formed thereon, and further, each of the materials (AL-1 to -14, comparative AL-1 to -5, 8, -9) for forming an adhesive film was respectively applied and baked at 220° C. for 60 seconds to form an adhesive film having a film thickness of 20 nm. A monolayer resist for ArF was applied thereon as a resist upper layer film material and baked at 105° C. for 60 seconds to form a resist upper layer film having a film thickness of 100 nm. A liquid immersion top coat material (TC-1) was applied on the resist upper layer film and baked at 90° C. for 60 seconds to form a top coat having a film thickness of 50 nm. Note that, regarding comparative AL-6 and -7, it was not possible to achieve solvent resistance as shown by the results of Example 1, so that it was not possible to apply the resist upper layer film. Therefore, it was not possible to perform the patterning test.

The resist upper layer film material (monolayer resist for ArF) was prepared by: dissolving a polymer (PRP-A1), an acid generator (PAG1), and a basic compound (Amine1) into a solvent containing 0.1 mass % FC-430 (manufactured by Sumitomo 3M Ltd.) in proportions shown in Table 4; and filtering the solution through a 0.1-μm filter made of a fluorinated resin.

TABLE 4

|  | Polymer (parts by mass) | Acid generator (parts by mass) | Basic compound (parts by mass) | Solvent (parts by mass) |
| --- | --- | --- | --- | --- |
| SL resist for ArF | PRP-A1 (100) | PAG1 (6.6) | Amine1 (0.8) | PGMEA (2500) |

Polymer for Resist: PRP-A1

Top Coat Polymer: PP1

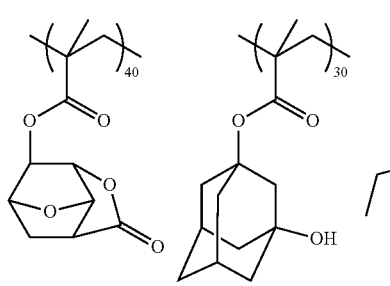

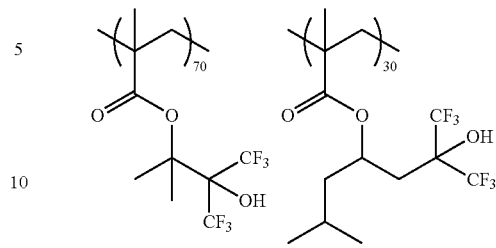

Molecular weight (Mw) = 7,800
Dispersity (Mw/Mn) = 1.88

Molecular weight (Mw) = 8,800
Dispersity (Mw/Mn) = 1.69

Acid Generator: PAG1

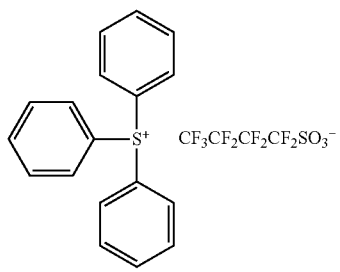

Basic Compound: Amine1

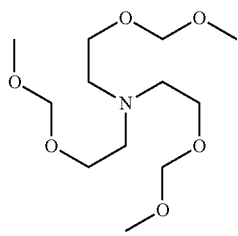

Next, the resulting substrate was exposed to light with an ArF liquid immersion exposure apparatus (NSR-S610C manufactured by Nikon Corporation, NA: 1.30, σ: 0.98/0.65, 35° s-polarized dipole illumination, 6% halftone phase shift mask), baked (PEB) at 100° C. for 60 seconds, and developed with a 2.38 mass % aqueous solution of tetramethylammonium hydroxide (TMAH) for 30 seconds. Thus, a 40-nm 1:1 line-and-space pattern was obtained. Regarding this pattern, the sectional profile and pattern roughness were observed with an electron microscope. The collapse limit (nm) was a minimum width of the lines which could be resolved without collapse when the line width was reduced by increasing the exposure dose. A smaller value indicates higher and better collapse resistance.

The cross-sectional profile of the obtained pattern was evaluated with an electron microscope (S-4700) manufactured by Hitachi, Ltd. and the pattern roughness was evaluated with an electron microscope (CG4000) manufactured by Hitachi High-Technologies Corp. Table 6 shows the results.

TABLE 6

| | Material for forming adhesive film | Pattern sectional profile after development | Pattern roughness nm | Collapse limit nm |
|---|---|---|---|---|
| Example 3-1 | AL-1 | Vertical profile | 1.8 | 29 |
| Example 3-2 | AL-2 | Vertical profile | 1.7 | 27 |
| Example 3-3 | AL-3 | Vertical profile | 1.8 | 20 |
| Example 3-4 | AL-4 | Vertical profile | 1.6 | 22 |
| Example 3-5 | AL-5 | Vertical profile | 1.6 | 20 |
| Example 3-6 | AL-6 | Vertical profile | 1.7 | 22 |
| Example 3-7 | AL-7 | Vertical profile | 1.6 | 23 |
| Example 3-8 | AL-8 | Vertical profile | 1.6 | 21 |
| Example 3-9 | AL-9 | Vertical profile | 1.7 | 28 |
| Example 3-10 | AL-10 | Vertical profile | 1.6 | 26 |
| Example 3-11 | AL-11 | Vertical profile | 1.5 | 22 |
| Example 3-12 | AL-12 | Vertical profile | 1.6 | 23 |
| Example 3-13 | AL-13 | Vertical profile | 1.5 | 23 |
| Example 3-14 | AL-14 | Vertical profile | 1.5 | 21 |
| Comparative Example 3-1 | Comparative AL-1 | Vertical profile | 2.2 | 38 |
| Comparative Example 3-2 | Comparative AL-2 | Vertical profile | 2.3 | 39 |
| Comparative Example 3-3 | Comparative AL-3 | Vertical profile | 2.1 | 37 |
| Comparative Example 3-4 | Comparative AL-4 | Vertical profile | 2.4 | 37 |
| Comparative Example 3-5 | Comparative AL-5 | Vertical profile | 2.3 | 36 |
| Comparative Example 3-6 | Comparative AL-8 | Vertical profile | 2.1 | 34 |
| Comparative Example 3-7 | Comparative AL-9 | Undercut profile | 2.4 | 35 |

The liquid immersion top coat material (TC-1) was prepared by: dissolving a top coat polymer (PP1) into organic solvents in proportions shown in Table 5; and filtering the solution through a 0.1-μm filter made of a fluorinated resin.

TABLE 5

| | Polymer (parts by mass) | Organic solvent (parts by mass) |
|---|---|---|
| TC-1 | PP1 (100) | Diisoamyl ether (2700) 2-methyl-l-butanol (270) |

As shown in Table 6, it can be observed that better collapse suppression performance was exhibited and that it was possible to form finer patterns in Examples 3-1 to 3-14, where the inventive materials (AL-1 to -14) for forming an adhesive film were used, compared with the Comparative Examples 3-1 to 3-7. Furthermore, it can be observed that pattern roughness can be improved by making appropriate adjustments to the photo-acid generator as in Examples 3-9 to 3-14 compared with Examples 3-1, -2, -4, and -6 to -8, containing no photo-acid generator. Meanwhile, in Comparative Examples 3-1 to 3-7, where the structural units contained in the inventive materials for forming an adhesive film were not sufficiently contained and adhesion was low, pattern collapse suppression performance was low. In Comparative Example 3-7, where a crosslinking agent was added to perform the curing only by the function of the crosslinking agent unlike in the present invention, degradation was also observed in the sectional profile of the pattern.

From the above, the inventive materials for forming an adhesive film have high adhesiveness to a resist upper layer film, and have an effect of suppressing fine pattern collapse, and are therefore extremely useful as adhesive film materials to be used in multilayer resist methods. In addition, according to the inventive patterning processes using these materials, a fine pattern can be formed in a substrate to be processed with high precision.

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:

1. A material for forming an adhesive film formed between a silicon-containing middle layer film and a resist upper layer film, the material comprising:
   (A) a resin having structural units shown by the following general formula (1) and the following general formula (2);
   (B) a thermal acid generator; and
   (C) an organic solvent,
   in the component (A), the structural unit shown by the following general formula (1) having a molar fraction of 5% or more and the structural unit shown by the following general formula (2) having a molar fraction of 30% or more,

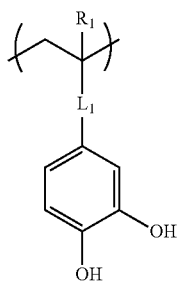

wherein $R_1$ represents a hydrogen atom or a methyl group, $L_1$ represents a single bond, a divalent organic group containing —C(=O)O—, or a divalent organic group containing —C(=O)NR$_2$—, and $R_2$ represents a hydrogen atom or a linear or branched alkyl group having 1 to 3 carbon atoms,

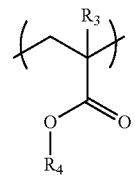

wherein $R_3$ represents a hydrogen atom or a methyl group, and $R_4$ represents a group selected from the following formulae (2-1) to (2-3),

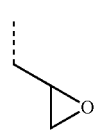

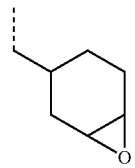

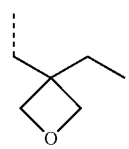

wherein a broken line represents a bonding arm, wherein the general formula (1) is shown by the following general formula (3),

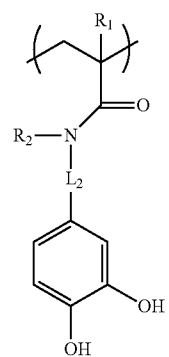

wherein $R_1$ and $R_2$ are as defined above and $L_2$ represents a single bond or an alkylene group having 1 or 2 carbon atoms, a hydrogen atom of the alkylene group optionally being substituted with a hydroxy group, and a methylene group included in the alkylene group optionally being substituted with a carbonyl group.

2. The material for forming an adhesive film according to claim 1, wherein the silicon-containing middle layer film is a silicon-containing resist middle layer film or an inorganic hard mask middle layer film.

3. The material for forming an adhesive film according to claim 1, further comprising one or more compounds shown by the following general formula (4) as (D) a photo-acid generator,

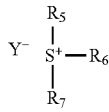

(4)

wherein $R_5$, $R_6$, and $R_7$ each independently represent a linear alkyl group or alkenyl group having 1 to 10 carbon atoms or a branched or cyclic alkyl group or alkenyl group having 3 to 10 carbon atoms, optionally substituted with a heteroatom, and optionally having an intervening heteroatom, or represent an aryl group or aralkyl group having 6 to 21 carbon atoms, optionally substituted with a heteroatom, and optionally having an intervening heteroatom, wherein any two of $R_5$, $R_6$, and $R_7$ are optionally bonded with each other to form a ring with the sulfur atom in the formula, and $Y^-$ represents one of the following general formula (5) and the following general formula (6),

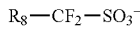

(5)

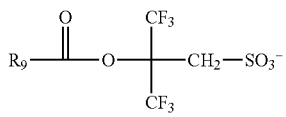

(6)

wherein $R_8$ and $R_9$ are independent of each other, and represent a monovalent hydrocarbon group containing an aliphatic ring structure having 3 to 40 carbon atoms, optionally substituted with a heteroatom, and optionally having an intervening heteroatom.

4. The material for forming an adhesive film according to claim 2, further comprising one or more compounds shown by the following general formula (4) as (D) a photo-acid generator,

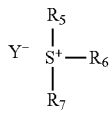

(4)

wherein $R_5$, $R_6$, and $R_7$ each independently represent a linear alkyl group or alkenyl group having 1 to 10 carbon atoms or a branched or cyclic alkyl group or alkenyl group having 3 to 10 carbon atoms, optionally substituted with a heteroatom, and optionally having an intervening heteroatom, or represent an aryl group or aralkyl group having 6 to 21 carbon atoms, optionally substituted with a heteroatom, and optionally having an intervening heteroatom, wherein any two of $R_5$, $R_6$, and $R_7$ are optionally bonded with each other to form a ring with the sulfur atom in the formula, and $Y^-$ represents one of the following general formula (5) and the following general formula (6),

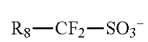

(5)

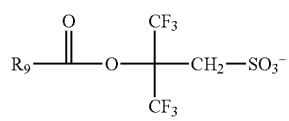

(6)

wherein $R_8$ and $R_9$ are independent of each other, and represent a monovalent hydrocarbon group containing an aliphatic ring structure having 3 to 40 carbon atoms, optionally substituted with a heteroatom, and optionally having an intervening heteroatom.

5. The material for forming an adhesive film according to claim 3, wherein the general formula (5) is shown by the following general formula (7),

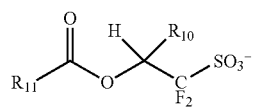

(7)

wherein $R_{10}$ represents a hydrogen atom or a trifluoromethyl group, and $R_{11}$ represents a monovalent hydrocarbon group containing an aliphatic ring structure having 3 to 35 carbon atoms, optionally substituted with a heteroatom, and optionally having an intervening heteroatom.

6. The material for forming an adhesive film according to claim 1, wherein the resin (A) has a weight-average molecular weight of 1,000 to 30,000.

7. The material for forming an adhesive film according to claim 1, further comprising at least one out of (E) a surfactant, (F) a crosslinking agent, (G) a plasticizer, and (H) a colorant.

8. A patterning process for forming a pattern in a substrate to be processed, comprising the steps of:
   (I-1) forming a resist underlayer film on the substrate to be processed;
   (I-2) forming a silicon-containing resist middle layer film on the resist underlayer film;
   (I-3) applying a material for forming an adhesive film on the silicon-containing resist middle layer film and then performing a heat treatment to form an adhesive film;
   (I-4) forming a resist upper layer film on the adhesive film by using a photoresist material;
   (I-5) subjecting the resist upper layer film to pattern exposure and then to development with a developer to form a pattern in the resist upper layer film;
   (I-6) transferring the pattern to the adhesive film by dry etching while using the resist upper layer film having the formed pattern as a mask;
   (I-7) transferring the pattern to the silicon-containing resist middle layer film by dry etching while using the adhesive film having the formed pattern as a mask;
   (I-8) transferring the pattern to the resist underlayer film by dry etching while using the silicon-containing resist middle layer film having the transferred pattern as a mask; and
   (I-9) transferring the pattern to the substrate to be processed by dry etching while using the resist underlayer film having the transferred pattern as a mask, the material comprising:
(A) a resin having structural units shown by the following general formula (1) and the following general formula (2);
(B) a thermal acid generator; and
(C) an organic solvent,
in the component (A), the structural unit shown by the following general formula (1) having a molar fraction of 5% or more and the structural unit shown by the following general formula (2) having a molar fraction of 30% or more,

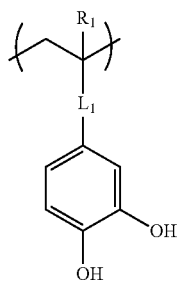

(1)

wherein $R_1$ represents a hydrogen atom or a methyl group, $L_1$ represents a single bond, a divalent organic group containing —C(=O)O—, or a divalent organic group containing —C(=O)NR$_2$—, and $R_2$ represents a hydrogen atom or a linear or branched alkyl group having 1 to 3 carbon atoms,

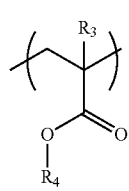

(2)

wherein $R_3$ represents a hydrogen atom or a methyl group, and $R_4$ represents a group selected from the following formulae (2-1) to (2-3),

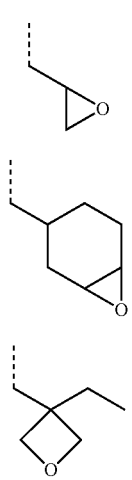

(2-1)

(2-2)

(2-3)

wherein a broken line represents a bonding arm, wherein the general formula (1) is shown by the following general formula (3),

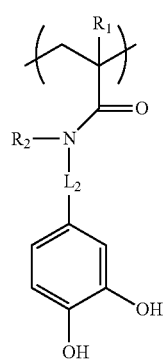

(3)

wherein $R_1$ and $R_2$ are as defined above and $L_2$ represents a single bond or an alkylene group having 1 or 2 carbon atoms, a hydrogen atom of the alkylene group optionally being substituted with a hydroxy group, and a methylene group included in the alkylene group optionally being substituted with a carbonyl group.

9. A patterning process for forming a pattern in a substrate to be processed, comprising the steps of:
(II-1) forming a resist underlayer film on the substrate to be processed;
(II-2) forming an inorganic hard mask middle layer film selected from a silicon oxide film, a silicon nitride film, and a silicon oxynitride film on the resist underlayer film;
(II-3) applying a material for forming an adhesive film on the inorganic hard mask middle layer film and then performing a heat treatment to form an adhesive film;
(II-4) forming a resist upper layer film on the adhesive film by using a photoresist material;
(II-5) subjecting the resist upper layer film to pattern exposure and then to development with a developer to form a pattern in the resist upper layer film;
(II-6) transferring the pattern to the adhesive film by dry etching while using the resist upper layer film having the formed pattern as a mask;
(II-7) transferring the pattern to the inorganic hard mask middle layer film by dry etching while using the adhesive film having the formed pattern as a mask;
(II-8) transferring the pattern to the resist underlayer film by dry etching while using the inorganic hard mask middle layer film having the transferred pattern as a mask; and
(II-9) transferring the pattern to the substrate to be processed by dry etching while using the resist underlayer film having the transferred pattern as a mask,
the material comprising:
(A) a resin having structural units shown by the following general formula (1) and the following general formula (2);
(B) a thermal acid generator; and
(C) an organic solvent,
in the component (A), the structural unit shown by the following general formula (1) having a molar fraction of 5% or more and the structural unit shown by the following general formula (2) having a molar fraction of 30% or more,

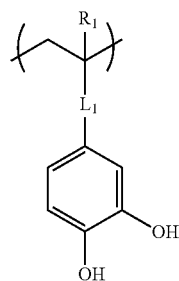
(1)

wherein $R_1$ represents a hydrogen atom or a methyl group, $L_1$ represents a single bond, a divalent organic group containing —C(=O)O—, or a divalent organic group containing —C(=O)NR$_2$—, and $R_2$ represents a hydrogen atom or a linear or branched alkyl group having 1 to 3 carbon atoms,

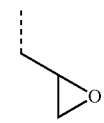
(2)

wherein $R_3$ represents a hydrogen atom or a methyl group, and $R_4$ represents a group selected from the following formulae (2-1) to (2-3),

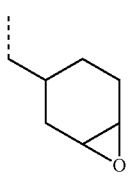
(2-1)

(2-2)

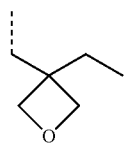
(2-3)

wherein a broken line represents a bonding arm, wherein the general formula (1) is shown by the following general formula (3),

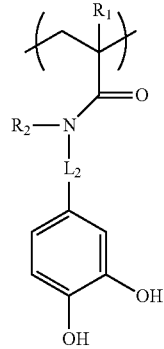
(3)

wherein $R_1$ and $R_2$ are as defined above and $L_2$ represents a single bond or an alkylene group having 1 or 2 carbon atoms, a hydrogen atom of the alkylene group optionally being substituted with a hydroxy group, and a methylene group included in the alkylene group optionally being substituted with a carbonyl group.

10. The patterning process according to claim 9, wherein the inorganic hard mask middle layer film is formed by a CVD method or an ALD method.

11. The patterning process according to claim 8, wherein photolithography at a wavelength of 10 nm or more to 300 nm or less, a direct drawing by electron beam, a nanoimprinting, or a combination thereof is employed as a method for forming a circuit pattern in the resist upper layer film.

12. The patterning process according to claim 8, wherein alkaline development or development with an organic solvent is employed as a development method.

13. The patterning process according to claim 8, wherein the substrate to be processed is a semiconductor device substrate or the semiconductor device substrate coated with any of a metal film, a metal carbide film, a metal oxide film, a metal nitride film, a metal oxycarbide film, and a metal oxynitride film.

14. The patterning process according to claim 13, wherein as the metal, silicon, titanium, tungsten, hafnium, zirconium, chromium, germanium, copper, silver, gold, aluminum, indium, gallium, arsenic, palladium, iron, tantalum, iridium, cobalt, manganese, molybdenum, or an alloy thereof is used.

15. A method for forming an adhesive film that functions as an adhesive layer employed in a semiconductor device manufacturing process, the method comprising:
spin-coating a substrate to be processed with the material for forming an adhesive film according to claim 1; and
heating the substrate coated with the material for forming an adhesive film at a temperature of 100° C. or higher to 300° C. or lower for 10 to 600 seconds to form a cured film.

16. A method for forming an adhesive film that functions as an adhesive layer employed in a semiconductor device manufacturing process, the method comprising:
spin-coating a substrate to be processed with the material for forming an adhesive film according to claim 1; and
heating the substrate coated with the material for forming an adhesive film in an atmosphere having an oxygen concentration of 0.1% or more to 21% or less to form a cured film.

17. A method for forming an adhesive film that functions as an adhesive layer employed in a semiconductor device manufacturing process, the method comprising:

spin-coating a substrate to be processed with the material for forming an adhesive film according to claim 1; and
heating the substrate coated with the material for forming an adhesive film in an atmosphere having an oxygen concentration of less than 0.1% to form a cured film.

* * * * *